United States Patent
Araki et al.

(10) Patent No.: US 12,161,054 B2
(45) Date of Patent: *Dec. 3, 2024

(54) OXIDE SUPERCONDUCTOR AND METHOD FOR MANUFACTURING SAME

(71) Applicant: KABUSHIKI KAISHA TOSHIBA, Tokyo (JP)

(72) Inventors: Takeshi Araki, Tokyo (JP); Hirotaka Ishii, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 954 days.

This patent is subject to a terminal disclaimer.

(21) Appl. No.: 17/184,920

(22) Filed: Feb. 25, 2021

(65) Prior Publication Data
US 2022/0085270 A1  Mar. 17, 2022

(30) Foreign Application Priority Data
Sep. 15, 2020 (JP) .................................. 2020-154921

(51) Int. Cl.
*H10N 60/85* (2023.01)
*H10N 60/01* (2023.01)

(52) U.S. Cl.
CPC ....... *H10N 60/858* (2023.02); *H10N 60/0324* (2023.02)

(58) Field of Classification Search
CPC .... H10N 60/858; H10N 60/01; H10N 60/855; C04B 35/62222; C04B 35/4504
See application file for complete search history.

(56) References Cited

U.S. PATENT DOCUMENTS

2006/0040829 A1   2/2006 Rupich et al.
2007/0145100 A1   6/2007 Suzuki et al.
(Continued)

FOREIGN PATENT DOCUMENTS

JP   H4-192381 A    7/1992
JP   H10-316421 A   12/1998
(Continued)

OTHER PUBLICATIONS

Araki et al. "Growth model and the effect of CuO nanocrystallites on the properties of chemically derived epitaxial thin films of $YB_{a2}C_{u3}O_{7-x}$," Journal of Applied Physics, vol. 92, No. 6, pp. 3318-3325 (2002).

(Continued)

*Primary Examiner* — Paul A Wartalowicz
(74) *Attorney, Agent, or Firm* — Finnegan, Henderson, Farabow, Garrett & Dunner, LLP

(57) ABSTRACT

An oxide superconductor of an embodiment includes an oxide superconducting layer including a first superconducting region containing barium, copper, and a first rare earth element, having a continuous perovskite structure, and extending in a first direction, a second superconducting region containing barium, copper, and a second rare earth element, having a continuous perovskite structure, and extending in the first direction, and a non-superconducting region disposed between the first and the second superconducting region, containing praseodymium, barium, copper, and a third rare earth element, a ratio of the number of atoms of the praseodymium to a sum of the number of atoms of the third rare earth element and the number of atoms of the praseodymium which is 20% or more, having a continuous perovskite structure continuous with the perovskite structure of the first superconducting region and the perovskite struc- (Continued)

ture of the second superconducting region, and extending in the first direction.

11 Claims, 28 Drawing Sheets

(56) References Cited

U.S. PATENT DOCUMENTS

| | | | |
|---|---|---|---|
| 2008/0113870 A1* | 5/2008 | Lee | H10N 60/0801 505/474 |
| 2011/0319271 A1 | 12/2011 | Selvamanickam et al. | |
| 2016/0359097 A1 | 12/2016 | Kurihara | |
| 2017/0309805 A1 | 10/2017 | Araki et al. | |
| 2018/0047487 A1 | 2/2018 | Araki et al. | |
| 2018/0061541 A1 | 3/2018 | Araki et al. | |
| 2018/0197659 A1 | 7/2018 | Hayashi et al. | |

FOREIGN PATENT DOCUMENTS

| | | |
|---|---|---|
| JP | 4777749 B2 | 9/2011 |
| JP | 2018-41715 A | 3/2018 |
| JP | 6374365 B2 | 8/2018 |
| JP | 6479251 B2 | 3/2019 |
| JP | 6556674 B2 | 8/2019 |

OTHER PUBLICATIONS

Araki et al., "Review of a chemical approach to $YB_{a2}C_{u3}O_{7-x}$-coated superconductors-metalorganic deposition using trifluorocetates," Superconductor Science and Technology vol. 16, pp. R71-R94 (2003).

Hayashi et al., "Atom-replaced pins in a Y-based superconductor-single-crystalline perovskite structure including both $PrB_{a2}C_{u3}O_{7-x}$ and $YB_{a2}C_{u3}O_{7-y}$," Superconductor Science and Technology, vol. 31, 055013, 7 pages (2018).

Araki et al., "Clustered atom-replaced structure in single-crystal-like metal oxide," Superconductor Science and Technology, vol. 31, 065008, 9 pages (2018).

\* cited by examiner

FIRST DIRECTION

SECOND DIRECTION

MOVEMENT

FIRST DIRECTION

MOVEMENT

FIG.18A

2F-Pr$_{0.00}$Y$_{1.00}$BCO-1

| -.-- | -.-- | -.-- | -.-- | -.-- |
|------|------|------|------|------|
| -.-- | 6.66 | 6.67 | 6.57 | -.-- |
| -.-- | -.-- | 6.46 | 6.29 | -.-- |
| -.-- | -.-- | -.-- | -.-- | -.-- |
| -.-- | -.-- | -.-- | -.-- | -.-- |

FIG.18B

2F-Pr$_{0.00}$Y$_{1.00}$BCO-2

| -.-- | -.-- | -.-- | -.-- | -.-- |
|------|------|------|------|------|
| -.-- | 6.43 | 6.65 | 6.55 | -.-- |
| -.-- | 6.62 | 6.85 | 6.64 | -.-- |
| -.-- | 6.46 | -.-- | -.-- | -.-- |
| -.-- | -.-- | -.-- | -.-- | -.-- |

FIG.19A

2F-Pr$_{0.22}$Y$_{0.78}$BCO-3

FIG.19B

2F-Pr$_{0.22}$Y$_{0.78}$BCO-4

OXIDE SUPERCONDUCTOR AND METHOD FOR MANUFACTURING SAME

CROSS-REFERENCE TO RELATED APPLICATION

This application is based upon and claims the benefit of priority from Japanese Patent Application No. 2020-154921, filed on Sep. 15, 2020, the entire contents of which are incorporated herein by reference.

FIELD

Embodiments described herein relate generally to an oxide superconductor and a method for manufacturing the same.

BACKGROUND

Superconductivity is a phenomenon in which a resistance value becomes completely zero, which is discovered by using mercury by Kamerring Onnes of the Netherlands who developed a refrigerator. Thereafter, according to the Bardeen Cooper Schrieffer (BCS) theory, an upper limit of a superconducting transition temperature (Tc) is set to 39 K, which is Tc of a first-class superconductor, and is around 39 K at normal pressure.

A copper-based oxide superconductor discovered by Bednorz et al. In 1986 showed results exceeding 39 K, leading to the development of an oxide superconductor that can be used at liquid nitrogen temperature. The oxide superconductor is a second-class superconductor in which superconducting and non-superconducting states are mixed. Today, many high-temperature oxide superconductors that can be used at the liquid nitrogen temperature are sold in a lot having a length of 500 m or more. A superconducting wire is expected to be applied to various large-scale equipment such as a superconducting power transmission cable, a nuclear fusion reactor, a magnetically levitated train, an accelerator, and magnetic resonance imaging (MRI).

Until now, for superconducting applications, a direct current has mainly been applied, and in the superconducting power transmission cable, the magnetically levitated train, a motor, and the like, the current on the superconducting wire side has mainly been applied without changing. For example, in the magnetically levitated train, a normal magnet is used on a ground coil side, and a superconducting magnet generating a strong magnetic field is mounted on a vehicle, and it is possible to operate the magnetically levitated train by controlling the magnetism of the ground coil. The application of superconducting technology, which can move a car body of several tens of tons at a speed of about 600 km/h, is a partial application of characteristics of superconductivity.

On the other hand, in recent years, applications have been studied in which as magnets of both a stator and rotor of a motor, superconducting magnets are employed to generate a tremendous force. One of the applications is a superconducting aircraft, and the superconducting aircraft is trying to make both the stator and rotor of the motor superconducting to use a tremendous force that is incomparable to the application of the magnetically levitated trains. For example, the superconducting aircraft operates by buoyancy in an airflow generated by operating a propulsion device having a diameter of 2 m 7,000 times per minute. It is estimated that a fuel efficiency of the superconducting aircraft will be 70% of the conventional fuel efficiency, and thus the superconducting aircraft has been attracting attention at the international conference in Europe held in 2019.

In order to realize the application to the superconducting aircraft, it is necessary to fluctuate a magnetic field of at least one superconducting coil. That is, an alternating current (AC) inverting a current is used, or a magnetic field is changed by fluctuating a current value without inverting a current and thus a propulsion force is generated by the changed attractive force. When the magnetic field is changed over time by the fluctuation of the current value, a loss of an inductance component is caused. In the conventional superconducting applications, since a superconducting coil is fixed only on one side and a current value is constant, an energy loss of the inductance component is almost zero.

In the following description, an application in which the current is changed without being inverted and the inductance component becomes a problem is also referred to as an AC application. The loss caused by fluctuating the current value is often referred to as AC loss in the field of superconductivity. In the AC application of the superconductivity, a mechanism for reducing an energy loss due to the inductance component is required.

It is known to reduce the AC loss by dividing the superconducting wire and making the superconducting wire into thin wires. Generally, it is said that the AC loss becomes about 1/n when a superconducting current is divided into n in a direction parallel to a current direction of the superconductor whose film thickness is almost uniform. For example, if a generally used 4 mm wide wire is divided into eight and one wire is 0.5 mm wide, the AC loss becomes ⅛. However, the division requires a non-superconducting region in which the current does not conduct. For example, if a non-superconducting region is provided with a width of 0.1 mm out of a width of 0.5 mm divided into eight, the superconducting current will flow only in a width of 0.4 mm, and thus, the current value is set to be 80% of an initial value.

Even if the current value is 80%, when the AC loss is ⅛, there is an effect of 8 times, so the overall effect is expected to be 6.4 times. Therefore, technologies for reducing the AC loss by making the superconducting wire into thin wires have been actively carried out since around 2000. For example, there is a manufacturing technology related to thinning by a laser scribing technology. Reducing the AC loss by thinning the wires is also an essential technology for high-power applications that use superconductors on both sides of the superconducting coil.

An AC loss reduction technology by thinning the superconducting wire is mainly divided into a method for thinning a superconducting wire processed after forming a superconducting film and a method for thinning a superconducting wire when a superconducting film is formed. Since the laser scribing method is a method for processing a superconducting film after the superconducting film is formed, and a method for manufacturing a superconducting film is not selected. A method for fine linearization during the formation of another superconducting film depends on the processing process.

First, regarding the method for processing a superconducting film after the superconducting film is formed, the laser scribing method seems to be the mainstream from a conference report, a patent application status, or the like. It seems that other methods have been tried in the past, but the number of reports is small at present, and this laser scribing method seems to be the mainstream. It is assumed that the method for processing a superconducting film after the formation of the superconducting film is the best method at the present moment.

The laser scribing method is a method for irradiating a superconducting film with a laser to ablate, that is, scatter a substance. Since the formed void portion has no conduction of a superconducting current, the superconducting wire is divided and has the AC loss reduction effect. In one report example, the formed void portion has a width of 20 μm, each of the non-superconducting regions on both sides of the void portion has a width of 40 μm, and non-superconducting regions having a total width of 100 μm are formed.

Although this laser scribing method is used, it is difficult to narrow the width of the non-superconducting region to 100 μm or less. Y-based superconductors are oxide ceramics, and it has been reported that the Y-based superconductors are heated to 1700° C. during ablation and thus the ceramics scatter. In the region adjacent to the void formed after the ablation, decomposition oxides are present due to the high energy during the laser scribing. In other words, CuO, $Y_2O_3$, $BaCuO_2$, and the like are formed from a YBCO superconductor.

The high energy during the laser scribing also degrades characteristics even in the change in the number of oxygen changes in the perovskite structure. The Y-based superconductor has the best superconducting characteristics that can be obtained at the number of oxygen of 6.93, but the perovskite structure originally has the number of oxygen of 9, and functions as a good superconductor for the first time with 2.07 defects. Even if the number of oxygen is 7.00, which is 0.07 more than the optimum value, the superconducting characteristics are greatly reduced to be near zero.

The surrounding substances are heated by the high energy during the laser scribing. For example, even if the oxygen partial pressure is 21% of the atmosphere at 200° C., the number of oxygen is lower than 6.93, and the superconducting characteristics deteriorate. It is assumed that there is a decomposition oxide layer near the void portion having a width of 20 μm, and a region where the number of oxygen changes to become non-superconducting exists outside the decomposition oxide layer. The sum of these two regions is a 40 μm non-superconducting region that extends to one side of the void portion formed by ablation. Therefore, since the void portion having a width of 20 μm is formed, the non-superconducting region having a total width of 100 μm is formed, including regions having a width of 40 μm on both sides of the void portion.

When the width of the non-superconducting region becomes narrower by the laser scribing method, the following problems occur. When the void portion changes from 20 μm width to 10 μm width, the heat per unit time that escapes to both sides of the void portion during ablation is proportional to the temperature difference. The high energy is required because an energy giving region becomes narrower. However, the ablation at high energy increases the decomposition oxide layer, increases damage to a $CeO_2$ layer which is an underlying intermediate layer, or causes peeling of the $CeO_2$ layer or a YBCO layer due to a difference in a coefficient of thermal expansion.

Even if a void portion having a width of 1 μm may be realized by the ablation and a non-superconducting region may be formed, the sum of the width of the decomposition oxide layer adjacent to the void portion and the width of the region where the number of oxygen changes to become non-superconducting is wider than 40 μm wide on one side of the void portion. The non-superconducting region on one side of the void portion may be 60 μm wide. Therefore, even if the void portion is narrowed from 20 μm width, each of the non-superconducting regions having a width of 40 μm on both sides of the void portion becomes wider, so the total width of the non-superconducting regions by the laser scribing method does not become 80 μm or less.

The structure formed by the above laser scribing method has problems other than the problem that the width of the non-superconducting region cannot be narrowed.

In the ablation by the laser scribing method, the decomposition oxide layer such as CuO or $Y_2O_3$ is formed around the void portion. These differ in the coefficient of thermal expansion from the YBCO oxide, and when cooled to the liquid nitrogen temperature or lower in superconducting coil applications, the peeling from the YBCO oxide is likely to occur due to the difference in the coefficient of thermal expansion.

In the first place, the above CuO or $Y_2O_3$ is generated by the decomposition from the YBCO, and there is no lattice coupling with the YBCO, and the peeling is likely to occur. As of July 2020, there have been no reports of achievement cases in which a 500 m long wire is thinned by the laser scribing method and applied to large-scale applied products and continuously operated for a long period of time, for example, 3 years or more. The above unsettled problems are believed to be relevant.

The laser scribing method described above is a typical technique that aims to reduce the AC loss by processing the superconducting film after forming the superconducting film, but an attempt to reduce the AC loss by forming a fine wire structure during the formation of the superconducting film has also been reported to a conference. The current manufacturing method of the Y-based superconductors is largely classified into a vacuum physical deposition method and a chemical solution method, which will be reported.

First, regarding the vacuum physical vapor deposition method, the thinning technique during the film formation is rarely reported to the conference in 2019. In the past, it seems that the thinning method was attempted to limit a deposition area of substances using slits or the like, but in the vacuum physical deposition method, the substance is deposited in the slit, and as the deposition progresses, the amount of material passing through the slit decreases and extra deposits sometimes fall. The falling deposits disrupt control when increasing the number of oxygen from 6.00 to 6.93 by subsequent oxygen annealing, and significantly degrade the characteristics of the YBCO superconductor.

The vacuum physical vapor deposition method includes various methods such as a PLD method, a MOCVD method, a CE method, an RCE method, and a sputtering method, but at present, it is considered that the thinning by the laser scribing method is the most powerful means for these vacuum physical vapor deposition methods.

A typical example of the other chemical solution method is a TFA-MOD method. This method is a MOD method that uses trifluoroacetic acid salt and makes a 500 m long wire with good reproducibility, which has not been heard about the troubles of the superconducting applied equipment used and has a reputation for stability and long-term stability.

Note that the wire length of 500 m is not the upper limit, and due to a weight of a reel on which a 4 mm wide wire is wound, a longer length than the width is a length that deteriorates workability. Since the wire is made by a continuous process, the wire can be made by the TFA-MOD method in the same way even in 1000 m or 2000 m.

The TFA-MOD method can be combined with the above laser scribing method, but there is no report on its application results. The TFA-MOD method is a method in which hundreds of lots of 500 m long wires have been shipped as of 2009. It seems that the AC loss reduction structure has not been realized as of 2020 because there is an unsettled problem in the thinning by the laser scribing method.

The film formation on the long wire by the TFA-MOD method is a film formation by a die coating method or the like based on a meniscus coat. An attempt to narrow the non-superconducting region by this method is mainly a method for forming a void between two superconducting regions.

As the methods other than the void formation, it seems theoretically possible to form non-superconducting materials having the same perovskite structure, such as $BaZrO_3$ used for an artificial pin. However, $BaZrO_3$ has a lattice mismatch with the YBCO of about 9%, and $BaZrO_3$ and YBCO are certainly separated when a film is formed to a film thickness of 1 μm. Maintaining the lattice coupling at about 9% of lattice mismatch is 5 unit cells and about 6 nm in length, based on the related TEM observation results.

A technology of dispersing and forming $BaZrO_3$ used for an artificial pin into YBCO is being developed, but when $BaZrO_3$ is formed at the same time as YBCO, the difference in the film formation conditions such as oxygen partial pressure becomes also a problem.

For example, in YBCO, if firing is performed at 800° C., the oxygen partial pressure of 1000 ppm is preferable. Although the optimum conditions in the film formation of $BaZrO_3$ at 800° C. are unknown, it is theoretically possible for the Y-based superconductor to change Y to another rare earth substitution and change the optimum oxygen partial pressure to 1 ppm to 4000 ppm. For example, in the case of SmBCO, the optimum oxygen partial pressure at the firing of 800° C. is 20 ppm, and when SmBCO is mixed with YBCO, the intermediate oxygen partial pressure becomes the optimum oxygen partial pressure. In the case of REBCO and $BaZrO_3$ in which the Y site is appropriately substituted with rare earths, it is theoretically possible to form the perovskite structure under specific conditions.

However, even in that case, the lattice mismatch between YBCO and $BaZrO_3$ is about 9%, and even if a Y-based superconductor having a film thickness of 1 μm is formed, $BaZrO_3$ is separated at about 6 nm as described above. Apart from this, in a junction portion of YBCO and $BaZrO_3$, oxygen is deprived of YBCO and the number of oxygen decreases from 6.93, which also has the effect of lowering the superconducting characteristics, so it seems that it is more advantageous to form the void portion than to form $BaZrO_3$. Next, the AC loss reduction structure due to the formation of the void portion will be discussed.

The long wire in the TFA-MOD method is the die coating method or the like based on the meniscus coat. In this method, if only a part of the film is formed and the other part is void, the superconductor is separated and thus the AC loss reduction structure is realized.

In this method, it is preferable to use methanol having low viscosity as a solvent of a coating solution, and there is a problem that a diffusion rate during the film formation is fast and it is difficult to narrow a void. Even if the problem is solved, the superconducting characteristics will deteriorate and the AC loss reduction effect will be lost, which is another major problem.

The TFA-MOD method is a method for forming a quasi-liquid phase network by introducing humidifying gas during firing, and selecting external film formation conditions in order to create unit cells one after another on energy stabilization sites by lattice matching at a growth interface which is a bottom of the quasi-liquid phase while releasing hydrogen fluoride gas from the quasi-liquid phase to the gas phase by a chemical equilibrium reaction.

In the YBCO unit cell, it is said that a lattice length ratio of three axes during the film formation is approximately 1:1:3 and 1:1:2.94. At high temperatures, an a/b-axis is undifferentiated, and only a c-axis length is about three times longer. The superconducting characteristics are obtained in the structure when the growth is made in the c-axis direction, that is, when the longest c-axis is perpendicular to the substrate. In that case, the CuO surface from which the superconducting current is obtained is parallel to the substrate. The growth rate of the unit cell is fast in the a/b-axis direction, which is the adjacent direction, and slow in the c-axis direction, which is the vertical direction, and the ratio is said to be 100 to 1000 times. Therefore, if one c-axis oriented particle is nucleated, the c-axis oriented particle will be formed in a wide range. In the c-axis oriented particle, the c axis is perpendicular to the substrate.

If nucleation occurs more than necessary during this unit cell growth, the a/b-axis oriented particles are formed. In the TFA-MOD method, the c-axis oriented particles are formed at an appropriate nucleation frequency by selecting the firing temperature, the oxygen partial pressure, and the humidification condition where the c-axis oriented particles are likely to grow. However, if the nucleation frequency is increased, the a/b-axis oriented particles may be formed due to a difference in a small lattice size. In the a/b-axis oriented particles, the a/b-axis is perpendicular to the substrate.

It is known that once the a/b-axis oriented particles are formed, the growth rate in the direction perpendicular to the substrate is 100 to 1000 times, so the growth reaches the surface and a structure on a girder is formed. It is well known that the wall of this large a/b-axis oriented particles blocks the superconducting current in the c-axis orientation direction and greatly reduces the characteristics.

Therefore, if good c-axis oriented particles are to be formed by the TFA-MOD method, it is preferable to grow the c-axis oriented particles at a nucleation frequency at which the a/b-axis oriented particles are difficult to be formed, which has been proved in the quasi-liquid phase network model, including experimental results.

It has been reported that the nucleation frequency increases and a large number of a/b-axis oriented particles are formed at the end portion of the superconducting film formed on the single crystal substrate. In the film formation of YBCO on a 10 mm square LAO substrate, 30% or more of the a/b-axis oriented particles are present at 100 μm to 300 μm from the end portion of the film, and the superconducting characteristics are almost zero.

In the quasi-liquid phase during the firing of the TFA-MOD method, the name is the quasi-liquid phase, which sounds like liquidity, but in fact, has little liquidity. It is considered that the movement in the horizontal direction during the firing is about several tens of nm. Since cracks formed by a calcining film remain as they are after the firing, the above moving distance is considered to be appropriate.

This quasi-liquid phase is formed at around 550° C., and the c-axis oriented YBCO unit cell can be formed at 725° C. A temperature at which the superconducting film is formed on a metal substrate is 750 to 800° C. is somewhat higher than a temperature at which the unit cell formation is possible. Therefore, it is considered that the quasi-liquid phase has high viscosity and has almost no mobility in the horizontal direction. In addition, constituent substances of the quasi-liquid phase include substances having the maximum electronegativity such as fluorine and oxygen and substances having second largest electronegativity such as yttrium, barium, and the like, and the difference in electronegativity is large, and the attraction of Coulomb force is large. This also seems to be the cause of the low liquidity.

For example, when a film is formed on a 10 mm square $LaAlO_3$ substrate, a large number of a/b-axis oriented particles are formed in the 100 μm to 300 μm region at the end portion of the superconducting film. For example, when the superconductor having a thickness of 1 μm is fired, if the quasi-liquid phase at the end portion thereof is 1 μm thick and the movable distance is 10 nm, in a 10 nm×10 nm region in the center of the substrate, a HF gas emission area is 100 $nm^2$ and a volume is 10 nm×10 nm×1 μm, whereas in the 10 nm×10 nm region of the end portion, a HF gas diffusion area of 10 nm×1000 nm is added to the side. The emission area is almost 100 times that of the central part, and the nucleation frequency is also 100 times that of the central part, so the a/b-axis oriented particles tend to be formed.

The region where a large number of unit cells are formed is not limited to 10 nm from the end portion. The region where a large number of a/b-axis oriented particles are actually formed extends from the end portion to a region of 100 μm to 300 μm. The substance movement in the quasi-liquid phase is presumed to be small as described above, but it is considered in the quasi-liquid phase network model that substances such as various ions exist in an equilibrium state in the quasi-liquid phase. For example, when one HF molecule is released, it is found from the experimental results related to the quasi-liquid phase network model that H and F existing in an equilibrium state in the quasi-liquid phase behave as if they reached the gas phase interface at a high speed in the form of extruding in order.

In the quasi-liquid phase network model, all the substances that constitute the YBCO unit cell appear to move far through the equilibrium state in the quasi-liquid phase. Therefore, it can be explained that a large number of a/b-axis oriented particles are observed in the region of 100 μm to 300 μm or more, not 10 nm from the end portion.

In the TFA-MOD method, for example, it is assumed that a gel film that becomes YBCO later is formed to have a width of 400 μm and a void is formed to have a width of 100 μm. The gel film forms the quasi-liquid phase during the firing, but at least a 100 μm region at both end portions of the quasi-liquid phase is a region where the a/b-axis oriented particles exist 30% or more, and the superconducting characteristics are 1/100 or less. On the other hand, when the a/b-axis oriented particles are formed by 100 μm width and their superconducting characteristics are 1/100, a void in a region of a total of 500 μm which is one set is 100 μm, there are a large number of c-axis orientation particles in a width of 200 μm, and there are a large number of a/b-axis oriented particles in a width of 200 μm. The AC loss will be reduced to 40.4% of the original 500 μm width characteristic. Even if the 4 mm width line is divided into 8 and the total effect of reducing the AC loss is 8×40.4%=3.23 times, it is far from the effect of 6.4 times by the laser scribing.

Next, in order to realize greater reduction in the AC loss, the case where superconductivity and non-superconductivity are formed at the same ratio with a finer pitch than the above-described pitch, and the superconducting width is 160 μm wide and the void portion is 40 μm wide is considered. The formation of the a/b-axis oriented particles is 100 μm from the end portion, and there is no region at the center of the c-axis orientation. All of the remaining 160 μm width is the a/b-axis oriented particles. In this case, only 0.8% of the characteristics can be obtained when there is a superconductor in an original width of 200 μm. In the structure that reduces the AC loss by the formation of the void, the narrower the width of the superconducting wire, the greater the influence of the a/b-axis oriented particles, and the greater the deterioration of characteristics.

In the TFA-MOD method, there is also an attempt to form a fine structure using an inkjet, which is one of the printer technologies. The inkjet can be controlled to droplets having a diameter of 1 μm even in the existing general-purpose printers.

When a 4 μm droplet and a 1 μm void are formed using the inkjet, the effect can be expected to be 100 times that of the 400 μm superconductivity and 100 μm void formed by the laser scribing method, which seems to be the ultimate structure. However, in reality, all the a/b-axis oriented particles are formed to be 4 μm wide, and the characteristics are reduced to 0.8%. This research was presented at many international conferences around 2010, but its application has not been realized as of 2020. The problem seems to be a large decrease in the characteristics of the superconducting region adjacent to the void.

As can be seen from the above results, in the AC loss reduction structure formation by the method for forming voids in the TFA-MOD method, a large number of a/b-axis oriented particles are formed in the superconductor of the main body, so the effect of the deterioration of the characteristics is great.

In addition, in the vacuum physical vapor deposition method, there is no method for setting the non-superconducting region to a width of 80 μm or less. In other words, there is no method for setting a non-superconducting region to a width of 80 μm or less while maintaining superconducting characteristics.

BRIEF DESCRIPTION OF THE DRAWINGS

FIGS. 18A and 18B are diagrams illustrating measurement results of superconducting characteristics on maps of oxide thin films 2F-$Pr_{0.00}Y_{1.00}$BCO-1 and 2F-$Pr_{0.00}Y_{1.00}$BCO-2 of FIG. 18 of Example 2;

FIGS. 19A and 19B are diagrams illustrating measurement results of superconducting characteristics of oxide thin films 2F-$Pr_{0.22}Y_{0.78}$ BCO-3 and 2F-$Pr_{0.22}Y_{0.78}$ BCO-4 of Example 2;

DETAILED DESCRIPTION

Figure 1:
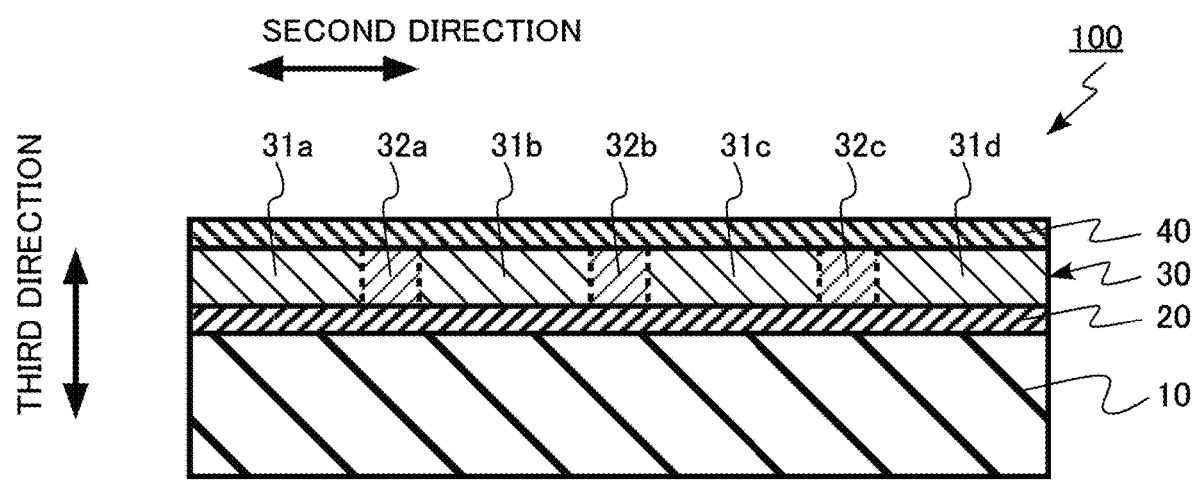
FIG. 1 is a schematic cross-sectional view of an oxide superconductor of a first embodiment.

An oxide superconductor according to an embodiment includes an oxide superconducting layer including a first superconducting region containing barium (Ba), copper (Cu), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the first superconducting region having a continuous perovskite structure, and the first superconducting region extending in a first direction, a second superconducting region containing barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the second superconducting region having a continuous perovskite structure, and the second superconducting region extending in the first direction, and a non-superconducting region disposed between the first superconducting region and the second superconducting region, the non-superconducting region being in contact with the first superconducting region and the second superconducting region, the non-superconducting region containing praseodymium (Pr), barium (Ba), copper (Cu), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the at least one third rare earth element and the number of atoms of the praseodymium (Pr) in the non-superconducting region being equal to or more than 20%, the non-superconducting region having a continuous perovskite structure continuous with the continuous perovskite structure of the first superconducting region and the continuous perovskite structure of the second superconducting region, and the non-superconducting region extending in the first direction.

In the present specification, the continuous perovskite structure is regarded as "single crystal" or being crystallographically continuous. In addition, a crystal containing a certain low tilt angle grain boundary is regarded as having a continuous perovskite structure. The certain low tilt angle grain boundary may have difference in a c-axis direction on the single crystal 1.0° or less. And, the certain low tilt angle grain boundary may have difference in a c-axis obtained by adding delta φ of an alignment layer of a metal substrate to 1.0° in the case of film formation on a metal substrate. The crystal containing the low tilt angle grain boundary whose difference in the c-axis direction on the single crystal is 1.0° or less, and which is equal to or less than the difference obtained by adding the delta p of the alignment layer of the metal substrate to 1.0° in the case of the film formation on the metal substrate is also regarded as having "single crystal" or being crystallographically continuous.

In the "single crystal" defined above, Tc hardly decreases, and it is considered that a value within 0.3 K of an original value can be obtained. Therefore, in the Tc measurement, if the Tc value is within 0.3 K of a theoretical value, the crystal can be regarded as the "single crystal" or being crystallographically continuous.

Further, in the present specification, a structure in which a superconducting region which is the "single crystal" and in which a superconducting current can be obtained when cooled to liquid nitrogen and a non-superconducting region having a perovskite structure in which a superconducting current cannot be obtained coexist is referred to as a "superconductor". This structure is called a "superconductor" because a superconducting current can be conducted as a whole even if the non-superconducting region is partially formed.

A qualitative analysis and quantitative analysis of a chemical composition of members constituting the oxide superconductor in the present specification can be performed by, for example, secondary ion mass spectroscopy (SIMS). Further, for measuring a width of the members constituting the oxide superconductor, a thickness of the members, a distance between the members, and the like, and identifying the continuity of the crystal structure, for example, a transmission electron microscope (TEM) can be used. Further, for identification of constituent substances of the members constituting the oxide superconductor and identification of an orientation of a crystal axis, for example, X-ray diffraction (XRD) can be used.

Hereinafter, the oxide superconductor of the embodiment will be described with reference to the drawings.

First Embodiment

An oxide superconductor according to a first embodiment includes an oxide superconducting layer including a first superconducting region containing barium (Ba), copper (Cu), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the first superconducting region having a continuous perovskite structure, and the first superconducting region extending in a first direction, a second superconducting region containing barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the second superconducting region having a continuous perovskite structure, and the second superconducting region extending in the first direction, and a non-superconducting region disposed between the first superconducting region and the second superconducting region, the non-superconducting region being in contact with the first superconducting region and the second superconducting region, the non-superconducting region containing praseodymium (Pr), barium (Ba), copper (Cu), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the at least one third rare earth element and the number of atoms of the praseodymium (Pr) in the non-superconducting region being equal to or more than 20%, the non-superconducting region having a continuous perovskite structure continuous with the continuous perovskite structure of the first superconducting region and the continuous perovskite structure of the second superconducting region, and the non-superconducting region extending in the first direction.

Figure 2:
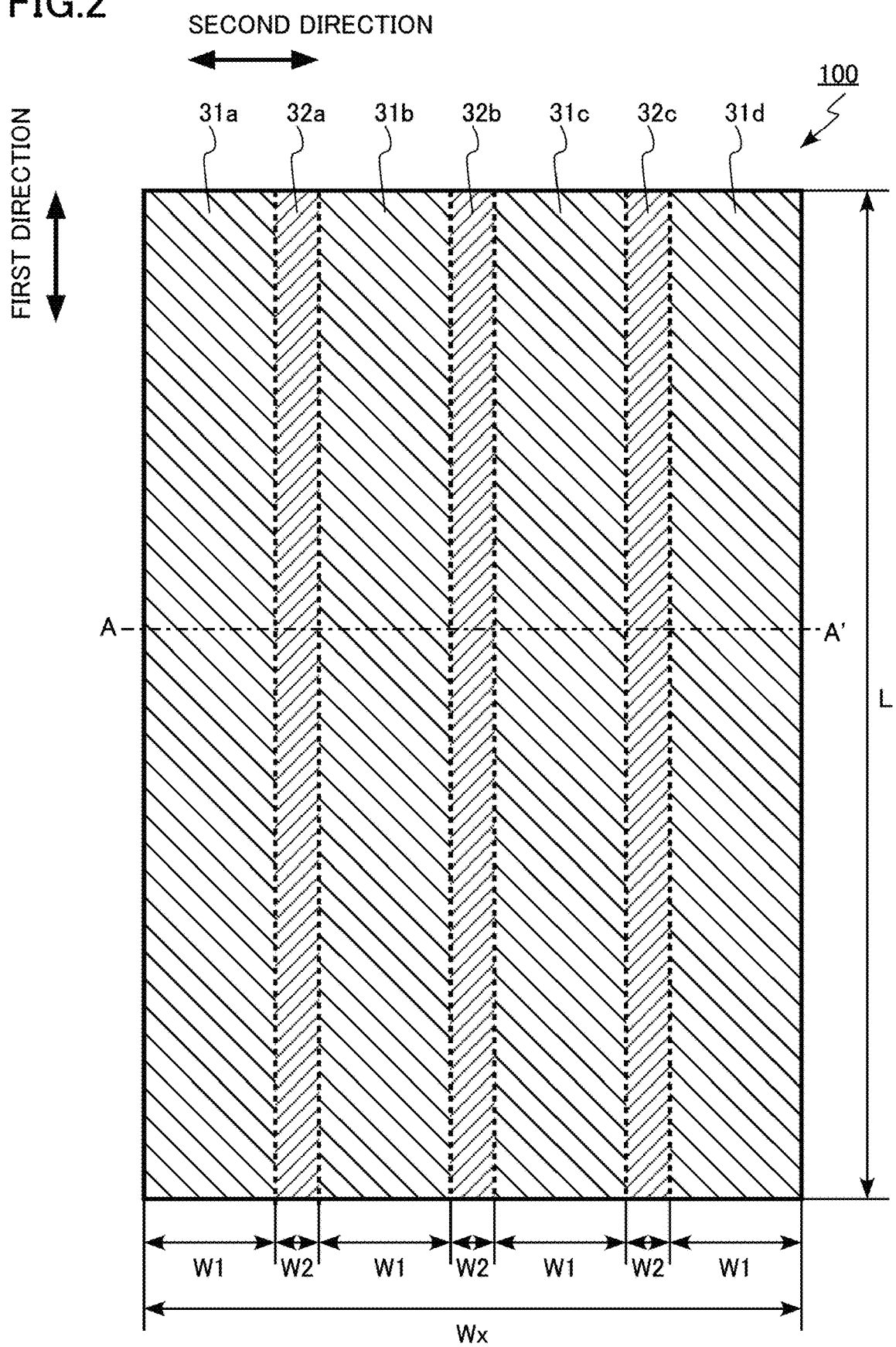
FIG. 2 is a schematic top view of the oxide superconductor of the first embodiment.

FIG. 1 is a schematic cross-sectional view of an oxide superconductor of a first embodiment. FIG. 2 is a schematic top view of the oxide superconductor of the first embodiment. FIG. 2 is a top view of the state in which a metal layer of FIG. 1 is removed. FIG. 1 is a cross-sectional view taken along the line A-A' of FIG. 2.

The oxide superconductor of the first embodiment is a superconducting wire 100.

As illustrated in FIG. 1, the superconducting wire 100 includes a substrate 10, an intermediate layer 20, an oxide superconducting layer 30, and a metal layer 40. The substrate 10 increases a mechanical strength of the oxide superconducting layer 30. The intermediate layer 20 is a so-called alignment intermediate layer. The intermediate layer 20 is provided to align the oxide superconducting layer 30 to form a single crystal when the oxide superconducting layer 30 is formed. The metal layer 40 is a so-called stabilizing layer. The metal layer 40 protects the oxide superconducting layer 30. In addition, the metal layer 40 has a function of bypassing and stabilizing the current even when the superconducting state becomes partially unstable during the actual use of the superconducting wire 100.

The substrate 10 is a metal such as a nickel-tungsten alloy. In addition, the intermediate layer 20 is, for example, yttrium oxide ($Y_2O_3$), yttria-stabilized zirconia (YSZ), and cerium oxide ($CeO_2$) from the substrate 10 side. A layer structure of the substrate 10 and the intermediate layer 20 is, for example, nickel-tungsten alloy/yttrium oxide/yttria-stabilized zirconia/cerium oxide. In this case, the oxide superconducting layer 30 is formed on the cerium oxide.

The substrate 10 may be, for example, a single crystal layer lattice-matched with the oxide superconducting layer 30. The single crystal layer is, for example, lanthanum aluminate ($LaAlO_3$, hereinafter also referred to as LAO). When applying the lanthanum aluminate to the substrate 10, the intermediate layer 20 can be omitted.

Further, as the substrate 10 and the intermediate layer 20, for example, an ion beam assisted deposition (IBAD) substrate can be used. In the case of the IBAD substrate, the substrate 10 is a non-alignment layer. Further, the intermediate layer 20 has, for example, a five-layer structure. For example, two layers from the bottom are a non-alignment layer, and an alignment origin layer produced by the IBAD method is formed on the non-alignment layer, and two metal oxide alignment layers are formed on the alignment origin layer. In this case, the top alignment layer is lattice-matched with the oxide superconducting layer 30. The lattice matching generally indicates a lattice mismatch of 7% or less, but it is preferably equal to or smaller than 3% in order to improve superconducting characteristics.

In the metal layer 40, for example, silver (Ag) or copper (Cu) as a metal of a base material is used. The metal layer 40 is, for example, an alloy. The metal layer 40 contains a small amount of a precious metal such as gold (Au). For example, 1 μm of silver (Ag) and 20 μm of copper (Cu) are formed on the metal layer 40 from the oxide superconducting layer 30 side.

The oxide superconducting layer 30 is provided between the substrate 10 and the metal layer 40. The oxide superconducting layer 30 is provided between the intermediate layer 20 and the metal layer 40. The oxide superconducting layer 30 is provided on the intermediate layer 20 in contact with the intermediate layer 20.

The oxide superconducting layer 30 includes a first superconducting region 31a, a second superconducting region 31b, a third superconducting region 31c, a fourth superconducting region 31d, a first non-superconducting region 32a, a second non-superconducting region 32b, and a third non-superconducting region 32c. The first non-superconducting region 32a is an example of a non-superconducting region.

The first superconducting region 31a, the second superconducting region 31b, the third superconducting region 31c, the fourth superconducting region 31d, the first non-superconducting region 32a, the second non-superconducting region 32b, and the third non-superconducting region 32c extend in the first direction.

The first non-superconducting region 32a is provided between the first superconducting region 31a and the second superconducting region 31b. The first non-superconducting region 32a is in contact with the first superconducting region 31a and the second superconducting region 31b.

The second non-superconducting region 32b is provided between the second superconducting region 31b and the third superconducting region 31c. The second non-superconducting region 32b is in contact with the second superconducting region 31b and the third superconducting region 31c.

The third non-superconducting region 32c is provided between the third superconducting region 31c and the fourth superconducting region 31d. The second non-superconducting region 32b is in contact with the second superconducting region 31b and the fourth superconducting region 31d.

In the following, for ease of explanation, the first superconducting region 31a, the second superconducting region 31b, the third superconducting region 31c, and the fourth superconducting region 31d are collectively referred to as the superconducting region 31. In addition, the first non-superconducting region 32a, the second non-superconducting region 32b, and the third non-superconducting region 32c may be collectively referred to simply as the non-superconducting region 32.

A direction perpendicular to the first direction and from the non-superconducting region 32 to the superconducting region 31 is a second direction. A direction perpendicular to the first direction and the second direction is a third direction. The first direction and the second direction are parallel to a surface of the substrate 10. In addition, the third direction is perpendicular to the surface of the substrate 10.

The oxide superconducting layer 30 is divided into a plurality of superconducting regions 31 with a non-superconducting region 32 therebetween. In the case of FIGS. 1 and 2, the oxide superconducting layer 30 is divided into four superconducting regions 31. The oxide superconducting layer 30 may be divided into, for example, five or more regions.

The superconducting region 31 has superconducting characteristics. The superconducting region 32 does not have the superconducting characteristics. The non-superconducting region 32 electrically separates the superconducting region 31. The non-superconducting region 32 functions as an insulator when a current flows into the superconducting wire 100.

A length of the oxide superconducting layer 30 in the first direction (L in FIG. 2) is, for example, 1 µm or more. The length of the superconducting region 31 in the first direction is, for example, 1 µm or more. A length of the non-superconducting region 32 in the first direction is, for example, 1 µm or more.

A length L of the oxide superconducting layer 30 in the first direction is, for example, 1 m or more. The length of the superconducting region 31 in the first direction is, for example, 1 m or more. The length of the non-superconducting region 32 in the first direction is, for example, 1 m or more.

A width (Wx in FIG. 2) of the oxide superconducting layer 30 in the second direction is, for example, 4 mm. A width (W2 in FIG. 2) of the non-superconducting region 32 in the second direction is smaller than, for example, a width (W1 in FIG. 2) of the superconducting region 31 in the second direction.

A width W1 of the superconducting region 31 in the second direction is, for example, 1 µm or more and 80 µm or less. A width W2 of the non-superconducting region 32 in the second direction is, for example, 1 µm or more and 80 µm or less.

The width W1 of the superconducting region 31 in the second direction is, for example, 10 µm or less. The width W2 of the non-superconducting region 32 in the second direction is, for example, 10 µm or less.

The non-superconducting region 32 has, for example, a size of 100 nm×100 nm×100 nm or more.

The thickness of the oxide superconducting layer 30 in the third direction is, for example, 0.1 µm or more and 10 µm or less.

The oxide superconducting layer 30 is an oxide containing rare earth elements. The oxide superconducting layer 30 is, for example, a single crystal having a continuous perovskite structure. The oxide containing the rare earth element has, for example, a chemical composition of $REBa_2Cu_3O_{7-y}$ ($-0.2 \leq y \leq 1$) (hereinafter, REBCO). RE is a rare earth site.

The superconducting region 31 contains, barium (Ba), copper (Cu), and at least one rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu). In the superconducting region 31, a ratio of the number of atoms of the praseodymium (Pr) to the sum of the number of atoms of the at least one rare earth element and the number of atoms of the praseodymium (Pr) is 15% or less. For example, when the at least one rare earth element is yttrium (Y), a ratio of the number of atoms of the praseodymium (Pr) to the sum of the number of atoms of the yttrium (Y) and the number of atoms of the praseodymium (Pr) contained in the superconducting region 31 (Pr/(Y+Pr)) is 15% or less.

The superconducting region 31 contains, for example, an oxide having a chemical composition of $REBa_2Cu_3O_{7-y}$ ($-0.2 \leq y \leq 1$) (hereinafter, REBCO).

The superconducting region 31 has a continuous perovskite structure. The superconducting region 31 is, for example, a single crystal having the continuous perovskite structure.

The non-superconducting region 32 contains praseodymium (Pr), barium (Ba), copper (Cu), and at least one rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu). In the non-superconducting region 32, a ratio of the number of atoms of the praseodymium (Pr) to a sum of the number of atoms of the at least one second rare earth element and the number of atoms of the praseodymium (Pr) is 20% or more. For example, when the at least one rare earth element is yttrium (Y), a ratio of the number of atoms of the praseodymium (Pr) to the sum of the number of atoms of the yttrium (Y) and the number of atoms of the praseodymium (Pr) contained in the non-superconducting region 32 (Pr/(Y+Pr)) is 20% or more.

The non-superconducting region 32 contains, for example, an oxide having a chemical composition of $REBa_2Cu_3O_{7-y}$($-0.2 \leq y \leq 1$) (hereinafter, REBCO).

The non-superconducting region 32 has a continuous perovskite structure. The non-superconducting region 32 is, for example, a single crystal having the continuous perovskite structure. The non-superconducting region 32 is lattice-matched to, for example, the intermediate layer 20.

The perovskite structure included in the superconducting region 31 and the non-superconducting region 32 is described by $REBa_2Cu_3O_{7-y}$ ($-0.2 \leq y \leq 1$). $PrBa_2Cu_3O_{7-z}$ ($-1 \leq z \leq 1$) (hereinafter, PrBCO), which is a unit cell containing the Pr site whose valence has changed, is contained in the superconducting region 31 in a maximum amount of 15%. Therefore, an average number of oxygen can be up to 7.075.

In addition, when $PrBa_2Cu_3O_{7-z}$ ($-1 \leq z \leq 1$) (hereinafter, PrBCO) is contained in the non-superconducting region 32 in an amount of 24%, a maximum average number of oxygen becomes 7.12, and when the amount of praseodymium (Pr) further increases, the average number of oxygen increases in proportion to the amount of praseodymium (Pr).

In the non-superconducting region 32, the ratio of the number of atoms of the praseodymium (Pr) to the sum of the number of atoms of the at least one rare earth element and the number of atoms of the praseodymium (Pr) is, for example, 50% or less.

At least one rare earth element selected from the group contained in regions of each of the first superconducting region 31a, the second superconducting region 31b, the third superconducting region 31c, the fourth superconducting region 31d, the first non-superconducting region 32a, the second non-superconducting region 32b, and the third non-superconducting region 32c is, for example, the same.

For example, the first superconducting region 31a contains at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the second superconducting region 31b contains at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and the first non-superconducting region 32a contains at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu).

For example, the first rare earth element, the second rare earth element, and the third rare earth element are the same element. For example, all the first rare earth element, the second rare earth element, and the third rare earth element are yttrium (Y).

At least one rare earth element selected from the group contained in regions of each of the first superconducting region 31a, the second superconducting region 31b, the third superconducting region 31c, the fourth superconducting region 31d, the first non-superconducting region 32a, the second non-superconducting region 32b, and the third non-superconducting region 32c may be different.

For example, the first rare earth element, the second rare earth element, and the third rare earth element are different elements. For example, the first rare earth element is yttrium (Y), the second rare earth element is samarium (Sm), and the third rare earth element is dysprosium (Dy).

For example, any or all of the first rare earth element, the second rare earth element, and the third rare earth element may be two or more kinds of rare earth elements. For example, any or all of the first rare earth element, the second rare earth element, and the third rare earth element may be three or more kinds of rare earth elements.

The perovskite structure of the non-superconducting region 32 is continuous with the perovskite structure of the adjacent superconducting region 31. For example, the perovskite structure of the first non-superconducting region 32a is continuous with the perovskite structure of the first superconducting region 31a and the second superconducting region 31b.

The non-superconducting region 32 and the superconducting region 31 are crystallographically continuous with each other. The oxide superconducting layer 30 is, for example, a single crystal having a continuous perovskite structure.

An a/b axis orientation ratio in a portion of 100 μm or less on the superconducting region 31 side from the boundary between the non-superconducting region 32 and the superconducting region 31 is, for example, less than 30%. The a/b axis orientation ratio is a ratio of a/b axis oriented particles among crystal particles contained in the superconducting region 31. The a/b axis oriented particles are crystal particles whose a/b axis is oriented in a direction perpendicular to the surface of the substrate.

The oxide superconducting layer 30 contains, for example, fluorine of $2.0 \times 10^{15}$ atoms/cm$^3$ or more and $5.0 \times 10^{19}$ atoms/cm$^3$ or less, and carbon of $1.0 \times 10^{17}$ atoms/cm$^3$ or more and $5.0 \times 10^{20}$ atoms/cm$^3$ or less. The fluorine and carbon contained in the oxide superconducting layer 30 are residual elements resulting from the film formation of the oxide superconducting layer 30 by a TFA-MOD method.

A concentration of fluorine contained in the oxide superconducting layer 30 is, for example, $2.0 \times 10^{16}$ atoms/cm$^3$ or more. In addition, a concentration of carbon contained in the oxide superconducting layer 30 is, for example, $1.0 \times 10^{11}$ atoms/cm$^3$ or more.

Next, the method for manufacturing an oxide superconductor of the first embodiment will be described. In a method for manufacturing an oxide superconductor of a first embodiment, preparing a first coating solution containing barium (Ba), copper (Cu), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu); preparing a second coating solution containing barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu); preparing a third coating solution containing praseodymium (Pr), barium (Ba), copper (Cu), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), and a ratio of a number of atoms of the praseodymium (Pr) to a sum of a number of atoms of the at least one third rare earth element and the number of atoms of the praseodymium (Pr) in the third coating solution being equal to or less than 20%; forming a gel film by applying or injecting the first coating solution, the second coating solution, and the third coating solution onto the substrate so that the third coating solution is interposed between the first coating solution and the second coating solution and the first coating solution, the second coating solution, and the third coating solution are in contact with each other; forming a calcining film by performing calcining on the gel film at 400° C. or lower; and forming an oxide superconducting layer by performing firing and oxygen annealing on the calcining film at 725° C. or higher to 850° C. or lower in a humidified atmosphere. Hereinafter, the case where the first coating solution and the second coating solution are a part of the solutions prepared at the same time, and the first rare earth element, the second rare earth element, and the third rare earth element are the same will be described as an example. In particular, the case where the first rare earth element, the second rare earth element, and the third rare earth element are yttrium (Y) will be described as an example.

Hereinafter, a first example of the method for manufacturing a superconducting wire 100 of the first embodiment will be described. In the first example, a die coating method is used to form the gel film.

In the first example of the method for manufacturing a superconducting wire 100 of the first embodiment, the intermediate layer 20 is formed on the substrate 10, the oxide superconducting layer 30 is formed on the intermediate layer 20, and the metal layer 40 is formed on the oxide superconducting layer 30. The oxide superconducting layer 30 is formed by the TFA-MOD method.

Figure 3:
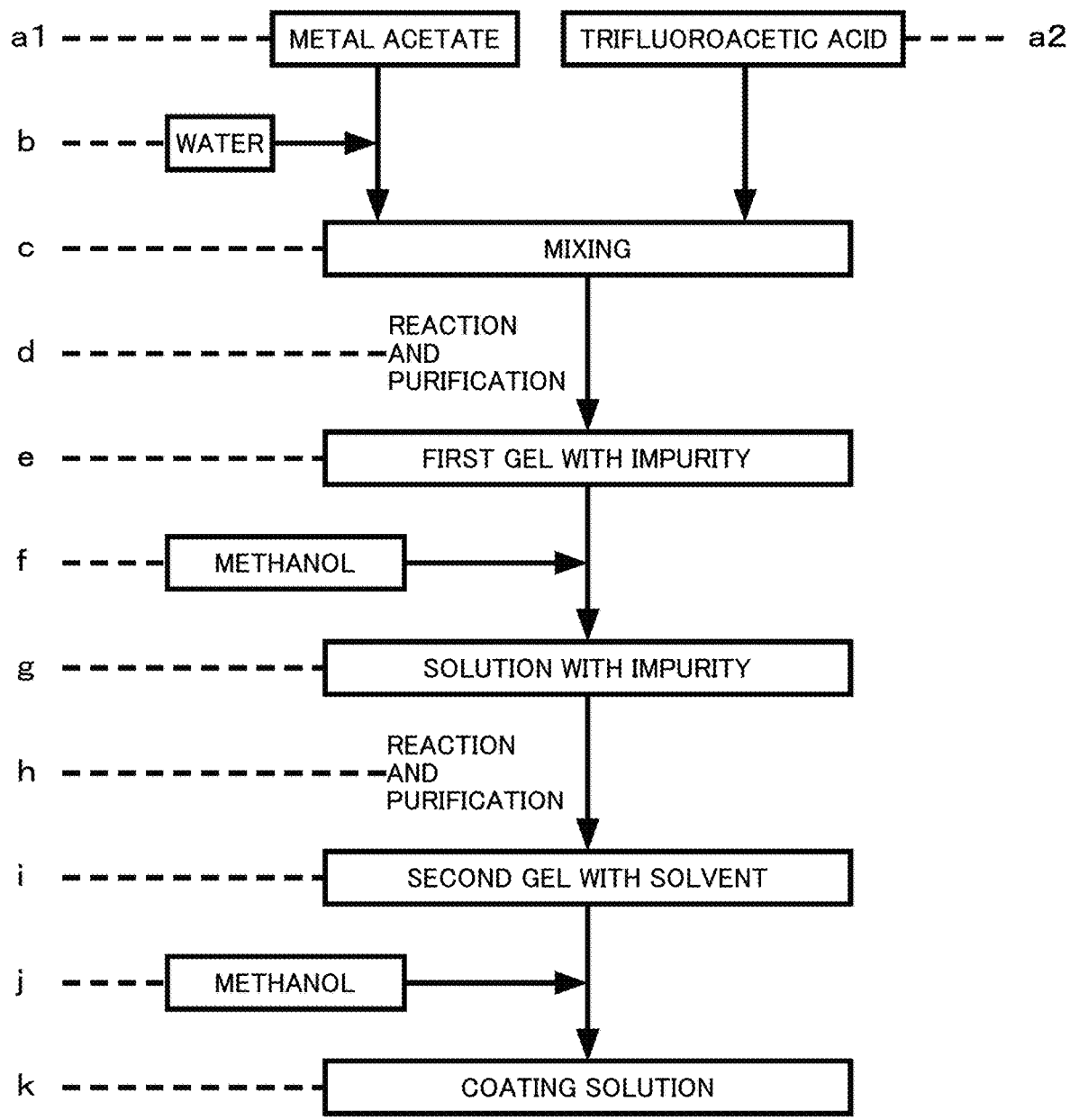
FIG. 3 is a flowchart illustrating an example of preparing a coating solution according to a manufacturing method for the first embodiment.

FIG. 3 is a flowchart illustrating an example of preparing the coating solution according to the manufacturing method of the first embodiment.

First, the preparation of the first coating solution and the second coating solution will be described.

As illustrated in FIG. 3, metal acetate of yttrium (Y), barium (Ba), and copper (Cu), respectively, are prepared (a1). Also, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and purified (d) to obtain a first gel containing impurities (e). Then, the obtained first gel is dissolved in methanol (f) to prepare a solution containing impurities (g). The obtained solution is reacted and purified to remove impurities (h) and to obtain a second gel containing a solvent (i). Further, the obtained second gel is dissolved in methanol (j) to prepare a coating solution (k). The method for incorporating the solvent illustrated in FIG. 3 into the gel to reduce impurities is referred to as a Solvent-Into-Gel (SIG) method.

The coating solution containing yttrium (Y), barium (Ba), and copper (Cu) becomes the first coating solution and the second coating solution. The first coating solution and the second coating solution are, for example, part of the coating solutions prepared at the same time. Hereinafter, the first coating solution and the second coating solution will be referred to as a coating solution for forming a superconducting region.

Next, the preparation of the third coating solution will be described.

As illustrated in FIG. 3, metal acetates of praseodymium (Pr), yttrium (Y), barium (Ba), and copper (Cu) are prepared (a1). Also, trifluoroacetic acid is prepared (a2). Next, the prepared metal acetate is dissolved in water to prepare an aqueous solution (b). The obtained aqueous solution is mixed with the prepared trifluoroacetic acid (c). The obtained solution is reacted and purified (d) to obtain a first gel containing impurities (e). Then, the obtained first gel is dissolved in methanol (f) to prepare a solution containing impurities (g). The obtained solution is reacted and purified to remove impurities (h) and to obtain a second gel containing a solvent (i). Further, the obtained second gel is dissolved in methanol (j) to prepare a coating solution (k).

The coating solution containing praseodymium (Pr), yttrium (Y), barium (Ba), and copper (Cu) becomes the third coating solution. In the third coating solution, the amount of metal acetates of praseodymium (Pr), yttrium (Y), barium (Ba), and copper (Cu), respectively, is adjusted so that the ratio of the number of atoms of praseodymium (Pr) to the sum of the number of atoms of yttrium (Y) and praseodymium (Pr) is 20% or more. Hereinafter, the third coating solution is referred to as a coating solution for forming a non-superconducting region.

When preparing the coating solution for forming the non-superconducting region, as the metal acetate, metal salts are mixed, for example, at RE site (Y, Pr):Ba:Cu=1:2:3. The mixture is made so that the amount of Pr in the RE site is, for example, 20% or more and 50% or less. After mixing and reaction, the amount of residual water and acetic acid in the coating solution is reduced to 2% by weight or less by a high-purity solution purification process by a stabilized solvent-into-gel (SIG) method. The SIG method of the first embodiment is a method for highly purifying a solution for partial stabilization in order to prevent decomposition of PrBCO, and is a partially stabilized solvent-into-gel (PS-SIG) method.

The purity of praseodymium acetate used to prepare the coating solution for forming a non-superconducting region is, for example, 99% or more.

Figure 4:
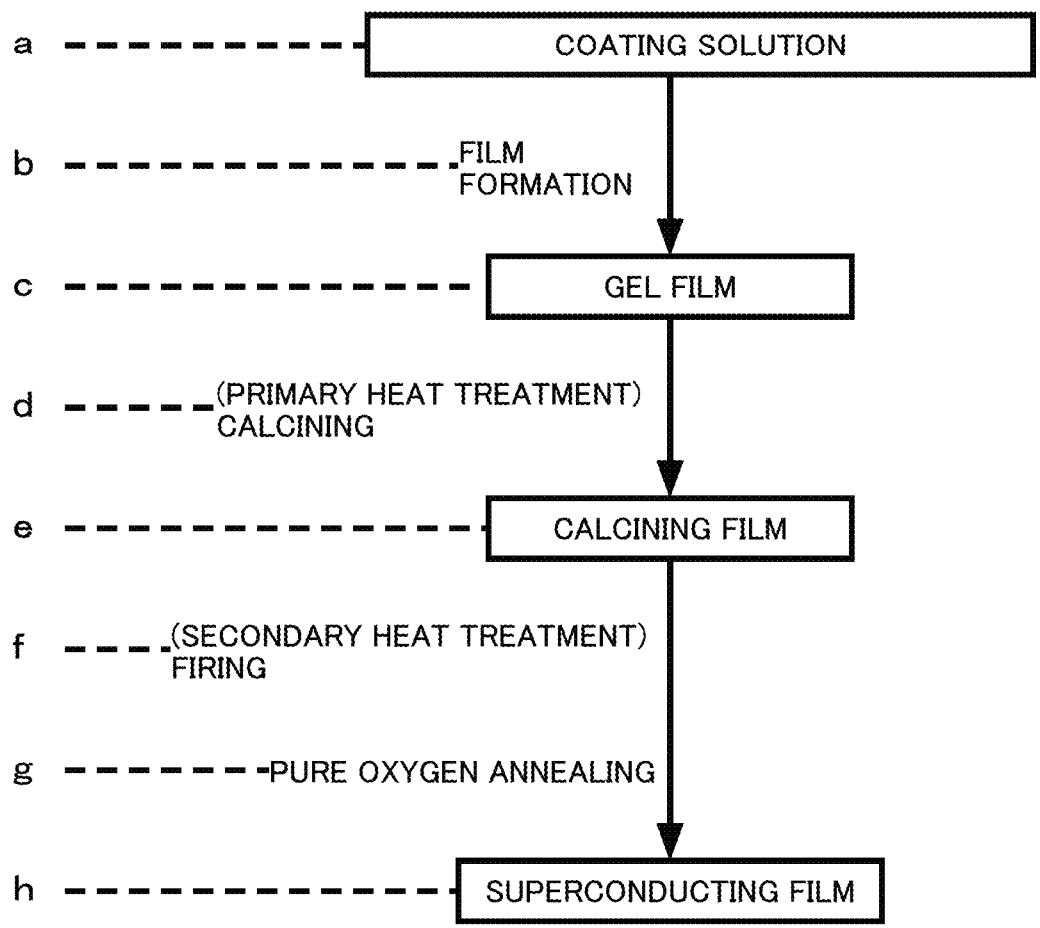
FIG. 4 is a flowchart illustrating an example of a method for forming a superconducting film from the coating solution of the first embodiment.

FIG. 4 is a flowchart illustrating an example of a method for forming a superconducting film from the coating solution of the first embodiment.

As illustrated in FIG. 4, first, the previously prepared coating solution is prepared (a). The coating solution is applied onto the substrate by, for example, a die coating method to form a film (b), thereby obtaining a gel film (c). Then, the obtained gel film is subjected to calcining, which is a primary heat treatment, to decompose organic matters (d), thereby obtaining a calcining film (e). Further, the calcining film is subjected to firing, which is a secondary heat treatment (f), and then is subjected to, for example, pure oxygen annealing (g), thereby obtaining a superconducting film (h).

Figure 5A:
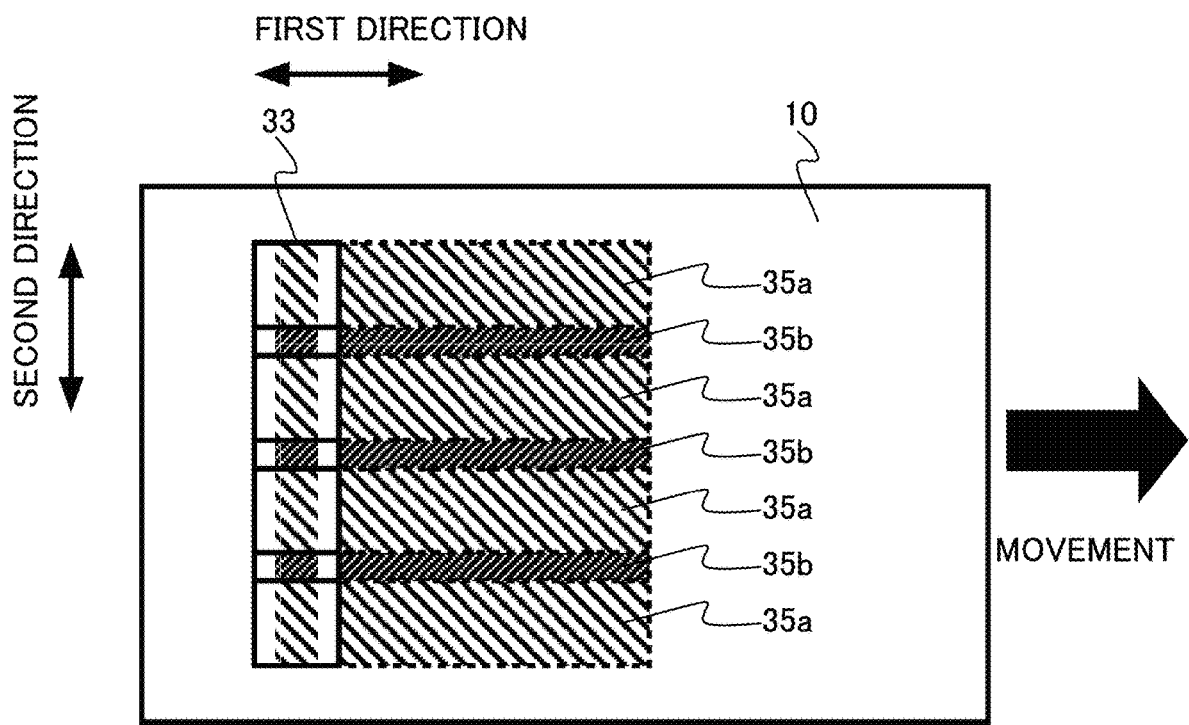
FIGS. 5A and 5B are explanatory diagrams of a formation of a gel film by a die coating method for the first embodiment.
Figure 5B:
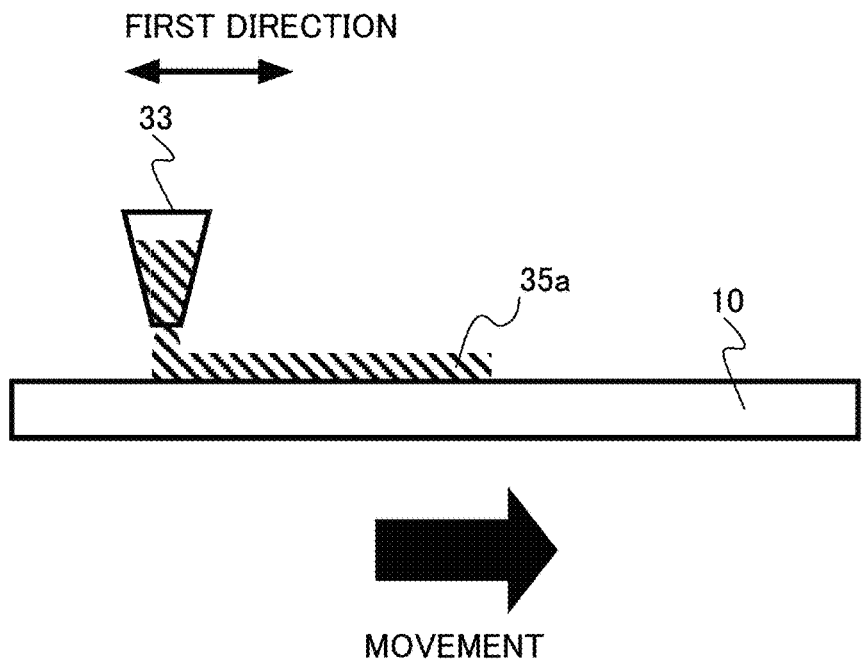

FIGS. 5A and 5B are explanatory diagrams of a formation of a gel film by a die coating method for the first embodiment. FIG. 5A is a diagram viewed from the top of the substrate 10, and FIG. 5B is a diagram viewed from the side of the substrate 10.

As illustrated in FIG. 5, the coating solution 35a for forming a superconducting region and the coating solution 35b for forming a non-superconducting region are applied to the substrate 10 from the solution container 33. As illustrated in FIG. 5A, the coating solution 35a for forming a superconducting region and the coating solution 35b for forming a non-superconducting region are applied onto the substrate 10 so that the coating solution 35b for a non-superconducting region is sandwiched between the coating solutions 35a for a superconducting region and the coating solution 35a for forming a superconducting region and the coating solution 35b for forming a non-superconducting region are in contact with each other.

The substrate 10 moves in the first direction with respect to the solution container 33. The coating solution 35a for forming a superconducting region and the coating solution 35b for forming a non-superconducting region applied onto the substrate 10 extend in the first direction.

A distance between the coating solutions 35a for forming a superconducting region applied onto the substrate 10 and adjacent to each other in the second direction is, for example, 80 µm or less. In other words, the width of the coating solution 35b for forming a non-superconducting region applied onto the substrate 10 in the second direction is, for example, 80 µm or less.

The coating solution 35a for forming a superconducting region and the coating solution 35b for forming a non-superconducting region 35b that are applied onto the substrate 10 are dried to form a gel film. The time required from the application of the coating solution 35a for forming a superconducting region and the coating solution 35b for forming a non-superconducting region onto the substrate 10 to the formation of the gel film is, for example, around 3 seconds.

Figure 6:
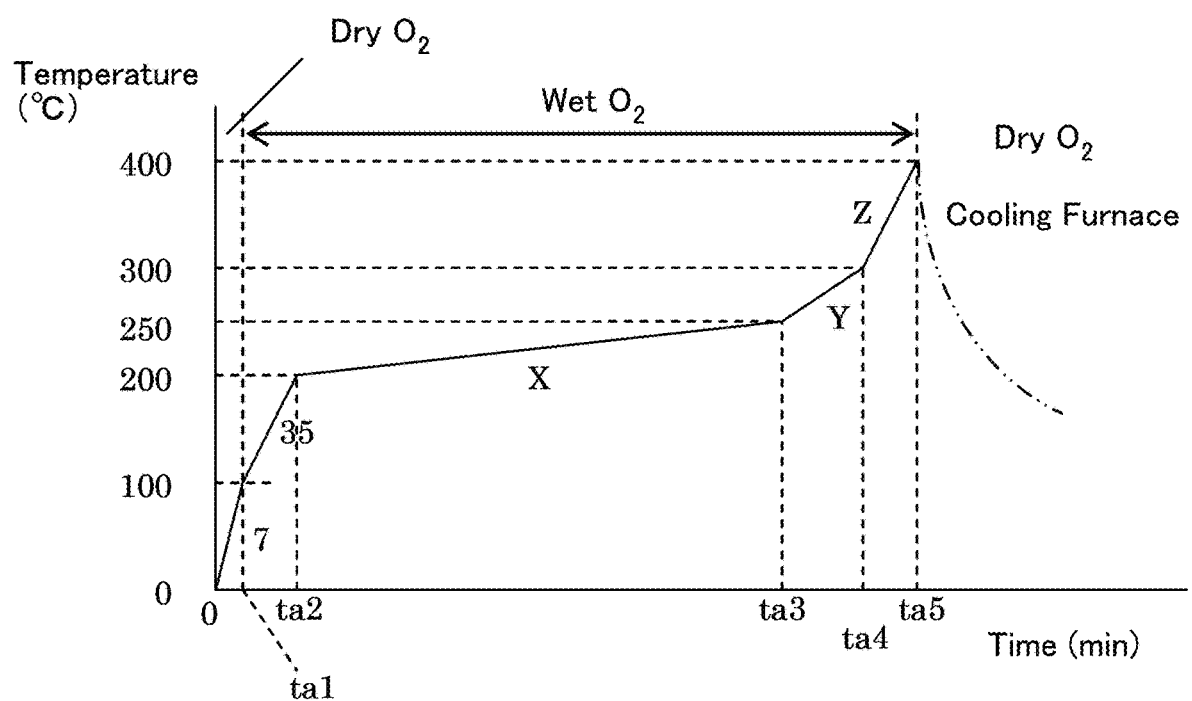
FIG. 6 is a diagram illustrating a typical calcining profile of the first embodiment.

FIG. 6 is a diagram illustrating a typical calcining profile of the first embodiment. In the calcining under normal pressure, trifluoroacetic acid salt is mainly decomposed at 200° C. or higher and 250° C. or lower. A temperature rise rate is reduced near 200° C. to prevent the rush into the temperature range. When the temperature is gradually raised to 250° C., the substance decomposed from trifluoroacetic acid salt contains fluorine and oxygen, and fluorine and oxygen tend to remain in the film due to hydrogen bonds. The temperature is raised to 400° C. to remove the substance. The final temperature is generally 350 to 450° C. In this way, a translucent brown calcining film made of oxides and fluorides is obtained.

Figure 7:
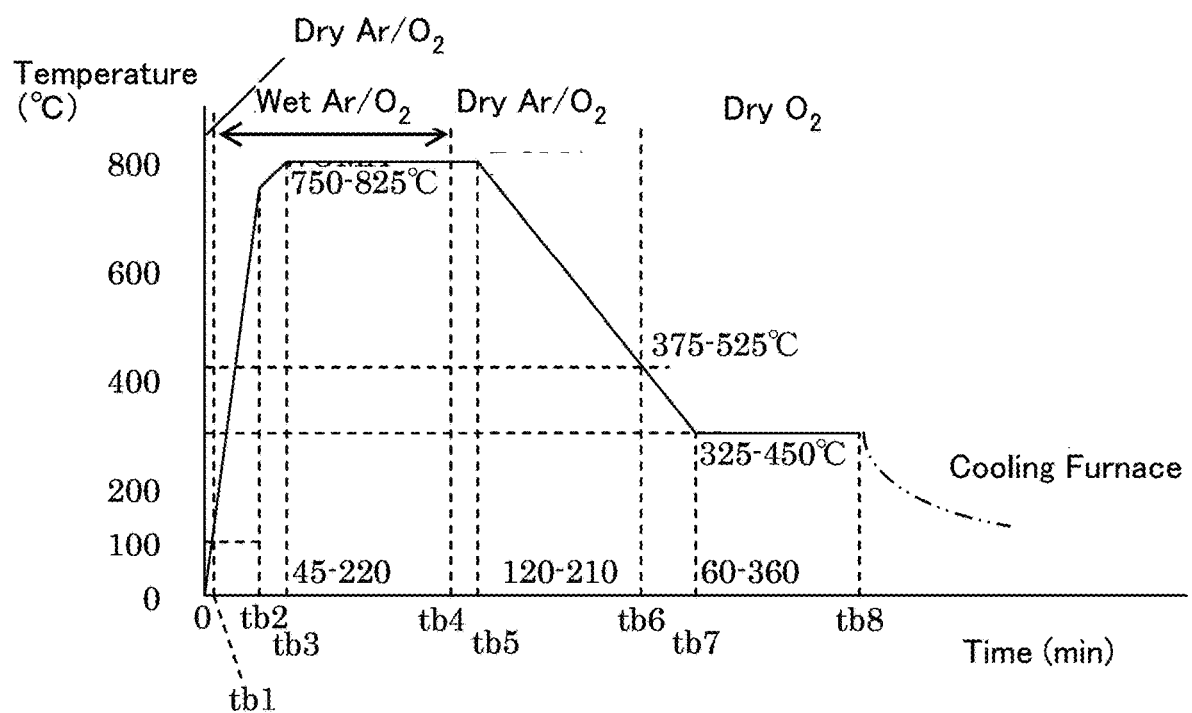
FIG. 7 is a diagram illustrating a typical firing profile of the first embodiment.

FIG. 7 is a diagram illustrating a typical firing profile of the first embodiment. A mixed gas is dried up to tb1 at 100° C., but humidification is performed. A humidification start temperature may be 100° C. or higher and 400° C. or lower. It seems that the formation of the quasi-liquid layer starts from around 550° C., and the humidification is performed at a temperature lower than that so that the humidifying gas spreads inside the film and the quasi-liquid layer is uniformly formed.

FIG. 7 illustrates a typical temperature profile of firing at 800° C., but the temperature rise profile is gentle at 775° C. or higher and 800° C. or lower so that there is no temperature overshoot at tb3. However, an overshoot at 800° C. can remain at 2 to 3° C., which is not particularly a problem. An oxygen partial pressure at the highest temperature depends on the matrix phase. In the case of YBCO superconductor firing, the partial pressure is 1000 ppm at 800° C., and the optimum oxygen partial pressure is halved every time the temperature drops by 25° C. That is, the partial pressure is 500 ppm at 775° C. and 250 ppm at 750° C. In the case of the YBCO system, $YBa_2Cu_3O_6$ is formed in this firing. At this point, no superconductor exists.

For example, the highest temperature of firing may be 750° C. In this case, for example, the same temperature rise rate as in FIG. 7 is performed to a temperature 25° C. lower than the highest temperature, and the temperature rise rate is reduced to raise the temperature to the highest temperature.

At the firing at the highest temperature, dry gas flows at tb4 before the temperature starts to drop after the firing is completed. Since the humidifying gas decomposes the superconductor at 700° C. or lower and becomes an oxide, oxygen annealing is performed at tb6 to change the number of oxygen of the superconductor from 6.00 to 6.93. The superconductor is achieved at the number of oxygen. However, although only the PrBCO has a perovskite structure, the superconductor is not achieved. Also, since the valence of Pr is unknown, the number of oxygen of the unit cell is also unknown, but it seems that the number of oxygen is many. This is because the valence of Pr is a value between 3 and 4, and the number of oxygen increases in the unit cell accordingly. The starting temperature of oxygen annealing is 375° C. or higher and 525° C. or lower. After the temperature retention ends, the furnace is cooled from tb8.

Figure 8:
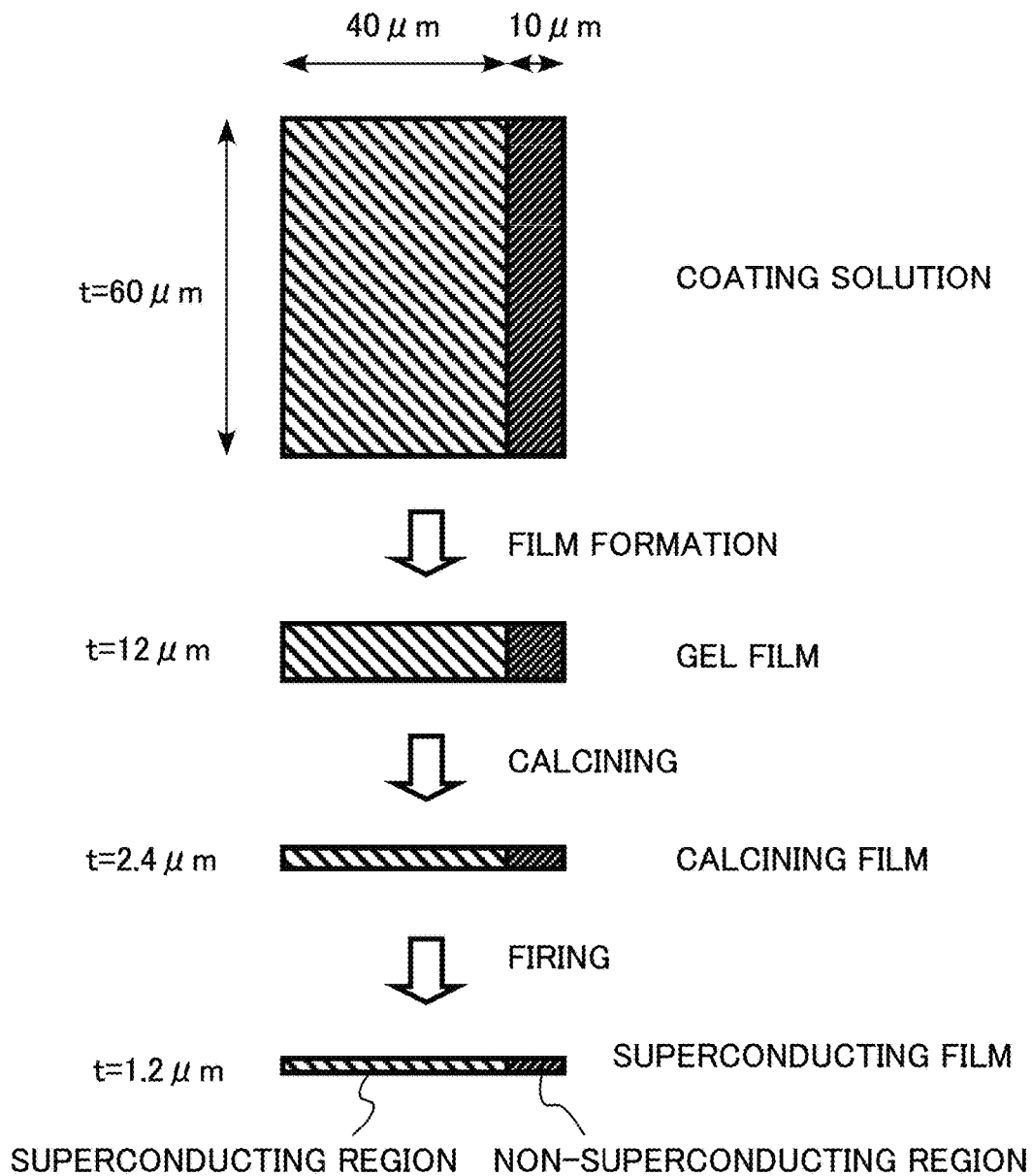
FIG. 8 is a diagram illustrating a change in a film thickness during the formation of a superconducting film in the first embodiment.

FIG. 8 is a diagram illustrating a change in a film thickness during the formation of a superconducting film in the first embodiment. FIG. 8 illustrates the change in the film thickness when forming a superconducting film having a film thickness of 1.2 μm. The diffusion of the substance occurs only during the film formation, and the diffusion region has a width of 1 μm. Therefore, it is considered that the minimum width of the non-superconducting region is around 10 μm.

Next, a second example of the method for manufacturing a superconducting wire 100 of the first embodiment will be described. The second example is the same as the first example above, except that the inkjet method is used to form the gel film.

Figure 9A:
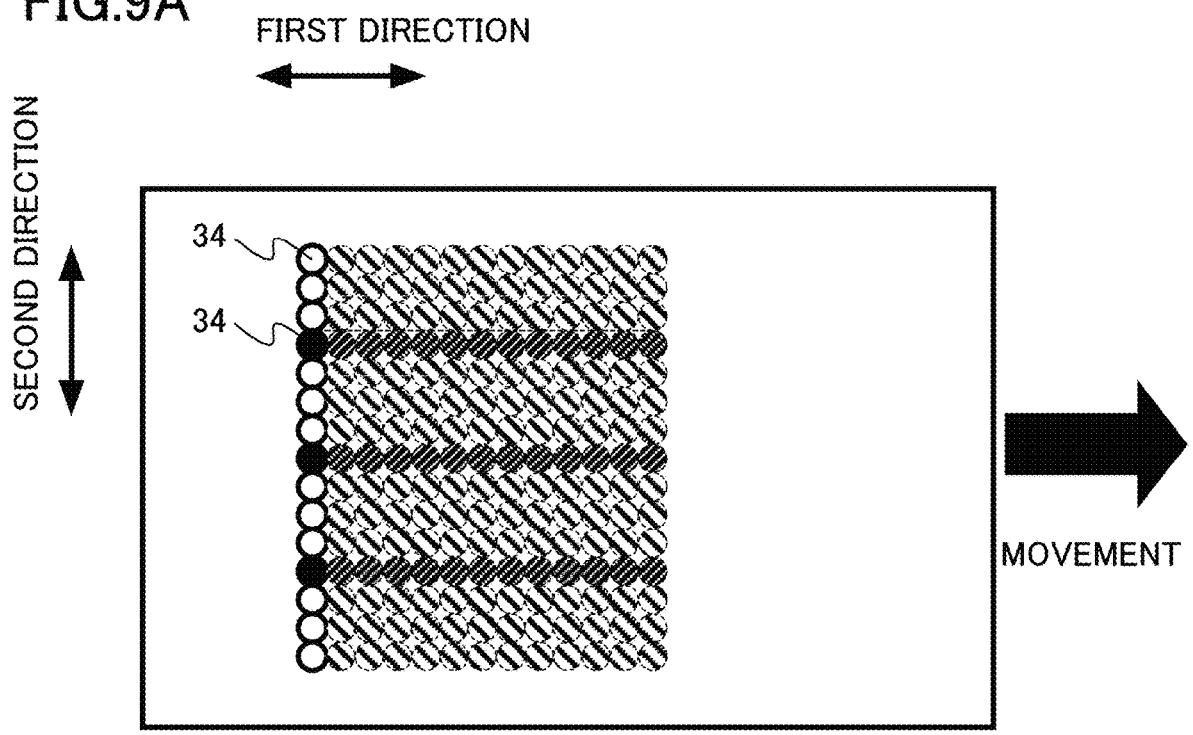
FIGS. 9A and 9B are explanatory diagrams of a formation of a gel film by an inkjet method in the first embodiment.
Figure 9B:
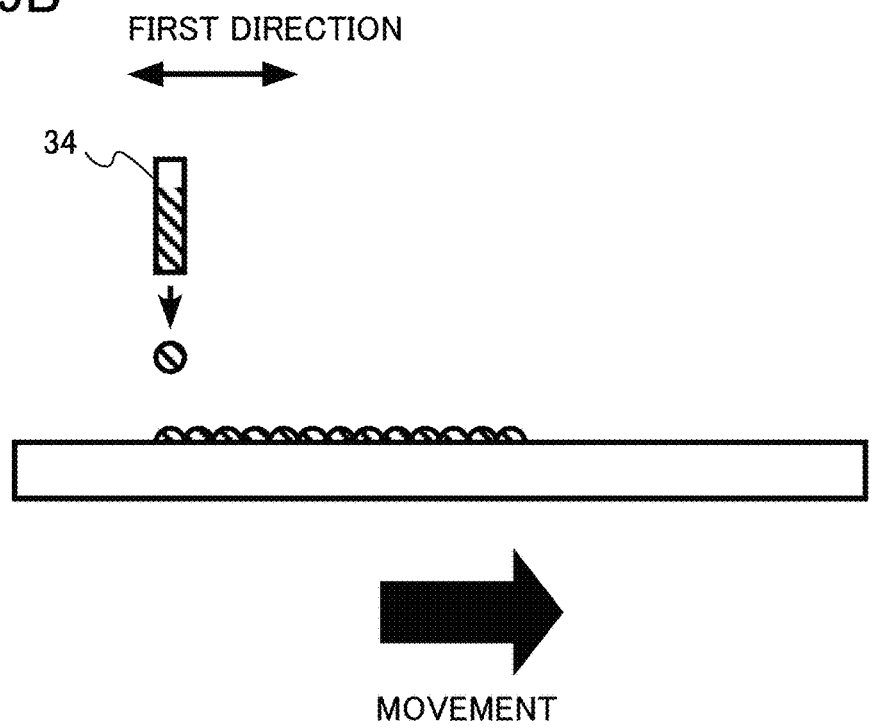

FIGS. 9A and 9B are explanatory diagrams of a formation of a gel film by an inkjet method in the first embodiment. FIG. 9A is a diagram viewed from the top of the substrate 10, and FIG. 9B is a diagram viewed from the side of the substrate 10.

As illustrated in FIGS. 9A and 9B, the coating solution 35a for forming a superconducting region and the coating solution 35b for forming a non-superconducting region are injected toward the substrate 10 from a nozzle 34. As illustrated in FIG. 9A, the coating solution 35a for forming a superconducting region and the coating solution 35b for forming a non-superconducting region are injected onto the substrate 10 so that the coating solution 35b for forming the non-superconducting region is sandwiched between the coating solution 35a for forming the superconducting region 35a and the coating solution 35a for forming the superconducting region 35a and the coating solution 35a for forming the superconducting region 35a and the coating solution 35b for forming the non-superconducting region are in contact with each other.

The substrate 10 moves in the first direction with respect to the nozzle 34. The coating solution 35a for forming a superconducting region and the coating solution 35b for forming a non-superconducting region that are injected onto the substrate 10 extend in the first direction.

When the coating solution 35b for forming a non-superconducting region injected onto the substrate 10 reaches the substrate 10, an average diameter of droplet is, for example, 10 μm or less.

By the above manufacturing method, the superconducting wire 100 of the first embodiment including the oxide superconducting layer 30 is manufactured.

Next, the function and effect of the oxide superconductor and the method for manufacturing an oxide superconductor of the first embodiment will be described.

Figure 10:
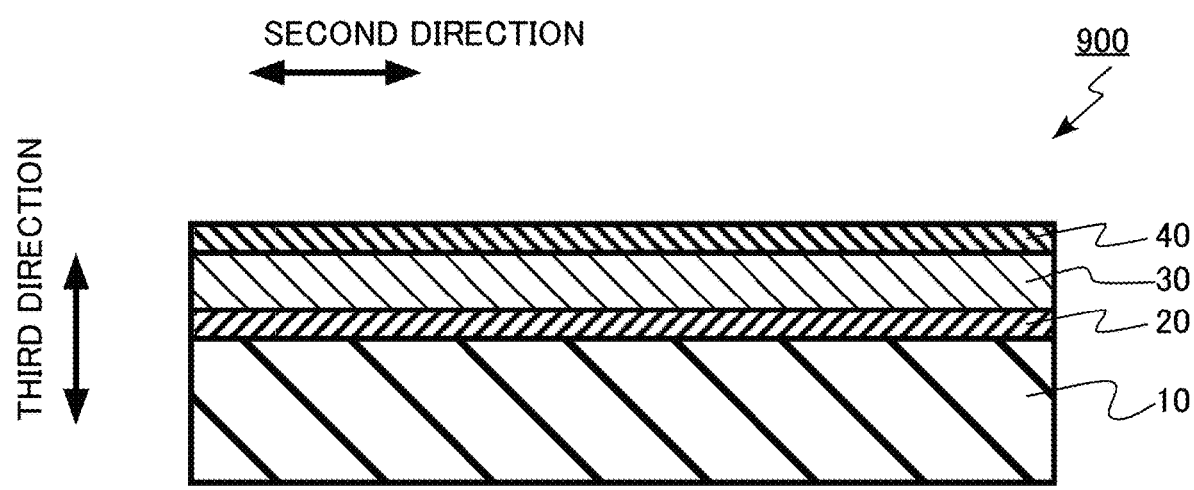
FIG. 10 is a schematic cross-sectional view of an oxide superconductor of a first comparative example.
Figure 11:
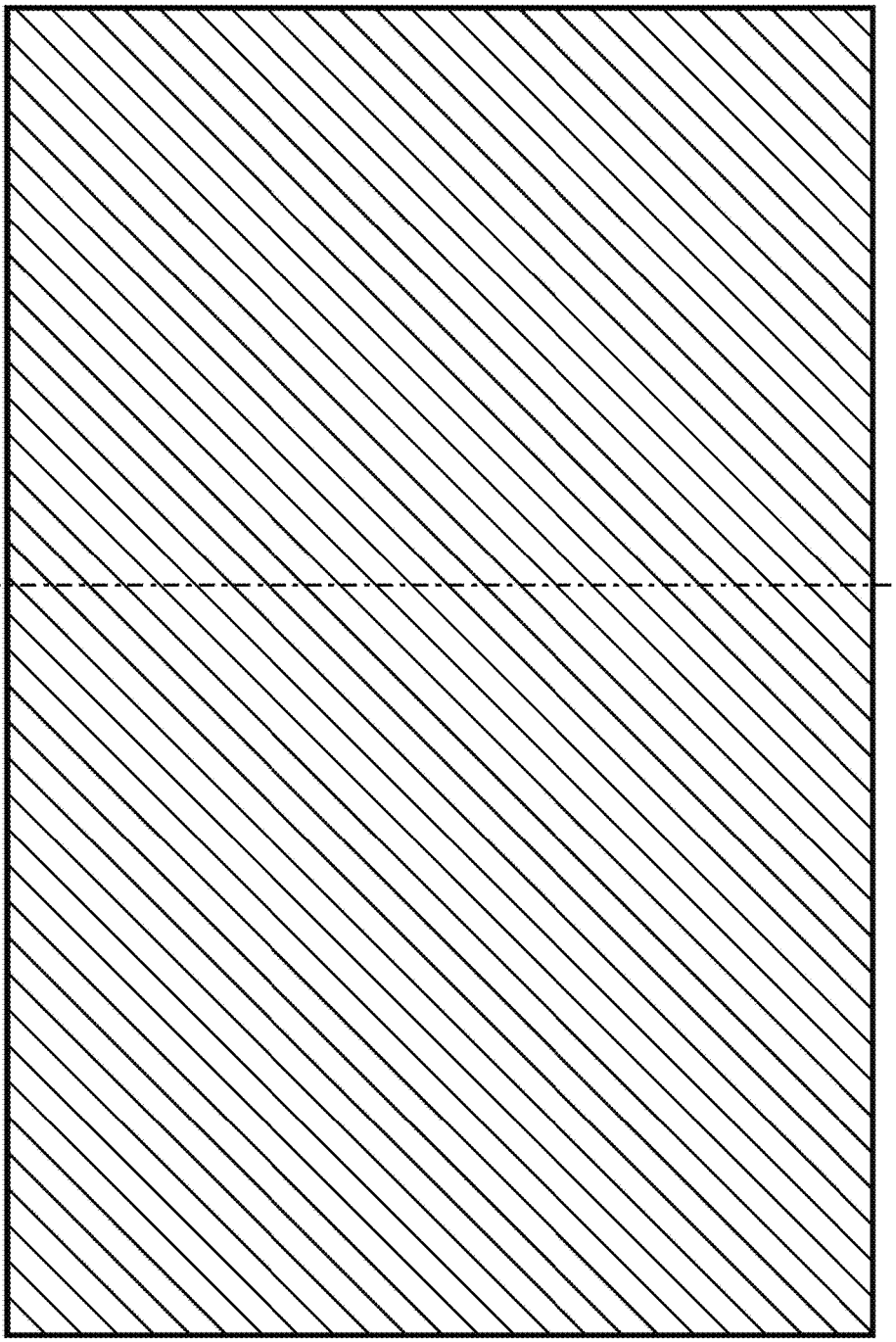
FIG. 11 is a schematic top view of the oxide superconductor of the first comparative example.

FIG. 10 is a schematic cross-sectional view of an oxide superconductor of a first comparative example. FIG. 11 is a schematic top view of the oxide superconductor of the first comparative example. FIG. 11 is a top view of a state in which a metal layer of FIG. 10 is removed. FIG. 10 is a cross-sectional view taken along the line B-B' of FIG. 11.

The oxide superconductor of the first comparative example is a superconducting wire 900.

As illustrated in FIG. 10, the superconducting wire 900 includes the substrate 10, the intermediate layer 20, the oxide superconducting layer 30, and the metal layer 40. The superconducting wire 900 of the first comparative example differs from the superconducting wire 100 of the first embodiment in that the oxide superconducting layer 30 does not include the non-superconducting region and the oxide superconducting layer 30 is not divided. The oxide superconducting layer 30 is the entire superconducting region which has superconducting characteristics.

In the superconducting wire 100 of the first embodiment, the oxide superconducting layer 30 is divided into a plurality of superconducting regions 31 by the non-superconducting region 32. In other words, the oxide superconducting layer 30 is thinned into the plurality of superconducting regions 31.

Therefore, according to the superconducting wire 100, the energy loss due to the inductance component can be reduced when an alternating current is applied. Therefore, according to the superconducting wire 100, it is possible to reduce the AC loss as compared with the superconducting wire 900 of the first comparative example.

Figure 12:
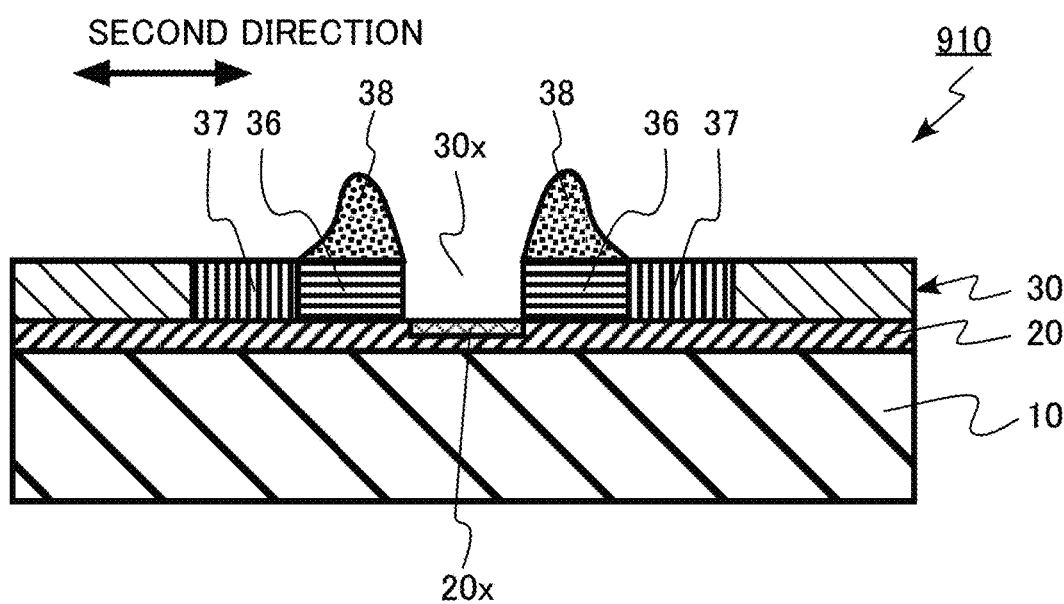
FIG. 12 is a schematic cross-sectional view of an oxide superconductor of a second comparative example.

FIG. 12 is a schematic cross-sectional view of an oxide superconductor of a second comparative example.

The oxide superconductor of the second comparative example is a superconducting wire 910.

As illustrated in FIG. 12, the superconducting wire 910 includes the substrate 10, the intermediate layer 20, and the oxide superconducting layer 30. The superconducting wire 910 of the second comparative example differs from the superconducting wire 100 of the first embodiment in that the oxide superconducting layer 30 does not include the non-superconducting region.

The oxide superconducting layer 30 of the superconducting wire 910 is divided by ablation processing of the oxide superconducting layer 30 from above the film (c-axis direction) by a laser scribing method.

By the laser scribing method, a void portion 30x is formed by scattering the substance forming the oxide superconducting layer 30. At the same time, with high energy, which is said to be equivalent to 1700° C., a region 20x transformed into the intermediate layer 20 having the void portion is formed. For example, $CeO_2$ and the like is used for the intermediate layer 20, but the region 20x is not a single composition like decomposition products or compound oxides with substances scattered by ablation.

A decomposition oxide layer 36 consisting of decomposition products is formed in the region adjacent to the void portion 30x. The decomposition products are $Y_2O_3$, CuO, $BaCuO_2$, and the like, and are non-superconductors. In addition, the number of oxygen of the oxide superconducting layer 30 changes due to the high heat during the ablation, and a region 37 that is YBCO but is different in the number of oxygen and is a non-superconductor is formed. Since the void portion 30x has a width of, for example, 20 μm, and the width of one side of the decomposition oxide layer 36 and the region 37 is 40 μm, the total width of the non-superconducting region is 100 μm, including the widths of both sides. Therefore, it is difficult to narrow the width of the non-superconducting region. Therefore, a sufficient effect of reducing AC loss cannot be obtained.

In addition, in the processing by the ablation, the ablation is often performed with the minimum necessary energy so that the region 20x, the decomposition oxide layer 36, and the region 37 do not spread. Then, due to insufficient energy, debris 38, which is a deposit, is formed on the neighboring oxide superconducting layer 30. It is considered that the debris 38 is deposited, for example, to a height equal to or greater than the film thickness of the oxide superconducting layer 30. When the debris 38 is formed, for example, cracks are likely to occur in the superconducting wire 910. The mechanical strength of the superconducting wire 910 decreases.

In the superconducting wire 100 of the first embodiment, the oxide superconducting layer 30 is divided into a plurality of superconducting regions 31 by the non-superconducting region 32. The non-superconducting region 32 is formed by applying or injecting a coating solution. Therefore, the non-superconducting region 32 does not spread from the non-superconducting region 32 toward the superconducting region 31.

According to the superconducting wire 100 of the first embodiment, the width of the coating solution 35b for forming a non-superconducting region on the substrate 10 defines the width of the non-superconducting region 32. Therefore, for example, the non-superconducting region 32 having an extremely narrow width of 80 μm or less can be formed by the die coating method or the non-superconducting region 32 having an extremely narrow width of 10 μm or less can be formed by the inkjet method. Therefore, it is possible to obtain a higher AC loss reduction effect as compared with the superconducting wire 910 of the second comparative example.

In addition, since the superconducting wire 100 is formed by a perovskite structure in which the superconducting region 31 and the non-superconducting region 32 are continuous, sufficient mechanical strength can be obtained.

Figure 13:
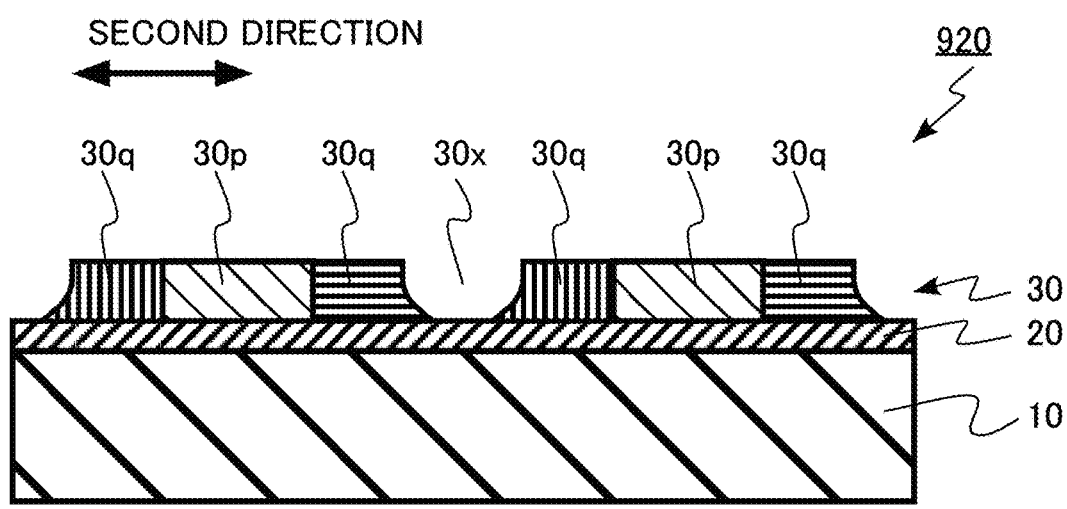
FIG. 13 is a schematic cross-sectional view of an oxide superconductor of a third comparative example.

FIG. 13 is a schematic cross-sectional view of an oxide superconductor of a third comparative example.

The oxide superconductor of the third comparative example is a superconducting wire 920.

As illustrated in FIG. 13, the superconducting wire 920 includes the substrate 10, the intermediate layer 20, and the oxide superconducting layer 30. The superconducting wire 920 of the third comparative example differs from the superconducting wire 100 of the first embodiment in that the oxide superconducting layer 30 does not include the non-superconducting region.

The oxide superconducting layer 30 of the superconducting wire 920 is formed by the TFA-MOD method. When the gel film is formed on the substrate 10, a void portion 30x is formed by forming a portion to which the coating solution is not applied.

A region 30p and a region 30q of the oxide superconducting layer 30 are superconducting regions. The region 30p is a superconductor of c-axis oriented particles, and is a region where good superconducting characteristics can be obtained. However, the region 30q is a superconductor of a/b-axis oriented particles in which the c-axis oriented particles grow sideways, and is a region in which the superconducting current is obtained only in the vertical direction in the figure and the superconducting current hardly flows in the target horizontal direction.

For example, when the width of the void portion 30x is 100 μm and the total width of the region 30p and the region 30q is 400 μm, the portion where the superconducting current can be obtained is only the region 30p, and the maximum width is 200 μm. Since the width of the region 30q is 100 μm or more from the experimental results and the growth model of the TFA-MOD method, the width of the region 30p is 200 μm or less, and the superconducting region is 40% in a structure of 500 μm wide and therefore becomes 200 μm or less. Therefore, it is difficult to narrow the width of the non-superconducting region. Therefore, a sufficient effect of reducing AC loss cannot be obtained.

According to the superconducting wire 100 of the first embodiment, since no void portion is formed, there is no end portion of the coating solution. Therefore, an a/b-axis orientation ratio in a portion of 100 μm or less on the superconducting region 31 side from the boundary between the non-superconducting region 32 and the superconducting region 31 is, for example, less than 30%.

According to the superconducting wire 100 of the first embodiment, the width of the coating solution 35b for forming a non-superconducting region on the substrate 10 defines the width of the non-superconducting region 32. Therefore, for example, the non-superconducting region 32 having an extremely narrow width of 80 μm or less can be formed by the die coating method. Therefore, it is possible to obtain a higher AC loss reduction effect as compared with the superconducting wire 920 of the third comparative example.

Figure 14:
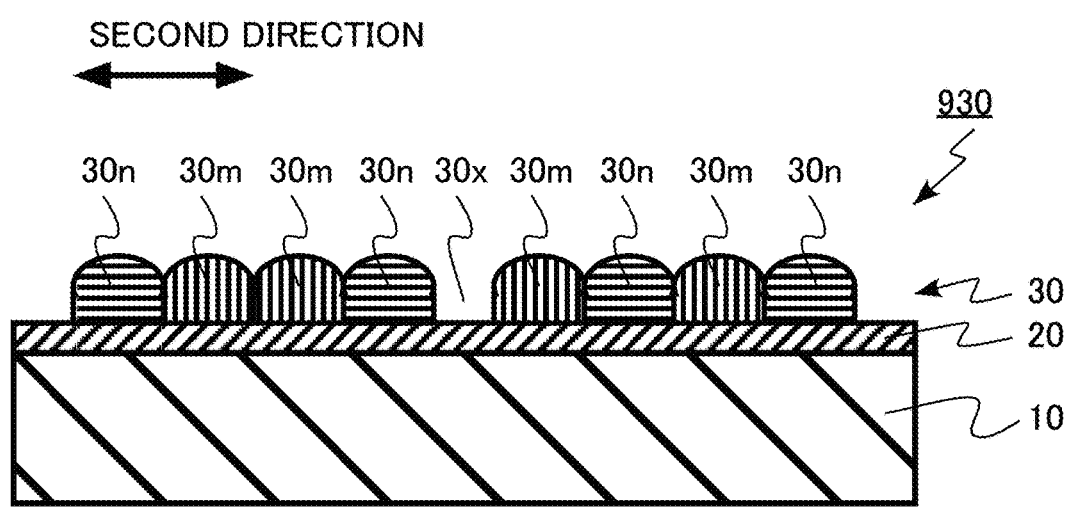
FIG. 14 is a schematic cross-sectional view of an oxide superconductor of a fourth comparative example.

FIG. 14 is a schematic cross-sectional view of an oxide superconductor of a fourth comparative example.

The oxide superconductor of the fourth comparative example is a superconducting wire 930.

As illustrated in FIG. 14, the superconducting wire 930 includes the substrate 10, the intermediate layer 20, and the oxide superconducting layer 30. The superconducting wire 930 of the fourth comparative example differs from the superconducting wire 100 of the first embodiment in that the oxide superconducting layer 30 does not include the non-superconducting region.

The oxide superconducting layer 30 of the superconducting wire 930 is formed by the inkjet method. When the gel film is formed on the substrate 10, a void portion 30x is formed by forming a portion to which the coating solution is not injected from the nozzle.

For example, the oxide superconducting layer 30 is formed in a region 36m and a region 36n formed by the inkjet method. Any of the region 36m and the region 36n is a superconductor of a/b-axis oriented particles in which the c-axis oriented particles grow sideways, and is a region in which the superconducting current is obtained only in the vertical direction in the figure and the superconducting current hardly flows in the target horizontal direction.

For example, the a/b-axis oriented particles are likely to form in the range of 100 μm from the end portion of the droplet of the coating solution. Therefore, when the combined width of the region 36m and the region 36n is 200 μm or less, both the regions 36m and 36n become the superconductor of the a/b-axis oriented particles. Therefore, it is difficult to narrow the width of the non-superconducting region. Therefore, a sufficient effect of reducing AC loss cannot be obtained.

According to the superconducting wire 100 of the first embodiment, for example, even when formed by the inkjet method, there is no end portion of the droplet of the coating solution. Therefore, it is difficult to form the superconductor of the a/b-axis oriented particles. This is because the growth of the TFA-MOD method is proportional to the diffusion of hydrogen fluoride gas from the film surface, and therefore is in the same state as when the normal uniform YBCO film is formed.

According to the superconducting wire 100 of the first embodiment, a non-superconducting region 32 having an extremely narrow width of 10 μm or less can be formed by the inkjet method. Therefore, it is possible to obtain a higher AC loss reduction effect as compared with the superconducting wire 930 of the fourth comparative example.

The non-superconducting region 32 of the superconducting wire 100 of the first embodiment includes a structure in which the Y site is substituted with 20% or more or Pr. Since this structure has a lattice mismatch of 1 to 2% or less with the Y-based superconducting unit cell in superconducting region 31, it forms a common perovskite structure continuous with the superconducting region 31. The structure in which two superconducting regions 31 have a non-superconducting region 32 sandwiched therebetween and the perovskite structures of the two superconducting regions 31 and the non-superconducting region 32 are continuous is called a planted-shared-insulator (PSI) structure.

When a non-superconducting region is formed by void formation in order to reduce AC loss by the TFA-MOD method, the a/b-axis oriented particles are formed and the superconducting characteristics are greatly reduced. However, the a/b-axis oriented particles are rarely formed in the PSI structure. In the die coating method, this PSI structure is formed by simultaneous film formation of the coating solution for forming a superconducting region and the coating solution for forming a non-superconducting region. In addition, in the inkjet method, droplets of each of the coating solution for forming a superconducting region and the coating solution for forming a non-superconducting region are injected onto the substrate, thereby realizing, for example, a PSI structure with a width of 1 μm. For example, the formation of the non-superconducting region by the laser scribing method in the comparative example is limited to a width of 100 μm, so the AC loss is reduced to ⅟₁₀₀.

In the superconducting wire 100 of the first embodiment, the size of the non-superconducting region 32 is preferably 100 nm×100 nm×100 nm or more. When the size of the non-superconducting region 32 is 100 nm×100 nm×100 nm or more, the insulation between the adjacent superconducting regions 31 can be ensured.

In the superconducting wire 100 of the first embodiment, from the viewpoint of making the superconducting wire 100 function as a wire, the length of the superconducting region 31 and the non-superconducting region 32 in the first direction is preferably 1 μm or more, and more preferably 1 m or more.

In the superconducting wire 100 of the first embodiment, from the viewpoint of reducing the AC loss, the width (W2 in FIG. 2) of the non-superconducting region 32 in the second direction is preferably, for example, smaller than the width (W1 in FIG. 2) of the superconducting region 31 in the second direction.

In the superconducting wire 100 of the first embodiment, from the viewpoint of reducing the AC loss, the width (W2 in FIG. 2) of the non-superconducting region 32 in the second direction is preferably, for example, 80 μm or less and more preferably 10 μm or less.

The oxide superconducting layer 30 preferably contains fluorine (F) of $2.0 \times 10^{15}$ atom/cm$^3$ or more and $5.0 \times 10^{19}$ atom/cm$^3$ or less, and carbon (C) of $1.0 \times 10^{17}$ atom/cm$^3$ or more and $5.0 \times 10^{20}$ atom/cm$^3$ or less. The fluorine or carbon contained in the oxide superconducting layer 30 is considered to function as an artificial pin with a small effect under a very strong magnetic field exceeding 10 T. Therefore, the magnetic field characteristics of the superconducting wire 100 are improved.

The superconducting region 31 preferably contains praseodymium (Pr). The PrBCO, which is the non-superconductor, is dispersed in the oxide superconducting layer 30 and functions as an artificial pin. Therefore, the magnetic field characteristics of the superconducting wire 100 are improved.

From the viewpoint that the superconducting region 31 exhibits good superconductivity, the ratio of the number of atoms of the praseodymium (Pr) to the sum of the number of atoms of the rare earth elements other than praseodymium (Pr) and the number of atoms of the praseodymium (Pr) contained in the oxide superconducting layer 30 is preferably 15% or less.

The superconducting region 31 preferably contains a clustered atomically substituted artificial pin (CARP). The clustered atomically substituted artificial pin (CARP) is, for example, an artificial pin described in Japanese Patent No. 6374365, Japanese Patent No. 6479251, or Japanese Patent No. 6556674. By including the clustered atomically substituted artificial pin (CARP) in the superconducting region 31, the magnetic field characteristics of the superconducting wire 100 are improved.

In the method for manufacturing a superconducting wire 100 of the first embodiment, it is preferable to use the inkjet method. By using the inkjet method, an average diameter of droplets when the coating solution 35b for forming a non-superconducting region reaches the substrate 10 can be made, for example, 10 μm or less, and further 1 μm or less. Therefore, the width of the non-superconducting region 32 can be reduced to 10 μm or less, and further to 1 μm or less. Therefore, it is possible to reduce the AC loss of the superconducting wire 100 of the first embodiment.

The greatest feature of the superconducting wire 100 of the first embodiment is that the non-superconducting region 32 separated from the superconducting region 31 forms the perovskite structure instead of the void to reduce the AC loss, and forms a perovskite structure instead of void, and is constituted by the continuous perovskite structure of the superconducting region 31. Therefore, the superconducting wire 100 includes the non-superconducting region 32 that forms the perovskite structure. The non-superconducting region 32 has a structure in which Pr is substituted by 20% or more at the Y site.

The void described above does not mean a small void formed by chance, for example, a void having a diameter of several tens of nm. The void mentioned here is a void that leads to excessive release of the lattice in the quasi-liquid phase network model of the TFA-MOD method, and for example, the void having a width of 1 μm that is expected to be formed by the inkjet method corresponds thereto.

The superconductor formed by the TFA-MOD method has a limit when the film thickness is around 1 μm. Therefore, when the void is comparable to the film thickness, HF gas is sufficiently released and unit cells are excessively formed. The excessive emission forms the a/b-axis oriented particles. Therefore, the void mentioned here means about 1 μm or more.

The a/b-axis oriented particles are known to inhibit the superconducting current. Strictly speaking, the superconducting current flows in a direction 90° different from that of the c-axis oriented particles, but the characteristics of a superconductor with 30% of the a/b-axis oriented particles are reduced to $\frac{1}{100}$ or less. It is recognized that the characteristics are almost zero in the presence of 30%, but here are treated as about $\frac{1}{100}$. When the a/b-axis oriented particles are formed, since the characteristics of the superconducting body are greatly reduced, even if the reduction in the AC loss can be realized, the obtained superconducting current becomes small and its significance is weak.

Therefore, in the superconducting wire 100 of the first embodiment, the non-superconducting perovskite structure is formed by the method in which a/b-axis oriented particles are almost zero, and thus, an AC loss reduction structure is realized. Note that since the continuous perovskite structure is formed, the structure has excellent mechanical strength. In all the comparative examples, since the void is used for the non-superconducting region, the width of the superconductor became narrower, and the superconductor is highly likely to be damaged when wound up with a coil or the like. However, in the superconducting wire 100 of the first embodiment, the non-superconducting region 32 having the lattice structure common to the superconducting region 31 is realized by substituting 20% or more of Pr at the Y site while forming the continuous perovskite structure.

As described above, according to the first embodiment, it is possible to provide an oxide superconductor capable of reducing the AC loss and a method for manufacturing the same.

Second Embodiment

An oxide superconductor of the second embodiment is different from the oxide superconductor of the first embodiment in that the oxide superconductor is a superconducting resonator. Hereinafter, some descriptions of the contents that overlap with the first embodiment may be omitted.

Figure 15A:
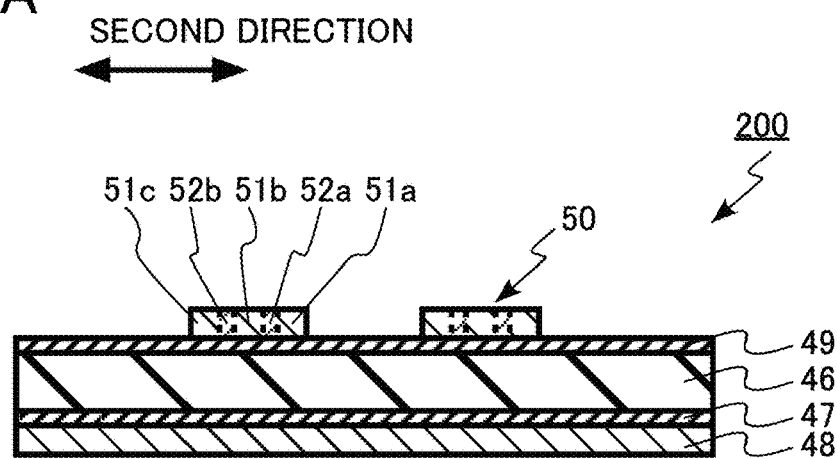
FIGS. 15A and 15B are schematic diagrams of an oxide superconductor of a second embodiment.
Figure 15B:
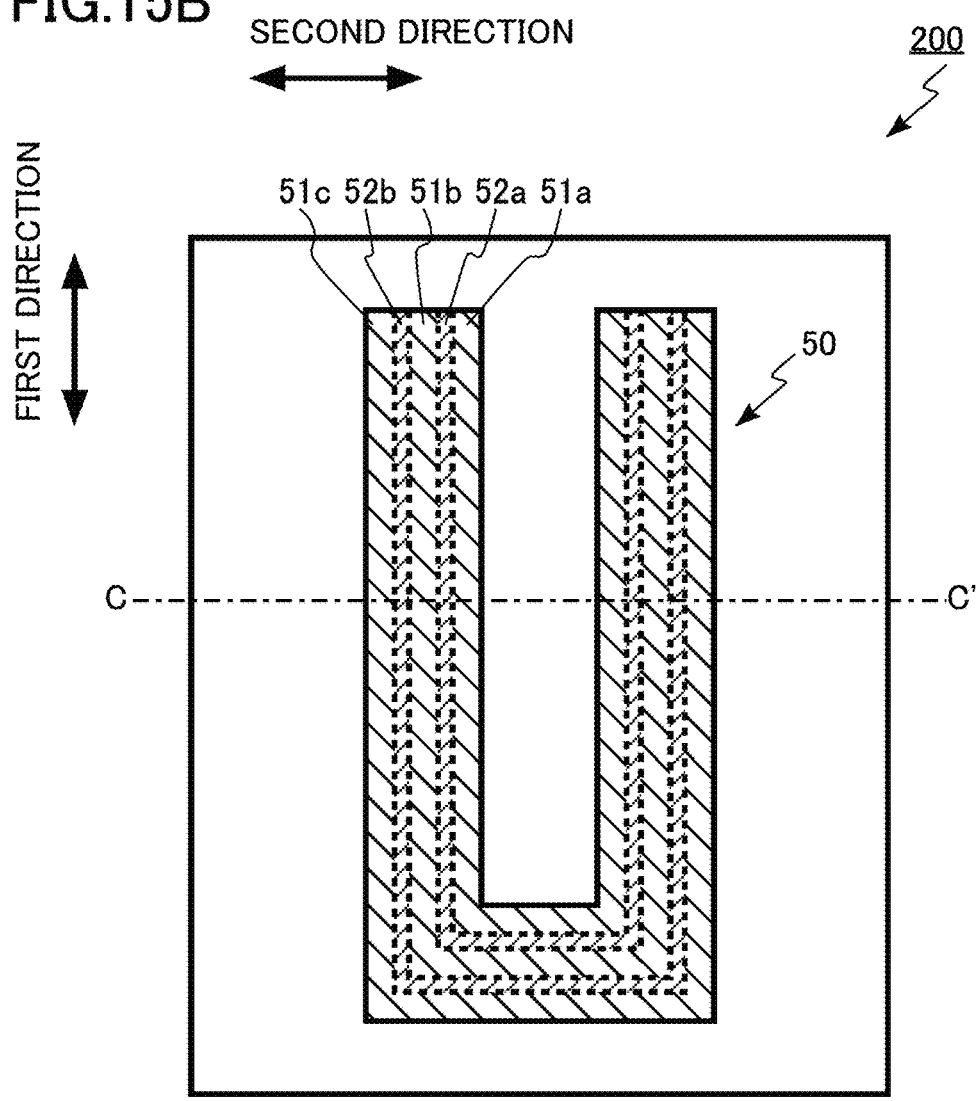

FIGS. 15A and 15B are schematic diagrams of an oxide superconductor of a second embodiment. FIG. 15A is a cross-sectional view, and FIG. 15B is a top view. FIG. 15A is a cross-sectional view taken along the line C-C' of FIG. 15B.

The oxide superconductor of the second embodiment is a superconducting resonator 200. The superconducting resonator 200 has a microstrip line structure. For example, a superconducting filter can be formed by combining a plurality of superconducting resonators 200.

The superconducting resonator 200 includes a substrate 46, a lower intermediate layer 47, a lower oxide superconducting layer 48, an upper intermediate layer 49, and an upper oxide superconducting layer 50. The lower intermediate layer 47 is provided between the substrate 46 and the lower oxide superconducting layer 48. The upper intermediate layer 49 is provided between the substrate 46 and the upper oxide superconducting layer 50. The lower intermediate layer 47 and the upper intermediate layer 49 are, for example, $CeO_2$.

The substrate 46 is provided between the upper oxide superconducting layer 50 and the lower oxide superconducting layer 48. The substrate 46 is, for example, a sapphire substrate.

The upper oxide superconducting layer 50 includes a first superconducting region 51a, a second superconducting region 51b, a third superconducting region 51c, a first non-superconducting region 52a, and a second non-superconducting region 52b. The first non-superconducting region 52a is an example of a non-superconducting region.

At least a portion of the first superconducting region 51a, the second superconducting region 51b, the third superconducting region 51c, the first non-superconducting region 52a, and the second non-superconducting region 52b extend in the first direction.

Hereinafter, for ease of explanation, the first superconducting region 51a, the second superconducting region 51b, and the third superconducting region 51c may be collectively referred to simply as a superconducting region 51. In addition, the first non-superconducting region 52a and the second non-superconducting region 52b may be collectively referred to simply as the non-superconducting region 32.

The upper oxide superconducting layer 50 is divided into the plurality of superconducting regions 31 with the non-superconducting region 32 therebetween.

The first rare earth element contained in the first superconducting region 51a, the second rare earth element contained in the second superconducting region 51b, and the third rare earth element contained in the first non-superconducting region 52a are the same. For example, all the first rare earth element, the second rare earth element, and the third rare earth element are yttrium (Y).

Figure 16A:
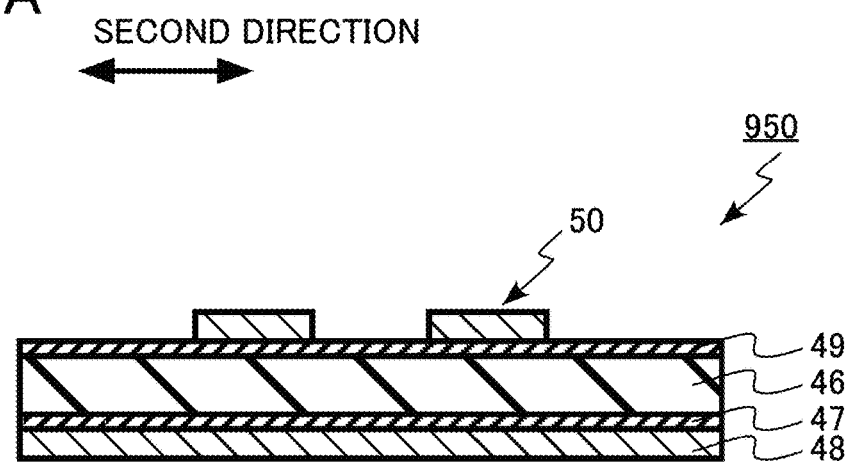
FIGS. 16A and 16B are schematic diagrams of an oxide superconductor of a comparative example of the second embodiment.
Figure 16B:
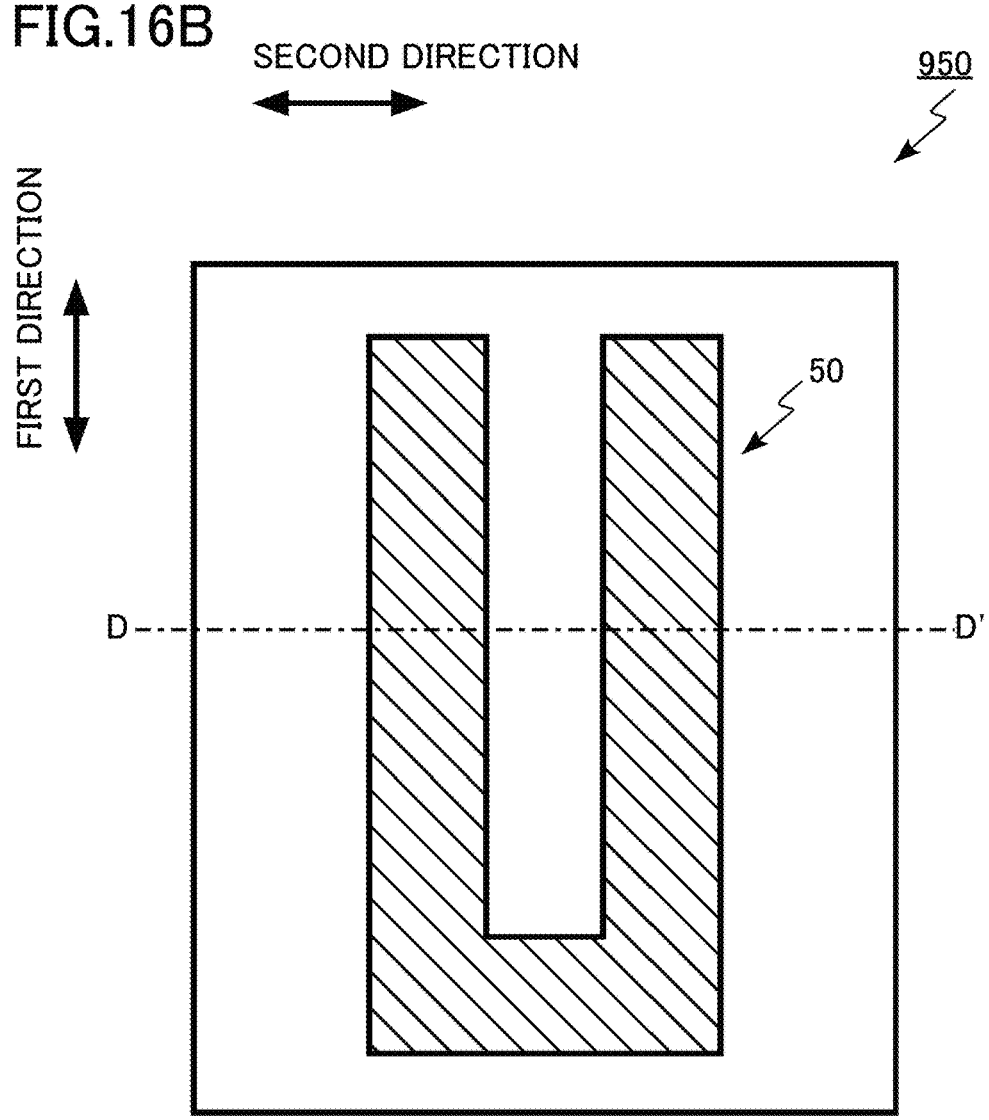

FIGS. 16A and 16B are schematic diagrams of an oxide superconductor of a comparative example of the second embodiment. FIG. 16A is a cross-sectional view, and FIG. 16B is a top view. FIG. 16A is a cross-sectional view taken along the line D-D' of FIG. 16B.

The oxide superconductor of the comparative example is a superconducting resonator 950. A superconducting resonator 950 of the comparative example differs from the superconducting resonator 200 of the second embodiment in that the upper oxide superconducting layer 50 does not include the non-superconducting region and the superconducting region is not divided. The upper oxide superconducting layer 50 is the entire superconducting region which has superconducting characteristics.

In the superconducting resonator 200 of the second embodiment, the upper oxide superconducting layer 50 is divided into the plurality of superconducting regions 51 by the non-superconducting region 52. In other words, the oxide superconducting layer 30 is thinned into the plurality of superconducting regions 51.

Therefore, according to the superconducting resonator 200, the energy loss due to the inductance component can be reduced. Therefore, according to the superconducting resonator 200, it is possible to reduce the AC loss as compared with the superconducting resonator 950 of the comparative example.

(Modification)

Figure 17A:
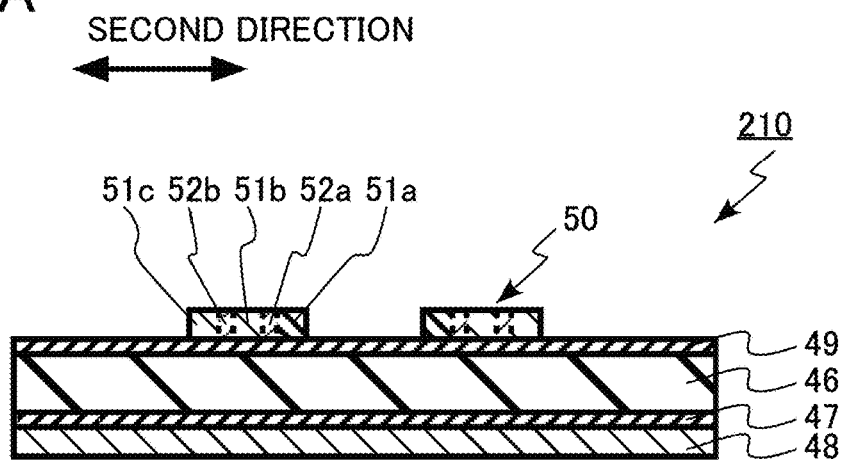
FIGS. 17A and 17B are schematic diagrams of a modification of the oxide superconductor of the second embodiment.
Figure 17B:
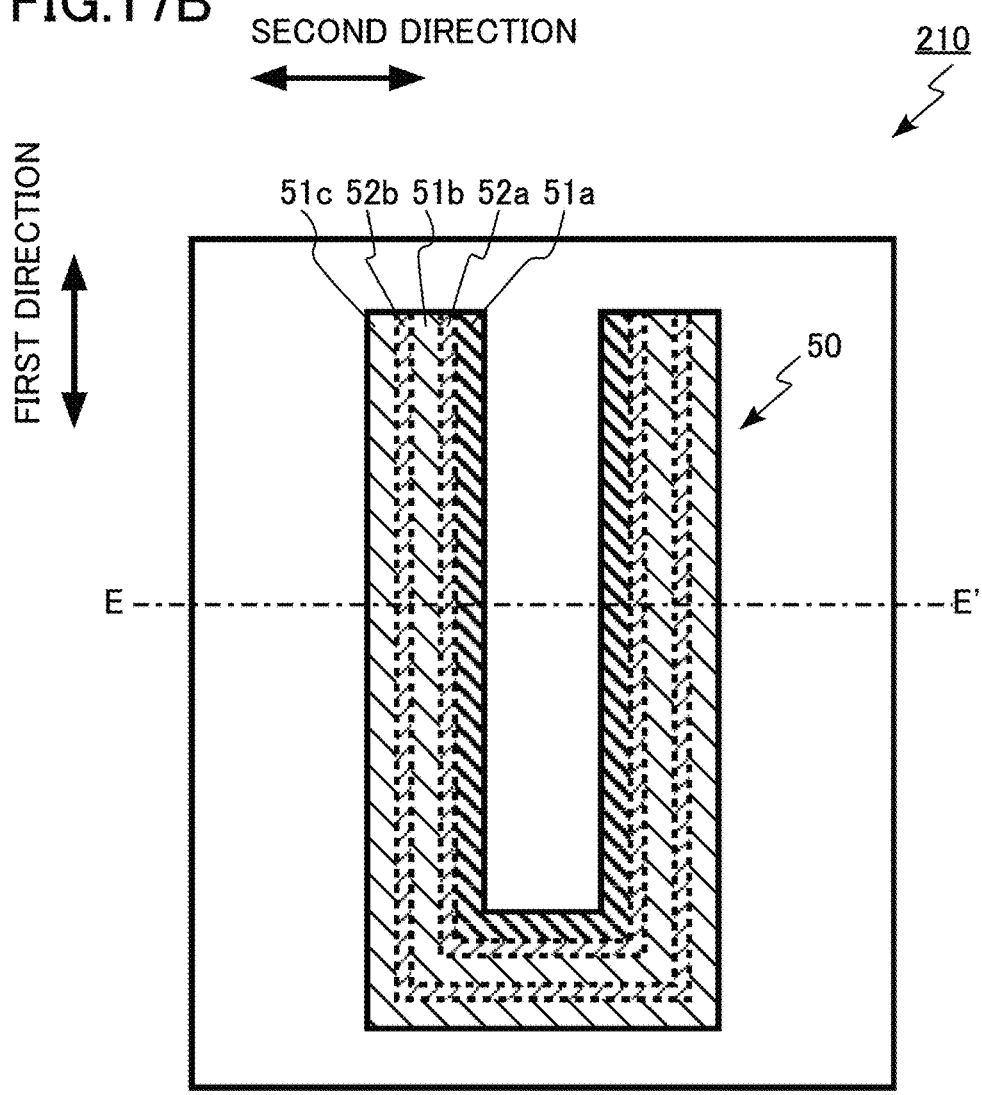

FIGS. 17A and 17B are schematic diagrams of a modification of the oxide superconductor of the second embodiment. FIG. 17A is a cross-sectional view, and FIG. 17B is a top view. FIG. 17A is a cross-sectional view taken along the line E-E' of FIG. 17B.

The modification of the oxide superconductor of the second embodiment is a superconducting resonator 210. The superconducting resonator 210 is different from the superconducting resonator 200 of the second embodiment in that the first rare earth element contained in the first superconducting region 51a and the second rare earth element contained in the second superconducting region 51b are different. The first rare earth element is, for example, dysprosium (Dy), and the second rare earth element is, for example, yttrium (Y).

As described above, according to the second embodiment, it is possible to provide the oxide superconductor capable of reducing the AC loss.

In the superconducting wire and the superconducting resonator of the embodiment, the formation of the a/b-axis oriented particles is suppressed to almost zero while forming the non-superconducting region with a structure in which 22% of Pr is substituted at the Y site, and the superconducting characteristics are maintained. As a result, the formation width of the a/b-axis oriented particles can be suppressed to 30% or less at a width of 200 μm even in the film formation of the superconductor narrower than 400 μm. As a result, a wire having a high AC loss reduction structure can be realized.

In the superconducting wire and the superconducting resonator of the embodiment, it seems that the formation of the a/b-axis oriented particles is almost zero even if the width of the superconductor is 10 μm. This is because the polar figure measurement result is as described above and the high-resolution TEM observation result is as described above. The realization of the AC loss reduction structure without the void formation seems to be realized only by the structure in which Pr is substituted by 22%.

Hereinafter, examples will be described.

EXAMPLES

Example 1

According to the flowchart illustrated in FIG. 3, ten types of coating solutions for superconductors are synthesized and purified. As five types of coating solutions to be first synthesized, powders of each hydrate of 98% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3, 0.10:0.90:2:3, 0.15:0.85:2:3, 0.20:0.80:2:3, 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 1Mi-low-$Pr_{0.00}Y_{1.00}$BCO (substance described in Example 1, Pr with low purity, 0% Pr, 100% Y Material with impurity), 1Mi-low-$Pr_{0.10}Y_{0.90}$BCO, 1Mi-low-$Pr_{0.15}Y_{0.85}$BCO, 1Mi-low-$Pr_{0.20}Y_{0.80}$ BCO, 1Mi-low-$Pr_{0.22}Y_{0.78}$BCO were obtained.

About 7 wt. % of water or acetic acid, which is reaction by-products during solution synthesis, was contained in the obtained translucent blue substances 1Mi-low-$Pr_{0.00}Y_{1.00}$BCO, 1Mi-low-$Pr_{0.10}Y_{0.90}$BCO, 1Mi-low-$Pr_{0.15}Y_{0.85}$BCO, 1Mi-low-$Pr_{0.20}Y_{0.80}$BCO, and 1Mi-low-$Pr_{0.22}Y_{0.78}$BCO. 20 times by weight of anhydrous methanol was added to translucent blue substances 1Mi-low-$Pr_{0.00}Y_{1.00}$BCO, 1Mi-low-$Pr_{0.10}Y_{0.90}$BCO, 1Mi-low-$Pr_{0.15}Y_{0.85}$BCO, 1Mi-low-$Pr_{0.20}Y_{0.80}$BCO, and 1Mi-low-$Pr_{0.22}Y_{0.78}$BCO and dissolved to obtain the coating solution, but when 1Mi-low-$Pr_{0.20}Y_{0.80}$BCO, and 1Mi-low-$Pr_{0.22}Y_{0.78}$BCO are dissolved in methanol, a large amount of opaque greenish white precipitate occurred, and therefore, the experiment was stopped. Other substances did not form a precipitate even when dissolved in methanol, 1CSi-low-$Pr_{0.00}Y_{1.00}$BCO (coating solution described in Example 1, Pr with low purity, 0% Pr, 100% Y Material with impurities), 1CSi-low-$Pr_{0.10}Y_{0.90}$BCO, and 1CSi-low-$Pr_{0.15}Y_{0.85}$BCO were each obtained.

When the coating solutions 1CSi-low-$Pr_{0.00}Y_{1.00}$BCO, 1CSi-low-$Pr_{0.10}Y_{0.90}$BCO, and 1CSi-low-$Pr_{0.15}Y_{0.85}$BCO were stored for 12 hours, the opaque greenish white precipitate occurred in the coating solution 1CSi-low-$Pr_{0.15}Y_{0.85}$BCO, and therefore, the experiment was stopped.

According to the flowchart illustrated in FIG. 3, other five types of coating solutions were synthesized and produced. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3, 0.10:0.90:2:3, 0.15:0.85:2:3, 0.20:0.80:2:3, 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 1Mi-high-$Pr_{0.00}Y_{1.00}$BCO (substance described in Example 1, Pr with high purity, 0% Pr, 100% Y Material with impurities), 1Mi-high-$Pr_{0.10}Y_{0.90}$BCO, 1Mi-low-$Pr_{0.15}Y_{0.85}$BCO, 1Mi-low-$Pr_{0.20}Y_{0.80}$BCO, and 1Mi-low-$Pr_{0.22}Y_{0.78}$BCO were obtained. No coating solution was precipitated during solution synthesis on this side.

About 7 wt. % of water or acetic acid, which is reaction by-products during solution synthesis, was contained in the obtained translucent blue substances 1Mi-high-$Pr_{0.00}Y_{1.00}$BCO, 1Mi-high-$Pr_{0.10}Y_{0.90}$BCO, 1Mi-high-$Pr_{0.15}Y_{0.85}$BCO, 1Mi-high-$Pr_{0.20}Y_{0.80}$BCO, and 1Mi-high-$Pr_{0.22}Y_{0.78}$BCO. 20 times by weight of anhydrous methanol was added to 1Mi-high-$Pr_{0.00}Y_{1.00}$BCO, 1Mi-high-$Pr_{0.10}Y_{0.90}$BCO, 1Mi-high-$Pr_{0.15}Y_{0.85}$BCO, 1Mi-high-$Pr_{0.20}Y_{0.80}$BCO, and 1Mi-high-$Pr_{0.22}Y_{0.78}$BCO and dissolved, and 1CSi-high-$Pr_{0.00}Y_{1.00}$BCO (coating solution described in Example 1, Pr with high purity, 0% Pr, 100% Y Material with impurities), 1CSi-high-$Pr_{0.10}Y_{0.90}$BCO, 1CSi-high-$Pr_{0.15}Y_{0.85}$BCO, 1CSi-high-$Pr_{0.20}Y_{0.80}$BCO, and 1CSi-high-$Pr_{0.22}Y_{0.78}$ BCO were each obtained.

The purification (h in FIG. 3) is performed together with the coating solution obtained in advance. When 1CSi-low-$Pr_{0.00}Y_{1.00}$BCO, 1CSi-low-$Pr_{0.10}Y_{0.90}$BCO, 1CSi-high-$Pr_{0.00}Y_{1.00}$BCO, 1CSi-high-$Pr_{0.10}Y_{0.90}$BCO, 1CSi-high-$Pr_{0.15}Y_{0.85}$BCO, 1CSi-high-$Pr_{0.20}Y_{0.90}$BCO, and 1CSi-high-$Pr_{0.22}Y_{0.78}$ BCO were reacted and purified again under reduced pressure in a rotary evaporator for 12 hours, translucent blue substances 1M-low-$Pr_{0.00}Y_{1.00}$BCO (substance described in Example 1, Pr with low purity, 0% Pr, 100% Y Material without impurity), 1M-low-$Pr_{0.10}Y_{0.90}$BCO, 1M-high-$Pr_{0.00}Y_{1.00}$BCO (substance described in Example 1, Pr with high purity, 0% Pr, 100% Y Material without impurity), 1M-high-$Pr_{0.10}Y_{0.90}$BCO, 1M-high-$Pr_{0.15}Y_{0.85}$BCO, 1M-high-$Pr_{0.20}Y_{0.80}$BCO, and 1M-high-$Pr_{0.22}Y_{0.78}$BCO were each obtained.

Translucent blue substances 1M-low-$Pr_{0.00}Y_{1.00}$BCO, 1M-low-$Pr_{0.10}Y_{0.90}$BCO, 1M-high-$Pr_{0.00}Y_{1.00}$BCO, 1M-high-$Pr_{0.10}Y_{0.90}$BCO, 1M-high-$Pr_{0.15}Y_{0.95}$BCO, 1M-high-$Pr_{0.20}Y_{0.80}$BCO, and 1M-high-$Pr_{0.22}Y_{0.78}$BCO were dissolved in methanol (j in FIG. 3) and diluted using a volumetric flask, and each of the coating solutions 1CS-low-$Pr_{0.00}Y_{1.00}$BCO (Example 1, coating Solution for 0% Pr, 100% Y perovskite structure, Pr with low purity), 1CS-low-$Pr_{0.10}Y_{0.90}$BCO, 1CS-high-$Pr_{0.00}Y_{1.00}$BCO (Example 1, coating Solution for 0% Pr, 100% Y perovskite structure, Pr with high purity), 1CS-high-$Pr_{0.10}Y_{0.90}$BCO, 1CS-high-$Pr_{0.15}Y_{0.85}$BCO, 1CS-high-$Pr_{0.20}Y_{0.80}$BCO, and 1CS-high-$Pr_{0.22}Y_{0.78}$BCO of 1.50 mol/l in terms of metal ions were obtained.

The coating solutions 1CS-low-$Pr_{0.00}Y_{1.00}$BCO, 1CS-low-$Pr_{0.10}Y_{0.90}$BCO, 1CS-high-$Pr_{0.00}Y_{1.00}$BCO, 1CS-high-$Pr_{0.10}Y_{0.90}$BCO, 1CS-high-$Pr_{0.15}Y_{0.85}$BCO, 1CS-high-$Pr_{0.20}Y_{0.80}$BCO, and 1CS-high-$Pr_{0.22}Y_{0.78}$BCO were used, a film was formed on $LaAlO_3$ (100) oriented single crystal of a 10 mm×10 mm×0.50 mmt with an acceleration of 10000 rpm/s, a maximum rotation speed of 4000 rpm, and a holding time of 60 s using a spin coating method, and translucent blue gel films 1Gel-low-$Pr_{0.00}Y_{1.00}$BCO (Example 1, Pr with low concentration, gel film of resulting 0% Pr, 100% Y films), 1Gel-low-$Pr_{0.10}Y_{0.90}$BCO, 1Gel-high-$Pr_{0.00}Y_{1.00}$BCO (Example 1, Pr with high concentration, gel film of resulting 0% Pr, 100% Y films), 1Gel-high-$Pr_{0.10}Y_{0.90}$ BCO, 1Gel-high-$Pr_{0.15}Y_{0.85}$BCO, 1Gel-high-$Pr_{0.20}Y_{0.80}$BCO, and 1Gel-high-$Pr_{0.22}Y_{0.78}$ BCO were each obtained.

The obtained gel films 1Gel-low-$Pr_{0.00}Y_{1.00}$BCO, 1Gel-low-$Pr_{0.10}Y_{0.90}$BCO, 1Gel-high-$Pr_{0.10}Y_{0.90}$BCO, 1Gel-high-$Pr_{0.10}Y_{0.90}$BCO, 1Gel-high-$Pr_{0.15}Y_{0.85}$BCO, 1Gel-high-$Pr_{0.20}Y_{0.80}$BCO, and 1Gel-high-$Pr_{0.22}Y_{0.78}$BCO were immediately installed in a furnace filled with dry gas, the calcining was performed under a humidified pure oxygen atmosphere at 400° C. or lower with the profile illustrated in FIG. 6, and translucent brown calcining films 1Cal-low-$Pr_{0.00}Y_{1.00}$BCO (Example 1, Pr with low concentration, calcined film of resulting 0% Pr, 100% Y films), 1Cal-low-$Pr_{0.10}Y_{0.90}$BCO, 1Cal-high-$Pr_{0.00}Y_{1.00}$ BCO (Example 1, Pr with high concentration, calcined film of resulting 0% Pr, 100% Y films), 1Cal-high-$Pr_{0.10}Y_{0.90}$BCO, 1Cal-high-$Pr_{0.15}Y_{0.85}$BCO, 1Cal-high-$Pr_{0.20}Y_{0.80}$BCO, and 1Cal-high-$Pr_{0.22}Y_{0.78}$BCO were each obtained.

In the firing profile illustrated in FIG. 7, the calcining films 1Cal-low-$Pr_{0.00}Y_{1.00}$BCO, 1Cal-low-$Pr_{0.10}Y_{0.90}$BCO, 1Cal-high-$Pr_{0.00}Y_{1.00}$BCO, 1Cal-high-$Pr_{0.10}Y_{0.90}$BCO, 1Cal-high-$Pr_{0.15}Y_{0.85}$BCO, 1Cal-high-$Pr_{0.20}Y_{0.80}$BCO, and 1Cal-high-$Pr_{0.22}Y_{0.78}$BCO were fired in 1000 ppm oxygen mixed argon gas at 800° C. and annealed in pure oxygen of 525° C. or lower, and oxide thin films 1F-low-$Pr_{0.00}Y_{1.00}$BCO (Example 1, fired oxide films of $Pr_{0.00}Y_{1.00}$BCO, Pr with low concentration), 1F-low-$Pr_{0.10}Y_{0.90}$BCO, 1F-high-$Pr_{0.00}Y_{1.00}$ BCO (Example 1, fired oxide films of $Pr_{0.00}Y_{1.00}$BCO, Pr with high concentration), 1F-high-$Pr_{0.10}Y_{0.90}$BCO, 1F-high-$Pr_{0.15}Y_{0.85}$BCO, 1F-high-$Pr_{0.20}Y_{0.80}$BCO, and 1F-high-$Pr_{0.22}Y_{0.78}$BCO were each obtained.

As a result of measuring each of the oxide thin films 1F-low-$Pr_{0.00}Y_{1.00}$BCO, 1F-low-$Pr_{0.10}Y_{0.90}$BCO, 1F-high-$Pr_{0.00}Y_{1.00}$BCO, 1F-high-$Pr_{0.10}Y_{0.90}$BCO, 1F-high-$Pr_{0.15}Y_{0.85}$BCO, 1F-high-$Pr_{0.20}Y_{0.80}$BCO, and 1F-high-$Pr_{0.22}Y_{0.78}$BCO by a 2θ/ω method of XRD measurement, only a YBCO (00n) peak was confirmed, and heterogeneous phases such as CuO, $Y_2O_3$, or $BaCuO_2$ were at a level where the difference from the background could not be discriminated. YBCO (006) was the strongest peak, and the peak of the heterogeneous phase was $\frac{1}{1000}$ or less. There was no difference in the XRD phase identification results depending on the purity of the raw material Pr.

Superconducting characteristics of oxide thin films 1F-low-$Pr_{0.00}Y_{1.00}$BCO, 1F-low-$Pr_{0.10}Y_{0.90}$BCO, 1F-high-$Pr_{0.00}Y_{1.00}$BCO, 1F-high-$Pr_{0.10}Y_{0.90}$BCO, 1F-high-$Pr_{0.15}Y_{0.85}$BCO, 1F-high-$Pr_{0.20}Y_{0.80}$BCO, and 1F-high-$Pr_{0.22}Y_{0.78}$BCO were each measured by an inductive method in liquid nitrogen under a self-magnetic field. In principle, the superconducting characteristics cannot be evaluated by the inductive method unless the superconductor exists in the region of about 6 mm in diameter in the superconducting film to be targeted. Therefore, the characteristics of only 4 to 6 points in the central portion can be obtained, but the highest value is the characteristic of the superconducting film. The obtained superconducting characteristics each were 6.77, 3.39, 6.81, 3.41, 1.72, 0.00, and 0.00 $MA/cm^2$ (77 K, 0 T).

The measurement results of the superconducting characteristics by the inductive method were based on the result of the 5 times degradation phenomenon, in which the characteristics decreased by about 5 times the amount of Pr added. That is, when 10% of Pr was added, the characteristics were reduced by about 50%, and when 15% of Pr was added, the characteristics were reduced by 75%. It was found that almost the same characteristics were obtained regardless of whether the purity of praseodymium acetate was 98% or 99%, and that the deterioration in characteristics due to the 5 times degradation phenomenon was also almost the same. It was found that the characteristics of those with 20% and 22% of Pr could not be confirmed by the inductive method, and were non-superconducting.

Oxide thin films 1F-low-$Pr_{0.00}Y_{1.00}$BCO, 1F-low-$Pr_{0.10}Y_{0.90}$BCO, 1F-high-$Pr_{0.00}Y_{1.00}$BCO, 1F-high-$Pr_{0.10}Y_{0.90}$BCO, 1F-high-$Pr_{0.15}Y_{0.85}$BCO, 1F-high-$Pr_{0.20}Y_{0.80}$BCO, and 1F-high-$Pr_{0.22}Y_{0.78}$BCO were deposited with silver having a width of 2 mm perpendicular to the 10 mm square diagonal direction of the film surface by an electron beam method and was subjected to heat treatment at 180° C. under pure oxygen, thereby improving the contactability between the deposited silver and the superconducting layer. Two terminals at both end portions are current terminals, and two terminals at a central portion are voltage terminals. The temperature of the sample was controlled by moving a metal plate directly disposed above liquid nitrogen up and down, and Tc measurement was performed with a current of 0.10 μA by a DC 4-probe method. Tc was determined on the basis of 1 μV/cm.

The obtained Tc values of oxide thin films 1F-low-$Pr_{0.00}Y_{1.00}$BCO, 1F-low-$Pr_{0.10}$ $Y_{0.90}$BCO, 1F-high-$Pr_{0.00}Y_{1.00}$BCO, 1F-high-$Pr_{0.10}Y_{0.90}$BCO, and 1F-high-$Pr_{0.15}Y_{0.85}$ BCO each were 90.71, 90.68, 90.69, 90.73, and 90.65 K. Since the measurement error was 0.07 K of the semiconductor thermometer, the Tc value was almost the same. It was found that the oxide thin films 1F-high-$Pr_{0.20}Y_{0.80}$BCO and 1F-high-$Pr_{0.22}Y_{0.78}$BCO did not undergo superconducting transition and were non-superconductor at least between the connected terminals.

It was found from the results of the XRD phase identification, the inductive method, and the DC 4-probe method that the oxide thin films 1F-high-$Pr_{0.20}Y_{0.80}$BCO and 1F-high-$Pr_{0.22}Y_{0.78}$ BCO are a non-superconducting layer that has the same perovskite structure as YBCO but has zero superconducting characteristics due to the 5 times degradation phenomenon of Pr. It was found for the first time that the 5 times degradation phenomenon of Pr is a phenomenon that is applied even if the amount of Pr exceeds 20%.

A solution with 10% of Pr was realized in the previous invention and a patent application has been filed. The PS-SIG method is used to make Pr exist stably. However, it was found that the precipitation is likely to occur when the purity of Pr is as low as 98%. Originally, Pr is a single substance from the size of the ionic radius during solution synthesis, and a substance decomposed when trying to synthesize a PrBCO solution. The suppression was realized by the PS-SIG method, which performs partial stabilization by mixing with Y. When the purity of Pr is as low as 98%, the contained impurities may act during solution synthesis and have the effect of decomposing.

When the purity of Pr is 99%, a 22% Pr-substituted YBCO solution is obtained without precipitation. However, even if the purity is further improved in advance, it is considered that the concentration of Pr cannot be increased by more than 22% because Pr is originally a substance having a large ionic radius and easily decomposed. This is because the inherent mixing limit of Pr should exist.

There was no difference in the phase identification results and the superconducting characteristic results by the inductive method regardless of whether the purity of Pr was 98% or 99%. The amount of impurities is 2% and 1%, and it is unknown what the impurities are, but it seems that the impurities are not substances that show a 5 times degradation phenomenon like PrBCO. In other words, it seems that the substances that caused the decomposition did not form the common perovskite structure. The purity of Pr seems to be related to the decomposition during the solution synthesis, that is, the presence or absence of precipitation.

Examples of overlapping YBCO and PrBCO, and attempts to form the film have been reported for a long time. For example, in the Josephson junction, the YBCO is formed once, and then the PrBCO is formed, and an attempt is made to produce a junction portion between superconductivity and non-superconductivity. However, as described above, the YBCO and PrBCO are substances with extremely different optimum oxygen partial pressure at the same film formation temperature. For example, the optimum oxygen partial pressure at 800° C. is 1000 ppm and 1 ppm, and is 500 ppm and 0.5 ppm which is a half of the above value at 775° C. It is known that the optimum oxygen partial pressure is halved every 25° C. The oxygen partial pressures of the YBCO and PrBCO have 1000-fold difference.

When the YBCO is formed by the PLD method or the MOCVD method, which is a vacuum physical vapor deposition method, the allowable oxygen partial pressure is at most twice as much as 500 ppm to 2000 ppm. Moreover, a considerably poor quality YBCO layer is formed at 500 ppm. Therefore, the YBCO and PrBCO are formed under different conditions, and each cannot have a bond in the perovskite structure.

In the TFA-MOD method, the quasi-liquid phase grows, and the growth interface where the unit cells are released is in a state of precipitated into the bottom of the quasi-liquid phase. Since the control of the oxygen partial pressure is outside the quasi-liquid phase and the oxygen partial pressure does not significantly affect the growth interface, the perovskite structure in which the YBCO and PrBCO are mixed can be obtained. In the previous patent application, the YBCO with 10% Pr substitution have been reported.

Under the conditions of this application, the purity of Pr was as low as 98%, so the limit of Pr that could be substituted at the Y site was 10%, and the coating solution was precipitated at a higher concentration. It is certain that the decomposition of Pr in the PS-SIG method was further suppressed by improving the purity of Pr to 99%, and the YBCO and PrBCO exceeding 20% coexist in the obtained perovskite structure. This is the first report of an unprecedented structure. At the same time, it is the first report that it was confirmed that the 5 times degradation phenomenon of Pr is applied even with 20% or 22% of Pr and thus becomes the non-superconductor.

Example 2

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 2Mi-$Pr_{0.00}Y_{1.00}$BCO (substance described in Example 2, 0% Pr, 100% Y Material with impurity) and 2Mi-$Pr_{0.22}Y_{0.78}$BCO were obtained.

About 7 wt. % of water or acetic acid which is reaction by-products during solution synthesis was contained in the obtained translucent blue substances 2Mi-$Pr_{0.00}Y_{1.00}$BCO and 2Mi-$Pr_{0.22}Y_{0.78}$BCO. 20 times by weight of anhydrous methanol was added to translucent blue substances 2Mi-$Pr_{0.00}Y_{1.00}$BCO and 2Mi-$Pr_{0.22}Y_{0.78}$BCO and dissolved, and the coating solutions 2CSi—$Pr_{0.00}Y_{1.00}$BCO (coating solution described in Example 2, 0% Pr, 100% Y Material with impurity), and 2CSi—$Pr_{0.22}Y_{0.78}$ BCO were each obtained.

When the obtained coating solutions 2CSi—$Pr_{0.00}Y_{1.00}$BCO and 2CSi—$Pr_{0.22}Y_{0.78}$BCO were reacted and purified again under reduced pressure in a rotary evaporator for 12 hours, translucent blue substances 2M-$Pr_{0.00}Y_{1.00}$BCO (substance described in Example 2, 0% Pr, 100% Y Material without impurity) and 2M-$Pr_{0.22}Y_{0.78}$BCO were each obtained.

Translucent blue substance 2M-$Pr_{0.00}Y_{1.00}$BCO and 2M-$Pr_{0.22}Y_{0.78}$BCO were dissolved in methanol (j in FIG. 3) and diluted using a volumetric flask, and each of the coating solutions 2CS—$Pr_{0.00}Y_{1.00}$BCO (Example 2, coating solution for 0% Pr, 100% Y perovskite structure) and 2CS—$Pr_{0.22}Y_{0.78}$BCO of 1.50 mol/l in terms of metal ions were obtained.

Coating solutions 2CS—$Pr_{0.00}Y_{1.00}$BCO and 2CS—$Pr_{0.22}Y_{0.78}$BCO were used, two films were each formed on a $LaAlO_3$ (100) oriented single crystal of 10 mm×10 mm×0.50 mmt at an acceleration of 10000 rpm/s, a maximum rotation speed of 4000 rpm, and a holding time of 60 s using a spin coating method, and translucent blue gel films 2Gel-$Pr_{0.00}Y_{1.00}$BCO-1 (Example 2, gel film of resulting 0% Pr, 100% Y films, sample number 1), 2Gel-$Pr_{0.00}Y_{1.00}$BCO-2, 2Gel-$Pr_{0.22}Y_{0.78}$BCO-3 (Example 2, gel film of resulting 0% Pr, 100% Y films, sample number 1), and 2Gel-$Pr_{0.22}Y_{0.78}BCO$-4 were each obtained. This gel film is a film formation condition in which the film thickness becomes 150 nm after firing.

Separately from the above, coating solutions 2CS—$Pr_{0.00}Y_{1.00}BCO$ and 2CS—$Pr_{0.22}Y_{0.78}BCO$ were used, coating solution 2CS—$Pr_{0.00}Y_{1.00}BCO$ dropped onto one side from a center during film formation on a $LaAlO_3$ (100) oriented single crystal substrate of 10 mm×25 mm×0.50 mmt by the spin coating method and coating solution 2CS—$Pr_{0.22}Y_{0.78}BCO$ dropped onto the other side, spin coating was started at the moment when the central portion was mixed, and a translucent blue gel film 2Gel-$Pr_{0.00}Y_{1.00}BCO+Pr_{0.22}Y_{0.78}BCO$—C (Example 2, gel film of resulting 0% Pr, 100% Y films and 22% Pr, 78% Y films, chimera) was obtained. The film formation conditions are an acceleration of 10000 rpm/s, a maximum rotation speed of 4000 rpm, and a holding time of 60 s.

The boundary at the central portion of the spin coat of translucent blue gel film 2Gel-$Pr_{0.00}Y_{1.00}BCO+Pr_{0.22}Y_{0.76}BCO$—C cannot be visually discriminated.

The obtained gel films 2Gel-$Pr_{0.00}Y_{1.00}BCO$-1, 2Gel-$Pr_{0.00}Y_{1.00}BCO$-2, 2Gel-$Pr_{0.22}Y_{0.78}BCO$-3, and 2Gel-$Pr_{0.22}Y_{0.78}BCO$-4, 2Gel-$Pr_{0.00}Y_{1.00}BCO+Pr_{0.22}Y_{0.78}BCO$—C were immediately installed in a furnace filled with dry gas, the calcining was performed under a humidified pure oxygen atmosphere at 400° C. or lower with the profile illustrated in FIG. 6, and translucent brown calcining films 2Cal-$Pr_{0.00}Y_{1.00}BCO$-1 (Example 2, calcined film of resulting 0% Pr, 100% Y films, sample number 1), 2Cal-$Pr_{0.00}Y_{1.00}BCO$-2, 2Cal-$Pr_{0.22}Y_{0.78}BCO$-3, and 2Cal-$Pr_{0.22}Y_{0.78}BCO$-4, and 2Cal-$Pr_{0.00}Y_{1.00}BCO+Pr_{0.22}Y_{0.78}BCO$—C were each obtained.

In the firing profile illustrated in FIG. 7, the calcining films 2Cal-$Pr_{0.00}Y_{1.00}BCO$-1, 2Cal-$Pr_{0.00}Y_{1.00}BCO$-2, 2Cal-$Pr_{0.22}Y_{0.78}BCO$-3, 2Cal-$Pr_{0.22}Y_{0.78}BCO$-4, and 2Cal-$Pr_{0.00}Y_{1.00}BCO+Pr_{0.22}Y_{0.78}BCO$—C were fired in 1000 ppm oxygen mixed argon gas at 800° C. and annealed in pure oxygen of 525° C. or lower, and oxide thin films 2F-$Pr_{0.00}Y_{1.00}BCO$-1 (Example 2, fired oxide films of $Pr_{0.00}Y_{1.00}BCO$, sample number 1), 2F-$Pr_{0.00}Y_{1.00}BCO$-2, 2F—$Pr_{0.22}Y_{0.78}BCO$-3, 2F—$Pr_{0.22}Y_{0.7}BCO$-4, and 2F-$Pr_{0.00}Y_{1.00}BCO+Pr_{0.22}Y_{0.78}BCO$—C were each obtained.

As a result of measuring each of the centers of the oxide thin films 2F-$Pr_{0.00}Y_{1.00}BCO$-1, 2F—$Pr_{0.00}Y_{1.00}BCO$-2, 2F—$Pr_{0.22}Y_{0.78}BCO$-3, and 2F-$Pr_{0.22}Y_{0.78}BCO$-4 by a 2θ/ω method of XRD measurement, only a YBCO (00n) peak was confirmed, and heterogeneous phases such as CuO, $Y_2O_3$, or $BaCuO_2$ were at a level where the difference from the background could not be discriminated. YBCO (006) was the strongest peak, and the peak of the heterogeneous phase was 1/1000 or less. There was no difference in the XRD phase identification results depending on the purity of the raw material Pr.

Superconducting characteristics of oxide thin films 2F-$Pr_{0.00}Y_{1.00}BCO$-1, 2F—$Pr_{0.00}Y_{1.00}BCO$-2, 2F—$Pr_{0.22}Y_{0.78}BCO$-3, and 2F-$Pr_{0.22}Y_{0.78}BCO$-4 were each measured by an inductive method in liquid nitrogen under a self-magnetic field. FIGS. 18A and 18B are diagrams illustrating measurement results of superconducting characteristics on maps of oxide thin films 2F-$Pr_{0.00}Y_{1.00}BCO$-1 and 2F-$Pr_{0.00}Y_{1.00}BCO$-2.

The measurement of the superconducting characteristics by the inductive method is made by a combination of a single magnetic field generating rod and a third harmonic wave detector. If the other side superconductor has the effect of canceling the applied magnetic field, the oxide thin film is in the superconducting state, and when the superconductor exceeds the applied magnetic field, the third harmonic wave is generated, and the superconducting characteristics can be measured non-destructively by the detection. Of course, a signal will be output even if this is not the case, but if a waveform deviates from a standard state or the detection voltage does not become zero when a magnetic field is applied, it is treated as non-superconducting.

For the generation and detection of the third harmonic wave, a region with a diameter of 6 mm on the superconductor side is required, and in this method for measuring each 10 mm sample by moving a rod at a pitch of 2 mm, data of up to 3 points on one side is not lined up.

The measurement result of the oxide thin film 2F-$Pr_{0.00}Y_{1.00}BCO$-1 is illustrated in FIG. 18A, and 5 points with Jc values ($MA/cm^2$, 77 K, 0 T) from 6.29 to 6.67 are treated as regions where superconducting characteristics could be measured. The measurement result of the oxide thin film 2F-$Pr_{0.00}Y_{1.00}BCO$-2 is illustrated in FIG. 18B, which has the characteristics of 6.43 to 6.85. If those that are not the maximum value are highly likely that it will be affected by the end portion of the single crystal, so the maximum value of the obtained result will be the Jc value.

It was found that the oxide thin films 2F-$Pr_{0.00}Y_{1.00}BCO$-1 and 2F-$Pr_{0.00}Y_{1.00}BCO$-2 should be good superconductors with superconducting characteristics of 6.67 and 6.85 $MA/cm^2$ in liquid nitrogen in the center.

Figures 19A, 19B:
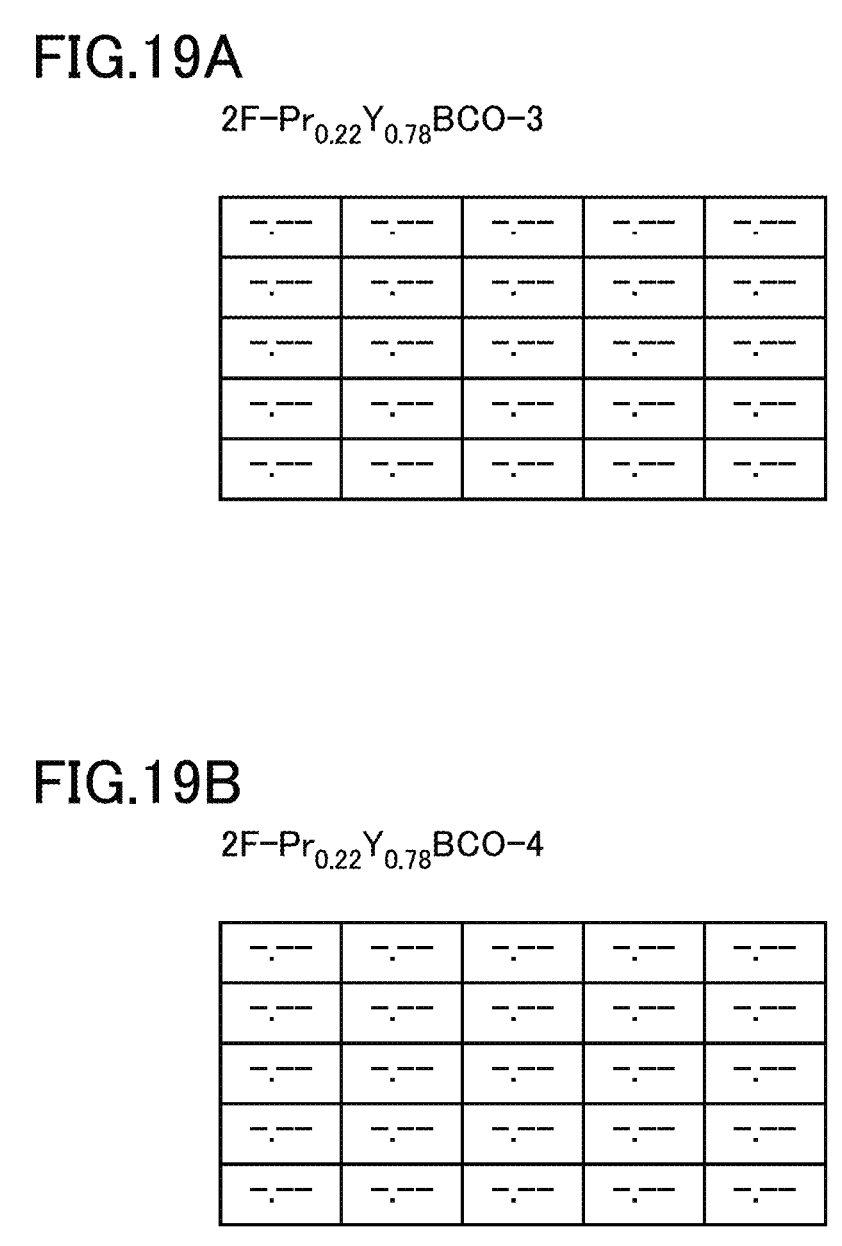

FIGS. 19A and 19B are diagrams illustrating measurement results of superconducting characteristics of oxide thin films 2F-$Pr_{0.22}Y_{0.78}BCO$-3 and 2F-$Pr_{0.22}Y_{0.78}BCO$-4. As the measured results, 2F-$Pr_{0.22}Y_{0.78}BCO$-3 is illustrated in FIG. 19A and 2F-$Pr_{0.22}Y_{0.78}BCO$-4 is illustrated in FIG. 19B. In this case, no signal that can be determined as superconductivity was obtained in all regions. This result is the same as in Example 1, but this experiment was performed to confirm the undiluted solution for forming a chimeric film after that. The characteristics are zero over the entire area, and there is no superconducting region with a diameter of 6 mmφ inside the film.

Figure 20:
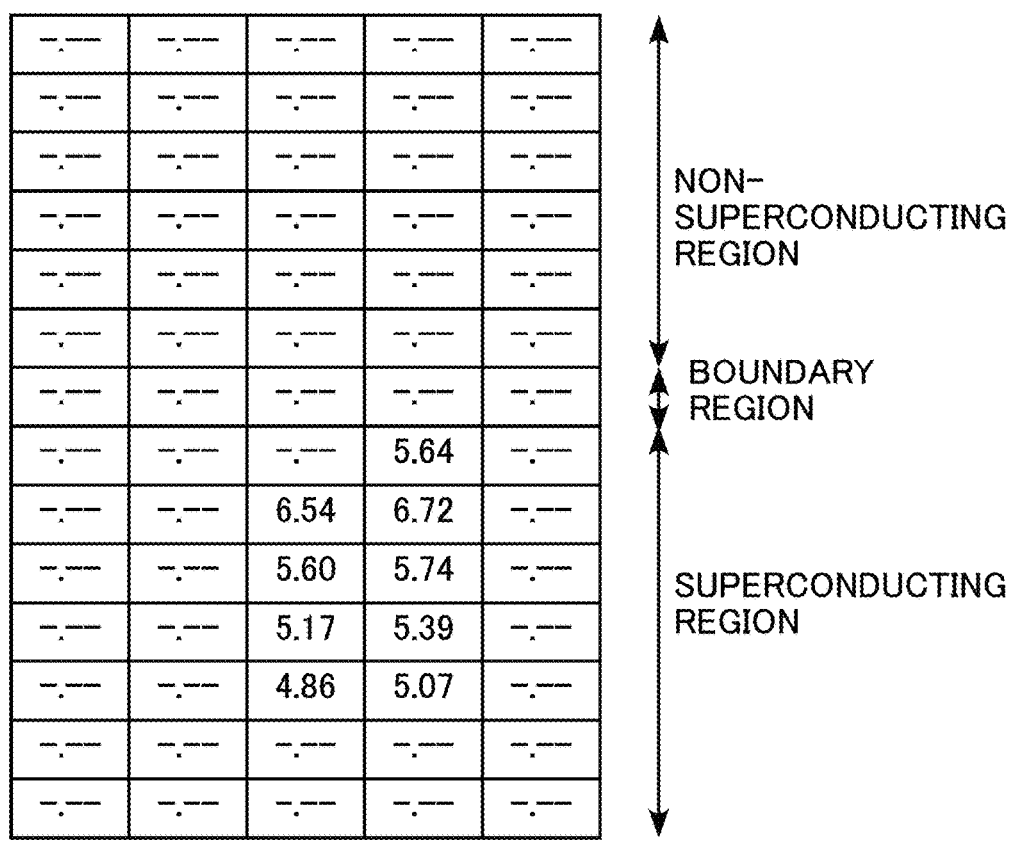
FIG. 20 is a diagram illustrating measurement results of superconducting characteristics when the oxide thin film 2F-$Pr_{0.00}Y_{1.00}$BCO+$Pr_{0.22}Y_{0.78}$BCO—C of Example 2 is installed on a lower side of YBCO and on an upper side of YBCO with 22% Pr substitution.

FIG. 20 illustrates measurement results of superconducting characteristics when the oxide thin film 2F-$Pr_{0.00}Y_{1.00}BCO+Pr_{0.22}Y_{0.78}BCO$—C is installed on a lower side of YBCO and on an upper side of YBCO with 22% Pr substitution. On the upper side of the figure, YBCO with 22% Pr substitution does not show superconducting characteristics. On the other hand, the lower YBCO shows the superconducting characteristics. At the boundary, a portion that is not determined to be superconducting due to the principle of the inductive method will have a width of 2 to 4 mm.

The YBCO portion of the Jc value of this oxide thin film 2F-$Pr_{0.00}Y_{1.00}BCO+Pr_{0.22}Y_{0.78}BCO$—C is a result close to the Jc values of 2F-$Pr_{0.00}Y_{1.00}BCO$-1 and 2F-$Pr_{0.00}Y_{1.00}BCO$-2, and the 22% Pr—YBCO portion is the same result as 2F-$Pr_{0.22}Y_{0.78}BCO$-3 and 2F-$Pr_{0.22}Y_{0.78}BCO$-4.

The appearance of the oxide thin film 2F-$Pr_{0.00}Y_{1.00}BCO+Pr_{0.22}Y_{0.78}$ BCO—C is as follows: YBCO superconducting portion is glossy black, and a location where 22% Pr is present is slightly whitish. Since the optimum oxygen partial pressure at the time of the firing of the portion where 22% Pr is present is not 1000 ppm, there is a possibility that a heterogeneous phase was partially formed. However, as described above, the TFA-MOD method can perform firing with a wide oxygen partial pressure, and it has been confirmed from the XRD measurement results that it has a perovskite structure. If the optimum oxygen partial pressure is 1000 ppm for the YBCO and 1 ppm for the PrBCO, it will be 218 ppm if it is proportional to the logarithmic-axis. Note that it is known that the TFA-MOD method forms a superconductor even if the oxygen partial pressure deviates to this extent. However, due to the deviation of the optimum oxygen partial pressure, a heterogeneous phase may be formed on the surface and the surface may appear white.

As the appearance of the oxide thin film 2F-$Pr_{0.00}Y_{1.00}BCO+Pr_{0.22}Y_{0.78}BCO$—C, as measurement results of the 2θ/ω of the XRD method were for a white haze in the upper portion of FIG. 20, a slightly white black part in the central portion, and a glossy black part on the opposite side, the results are 2XRD-$Pr_{0.00}Y_{1.00}BCO+Pr_{0.22}Y_{0.78}BCO$—CW (XRD measurement result of Example 2, Chimera white area), 2XRD-$Pr_{0.00}Y_{1.00}BCO+Pr_{0.22}Y_{0.78}BCO$—CC (center area), and 2XRD-$Pr_{0.00}Y_{1.00}BCO+Pr_{0.22}Y_{0.78}BCO$—CB (black area).

The results of 2XRD-$Pr_{0.00}Y_{1.00}BCO+Pr_{0.22}Y_{0.78}BCO$—CC and 2XRD-$Pr_{0.00}Y_{1.00}BCO+Pr_{0.22}Y_{0.78}BCO$—CB were almost the same. Therefore, it is considered that 22% Pr—YBCO is formed in the center area. The region of 2XRD-$Pr_{0.00}Y_{1.00}BCO+Pr_{0.22}Y_{0.78}BCO$—CW on the opposite side seems to obtain results close to the YBCO.

Figure 21:
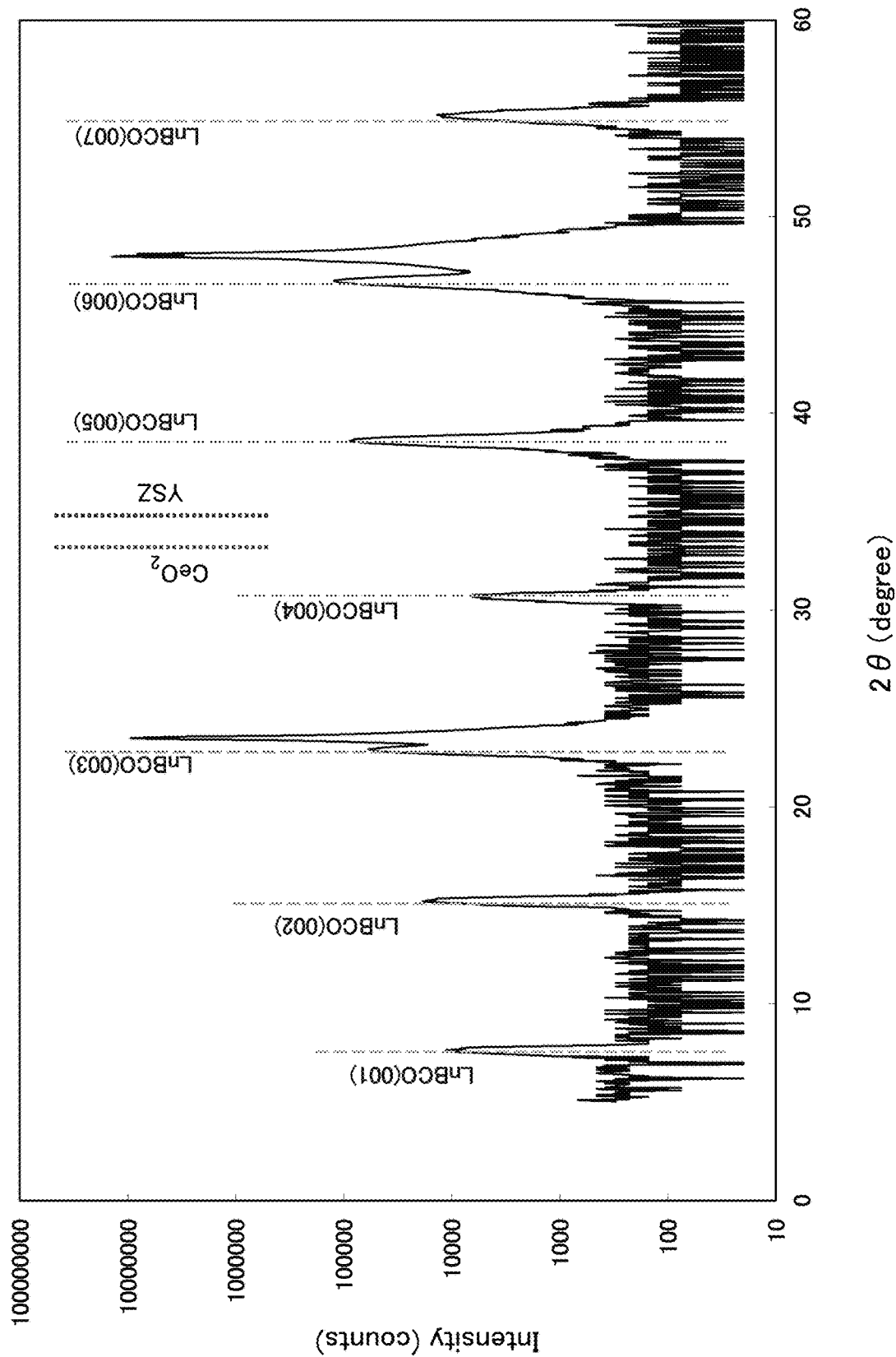
FIG. 21 is a diagram illustrating XRD results of 2XRD-$Pr_{0.00}Y_{1.00}$BCO+$Pr_{0.22}Y_{0.78}$BCO—CW in which the YBCO of Example 2 is formed.
Figure 22:
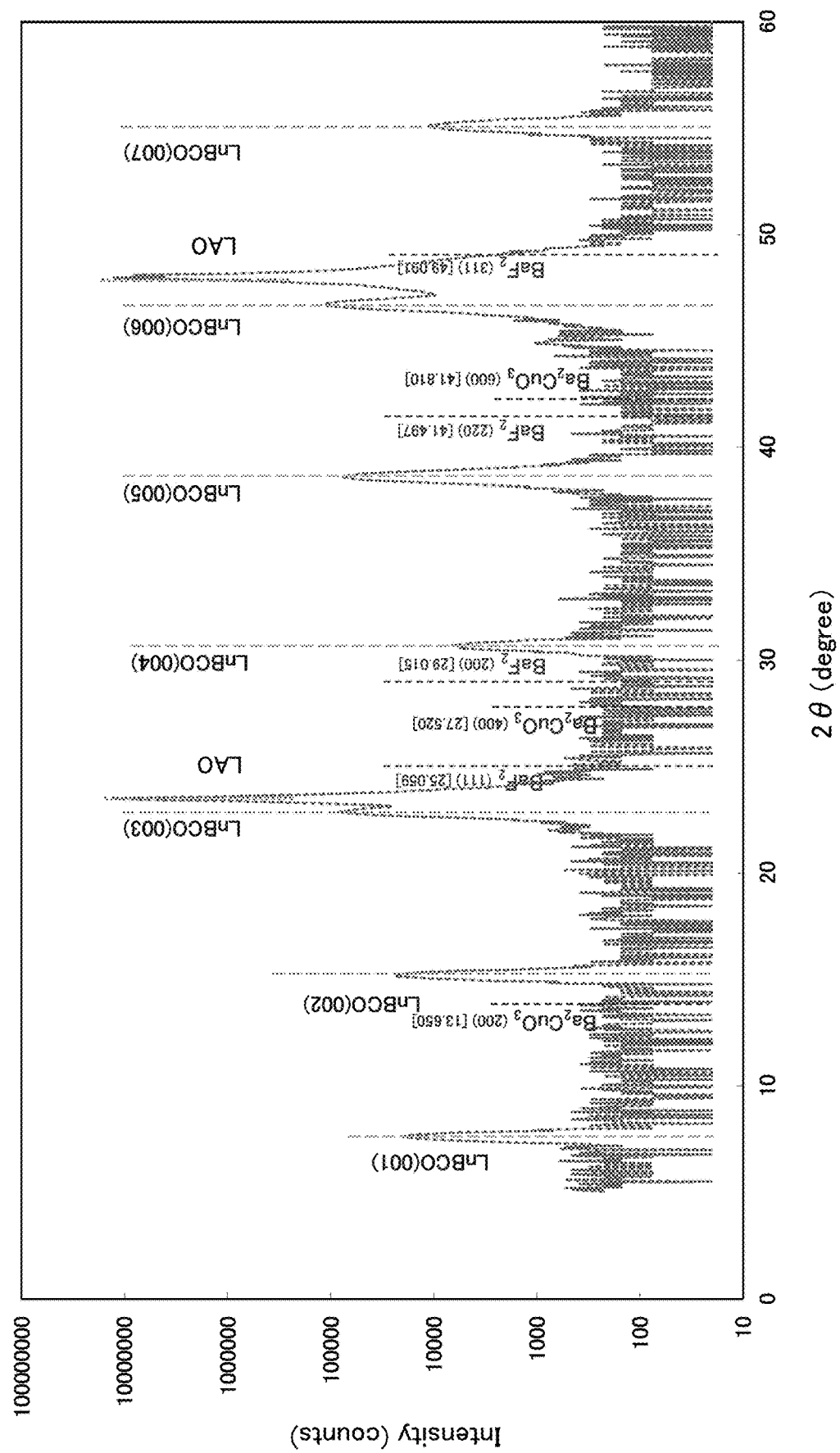
FIG. 22 is a diagram illustrating XRD results of 2XRD-$Pr_{0.00}Y_{1.00}$BCO+$Pr_{0.22}Y_{0.78}$BCO—CC, in which it seems to be YBCO with 22% Pr substitution of Example 2.

FIG. 21 illustrates XRD results of 2XRD-$Pr_{0.00}Y_{1.00}BCO+Pr_{0.22}Y_{0.78}BCO$—CW in which the YBCO is formed. FIG. 22 illustrates the XRD results of 2XRD-$Pr_{0.00}Y_{1.00}BCO+Pr_{0.22}Y_{0.78}$ BCO—CC which seems to be the YBCO with 22% Pr substitution. In both results, only the YBCO (00n) peak is seen, and small peaks showing heterogeneous phases are at the same level as the background. Since the YBCO (006) peak seen near 46.68° and the background have a 1000-fold difference in intensity, it is considered to be almost YBCO.

Figure 23:
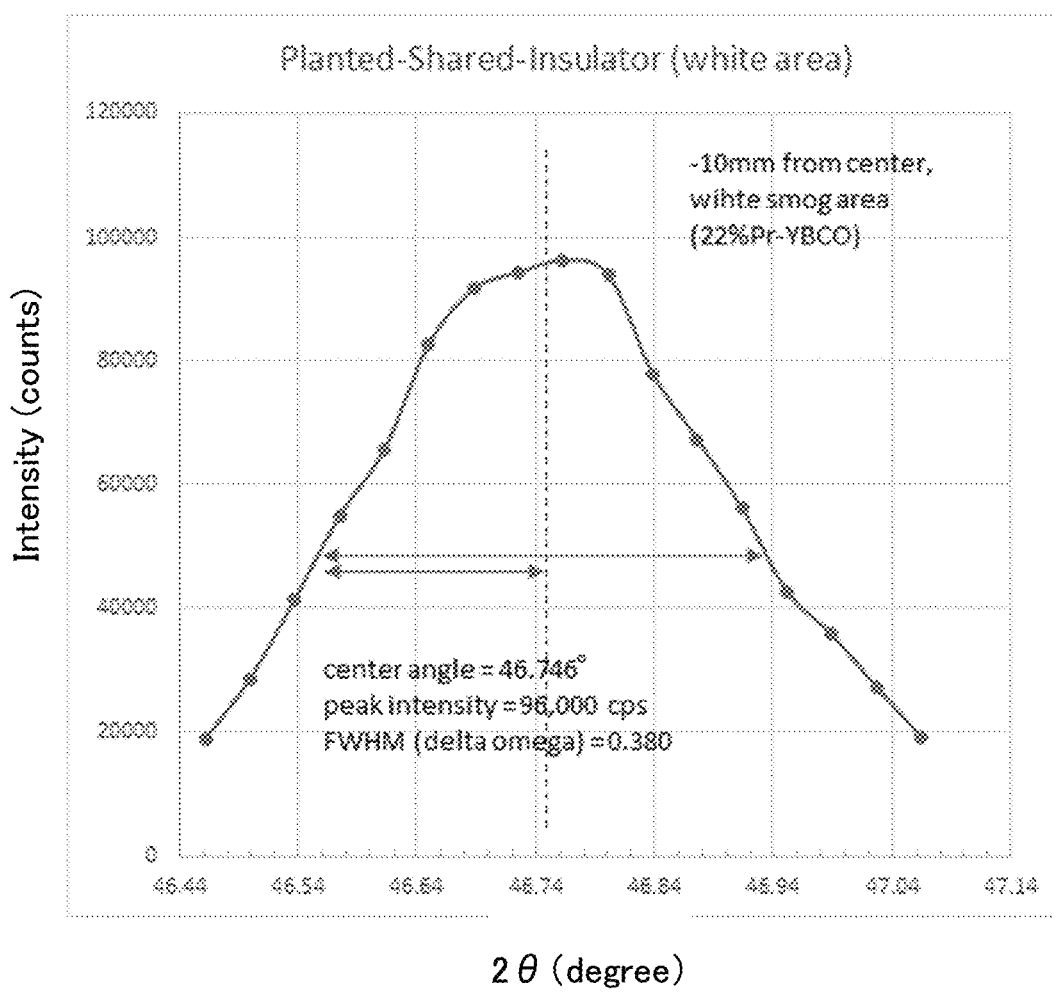
FIG. 23 is an enlarged view of (006) peak of $Pr_{0.22}Y_{0.7}$BCO of Example 2.

An enlarged view of the YBCO (006) peak is illustrated in FIG. 23. FIG. 23 is an enlarged view of 2XRD-$Pr_{0.00}Y_{1.00}BCO+Pr_{0.22}Y_{0.78}BCO$—CW near the YBCO (006) peak. Since the intensity of the nearby LAO (200) peak is small, the peak position of this portion will be discussed as the central portion of the half value of the peak intensity. Due to the influence of the $LaAlO_3$ substrate (200) peak, the YBCO (006) peak is observed at 46.68° on the slightly higher angle side by this method. In the evaluation between samples, it is considered that the influence of the $LaAlO_3$ substrate (200) peak does not change significantly unless the position of 2θ deviates from 0.2°, and it seems that relative comparison is possible.

In FIG. 23, the peak of 2XRD-$Pr_{0.00}Y_{1.00}BCO+Pr_{0.22}Y_{0.78}BCO$—CW is a single line. It is said that the YBCO peaks at (006) at 46.68°, for example, the SmBCO peaks at 46.53°, and the NdBCO peaks at 46.46°. The LaBCO is 46.00°. This is related to lanthanoid contraction, where the c-axis length is longer in La with a large atomic radius, and the (006) peak is located on the low angle side.

If the PrBCO forms the perovskite structure and the valence of Pr does not change, the peak position should appear near 46.2°, which is the central portion of the LaBCO and NdBCO. However, the result in FIG. 23 shows only one peak at 46.746°. This means that the PrBCO and YBCO form a common or single perovskite structure even with a 22% Pr mixture. It indicates that it is single crystal or crystallographically continuous. The peak intensity was 96000 cps, 2θ=46.746°.

Figure 24:
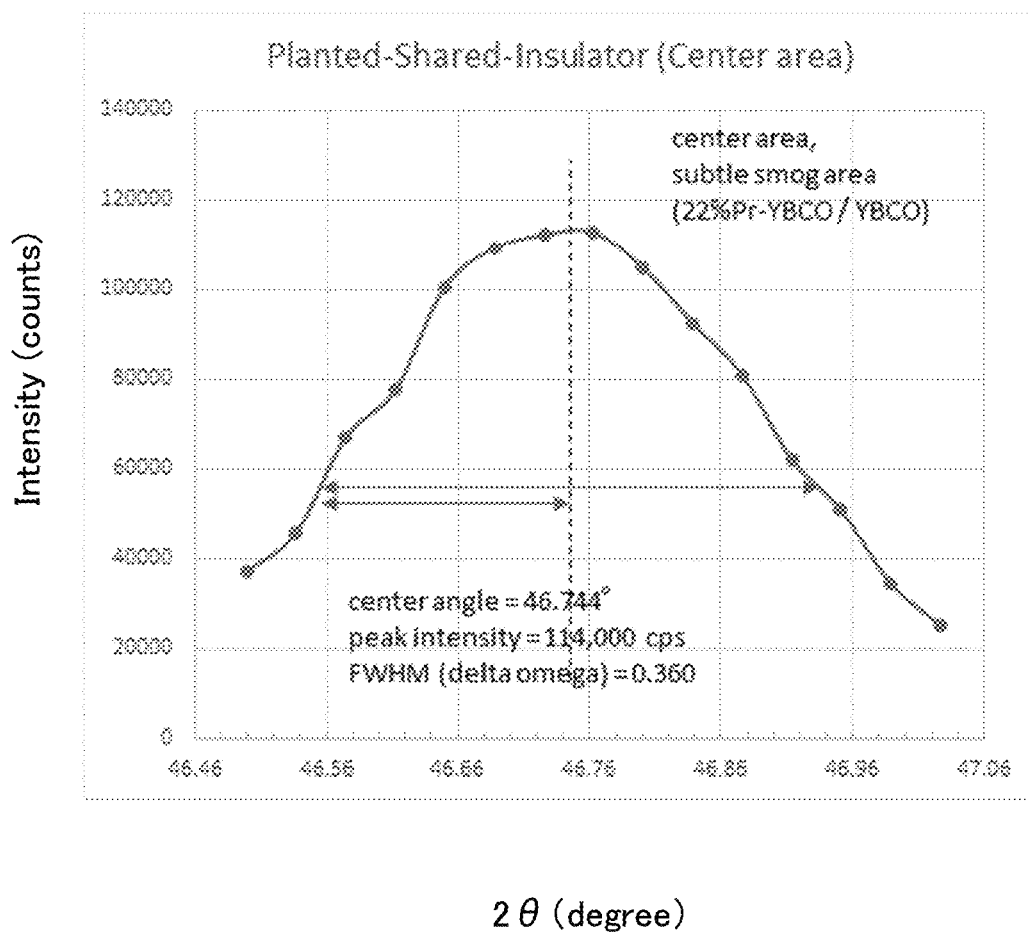
FIG. 24 is an enlarged view of (006) peak of $Pr_{0.22}Y_{0.78}$BCO approximating the YBCO of Example 2.

In FIG. 24, the XRD result of 2XRD-$Pr_{0.00}Y_{1.00}BCO+Pr_{0.22}Y_{0.78}BCO$—CC was 114000 cps and 2θ=46.744° which are almost the same results as FIG. 23 except that the position where the peak intensity became a little stronger moved to the higher angle side by 0.02°. This also indicates that 2XRD-$Pr_{0.00}Y_{1.00}BCO+Pr_{0.22}Y_{0.76}BCO$—CC is a composition close to 2XRD-$Pr_{0.00}Y_{1.00}BCO+Pr_{0.22}Y_{0.78}BCO$—CW.

The FWHM and strength that can be read from FIGS. 23 and 24 are 0.380° and 96000 cps for 2XRD-$Pr_{0.00}Y_{1.00}BCO+Pr_{0.22}Y_{0.70}BCO$—CW. 2XRD-$Pr_{0.00}Y_{1.00}BCO+Pr_{0.22}Y_{0.78}BCO$—CC is 0.360° and 114000 cps. As the amount of Pr increases, the portion changes from trivalent to tetravalent, the c-axis length becomes shorter, and it is expected that the peak intensity will weaken due to the deviation in the XRD measurement. The width is expected to be broad. FIG. 24 illustrates an intermediate result between the YBCO and the 22% Pr—YBCO because it is measured across boundaries. The FWHM corresponding to Δω is small at 0.360°, and the peak is strong at 114000 cps.

Figure 25:
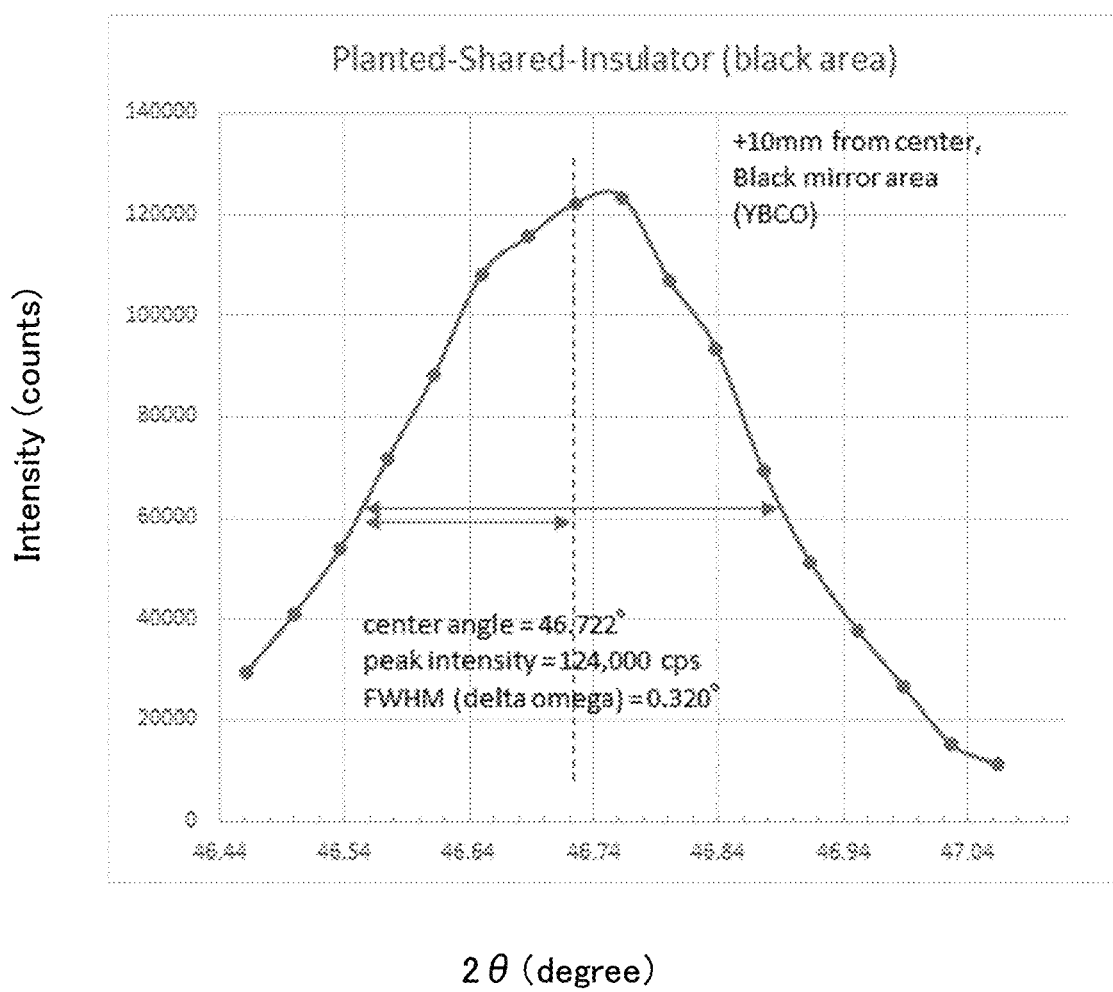
FIG. 25 is an enlarged view of (006) peak of YBCO of Example 2.

Finally, the result of the portion that is almost YBCO is illustrated in FIG. 25. Since YBCO is a single substance, it is natural that it has one peak, but the (006) peak position evaluated by this method is 46.722°. This value is only 0.024° different from FIG. 23, which is the most deviated. It is presumed that the PrBCO has a structure in which the peak comes around 46.2° immediately after the formation, but the c-axis length becomes shorter due to the change in the valence of Pr, and the (006) peak shifts to the high angle side. The difference between the comparison results of the perovskite structures containing 22% Pr and YBCO at room temperature was only 0.024°.

This 0.024° is a very small value. It is widely known that the YBCO and SmBCO can form the common perovskite structure in the TFA-MOD method, but their (006) peak positions differ by 0.15°. The YBCO with dispersed Pr shows that the difference of 2θ is smaller and the c-axis length is close to the same value. It is expected that the structure will exist more stably.

As a result of 2XRD-$Pr_{0.00}Y_{1.00}BCO+Pr_{0.22}Y_{0.78}BCO$—CB illustrated in FIG. 25, the FWHM is 0.32° and the peak intensity is 124000 cps. From the results of FIGS. 23 to 25, the XRD result shows that a continuous structure can be formed in principle, and it is proof that a continuous perovskite structure is obtained.

As a result, the AC loss could not be reduced unless the structure was drilled by the laser scribing method, but even if the width of the non-superconducting region is formed at the same 100 μm by the new planted shared insulator (PSI) method, the superconducting film has excellent mechanical strength, and it is possible to form an excellent structure that is not damaged by the laser scribing.

In the film formation by the TFA-MOD method, the film formation by the die coating method using the meniscus portion is the basis in the continuous film formation process. The key to the formation is the simultaneous film formation of the superconducting region and the non-superconducting region illustrated in FIG. 5.

In the TFA-MOD method, it has been reported that the AC loss reduction structure was developed by forming only the superconducting region by the inkjet method and maintaining the insulation in the void portion. However, the superconducting wire was completed by that method to form the superconducting coil and there is no example of application as of 2020. It seems to be a difficult method considering the current situation that more than 10 years have passed since the development.

One of the difficulties is the handling of methanol solutions that are too viscous. If the droplet spreads when it is ejected by an inkjet, there is a risk that the superconducting region may connect to the adjacent portion. Even if the droplets are controlled to form the portion where the gel film exists and the portion where the gel film does not exist, the firing reaction by the TFA-MOD method increases the nucleation frequency of both end portions where the gas easily volatilizes, and then the a/b-axis oriented particle where the superconducting characteristics decrease due to the sideway growth is formed and grows to be a wall, so good superconducting characteristics cannot be expected.

On the other hand, in the PSI method illustrated in FIG. 8, the finally formed superconducting film is about 1.2 micron, and the gel film has a thickness of only 12 μm. Simultaneous film formation may form a diffusion layer of several microns, but it is easy to see that it does not exceed 100 μm. Therefore, the PSI structure illustrated in FIG. 1 can be realized.

It is clear from the data verification in this example that the structure illustrated in FIG. 1 is realized. Due to the PSI structure, the superconducting region has few a/b-axis oriented particles, the width of the non-superconducting region is about 10 μm, and the superconducting region and the non-superconducting region are crystallographically connected to obtain a structure having excellent strength.

Example 3

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 3Mi-$Pr_{0.00}Y_{1.00}$BCO (substance described in Example 3, 0% Pr, 100% Y Material with impurity) and 3Mi-$Pr_{0.22}Y_{0.78}$ BCO were obtained.

About 7 wt. % of water or acetic acid which is reaction by-products during solution synthesis was contained in the obtained translucent blue substances 3Mi-$Pr_{0.00}Y_{1.00}$BCO and 3Mi-$Pr_{0.22}Y_{0.78}$BCO. 20 times by weight of anhydrous methanol was added to translucent blue substances 3Mi-$Pr_{0.00}Y_{1.00}$BCO and 3Mi-$Pr_{0.22}Y_{0.78}$BCO and dissolved, and the coating solutions 3CSi—$Pr_{0.00}Y_{1.00}$BCO (coating solution described in Example 3, 0% Pr, 100% Y Material with impurity), and 3CSi—$Pr_{0.22}Y_{0.78}$BCO were each obtained.

When the obtained coating solutions 3CSi—$Pr_{0.00}Y_{1.00}$BCO and 3CSi—$Pr_{0.22}Y_{0.78}$ BCO were reacted and purified again under reduced pressure in a rotary evaporator for 12 hours, translucent blue substances 3M-$Pr_{0.00}Y_{1.00}$BCO (substance described in Example 3, 0% Pr, 100% Y Material without impurity) and 3M-$Pr_{0.22}Y_{0.78}$BCO were each obtained.

Translucent blue substance 3M-$Pr_{0.00}Y_{1.00}$BCO and 3M-$Pr_{0.22}Y_{0.78}$BCO were dissolved in methanol (j in FIG. 3) and diluted using a volumetric flask, and each of the coating solutions 3CS—$Pr_{0.00}Y_{1.00}$BCO (Example 3, coating solution for 0% Pr, 100% Y perovskite structure) and 3CS—$Pr_{0.22}Y_{0.78}$BCO of 1.50 mol/l in terms of metal ions were obtained.

Separately from the above, coating solutions 3CS—$Pr_{0.00}Y_{1.00}$BCO and 3CS—$Pr_{0.22}Y_{0.78}$BCO were used, coating solution 3CS—$Pr_{0.00}Y_{1.00}$BCO dropped onto one side from a center during film formation on a $LaAlO_3$ (100) oriented single crystal substrate of 10 mm×30 mm×0.50 mmt by the spin coating method and coating solution 3CS—$Pr_{0.22}Y_{0.78}$BCO dropped onto the other side, spin coating was started at the moment when the center was mixed, and a translucent blue gel film 3Gel-$Pr_{0.00}Y_{1.00}$BCO+$Pr_{0.22}Y_{0.76}$BCO—C(Example 3, gel film of resulting 0% Pr, 100% Y films and 22% Pr, 78% Y films, chimera) was obtained. The film formation conditions are an acceleration of 10000 rpm/s, a maximum rotation speed of 2000 rpm, and a holding time of 60 s.

The film thickness of the superconducting film finally obtained from the film formation conditions by the spin coating method and the metal ion concentration of the coating solution should be 220 nm. In this film formation, after the coating solution 3CS—$Pr_{0.00}Y_{1.00}$BCO is dropped onto the substrate, the stop position is confirmed and then the coating solution 3CS—$Pr_{0.22}Y_{0.78}$BCO is dropped on the opposite side. The spin coating was started at the moment both solutions were mixed, but the coating solution 3CS-$Pr_{0.00}Y_{1.00}$BCO dropped earlier was maintained on the substrate for about 20 seconds without being formed.

The solvent of the coating solution in this method is methanol, which is highly volatile and evaporates over time, increasing the solute concentration. The increase in the solute concentration in the coating solution leads to an increase in the solution clay, and the solution clay becomes thicker in a semi-logarithmic proportion. This is the reason why the superconducting film analyzed by this method is thick. The experiment was not unsuccessful, but it was thickened by the film formation method, and it is a natural result that cracks occur in the superconducting film over 300 to 350 nm due to the critical film thickness. Therefore, in the cross-sectional TEM observation of the obtained superconducting film, it was decided to evaluate at the observation site where the film thickness is 350 nm or less.

The boundary cannot be visually identified at a spin coating center of a translucent blue gel film 3Gel-$Pr_{0.00}Y_{1.00}$BCO+$Pr_{0.22}Y_{0.78}$BCO—C obtained by the above method.

The obtained gel film 3Gel-$Pr_{0.00}Y_{1.00}$BCO+$Pr_{0.22}Y_{0.78}$BCO—C was immediately installed in a furnace filled with dry gas, the calcining was performed under a humidified pure oxygen atmosphere at 400° C. or lower with the profile illustrated in FIG. 6, and translucent brown calcining film 3Cal-$Pr_{0.00}Y_{1.00}$BCO+$Pr_{0.22}Y_{0.78}$BCO—C (Example 3, calcined film) was obtained.

In the profile illustrated in FIG. 7, the calcining film 3Cal-$Pr_{0.00}Y_{1.00}$BCO+$Pr_{0.22}Y_{0.78}$BCO—C was fired in 1000 ppm oxygen mixed argon gas at 800° C. and annealed in pure oxygen at 525° C. or lower, and the oxide thin film 3F-$Pr_{0.00}Y_{1.00}$BCO+$Pr_{0.22}Y_{0.78}$BCO—C(Example 3, fired oxide films) was obtained. From the appearance of the oxide thin film 3F-$Pr_{0.00}Y_{1.00}$BCO+$Pr_{0.22}Y_{0.78}$BCO—C, it is not possible to distinguish where the boundary between the two solutions is, but it seems that the $Pr_{0.22}Y_{0.78}$BCO part is a slightly whitish place. Therefore, after confirming by XRD measurement, high-resolution TEM observation in the vicinity was performed.}

Figure 26:
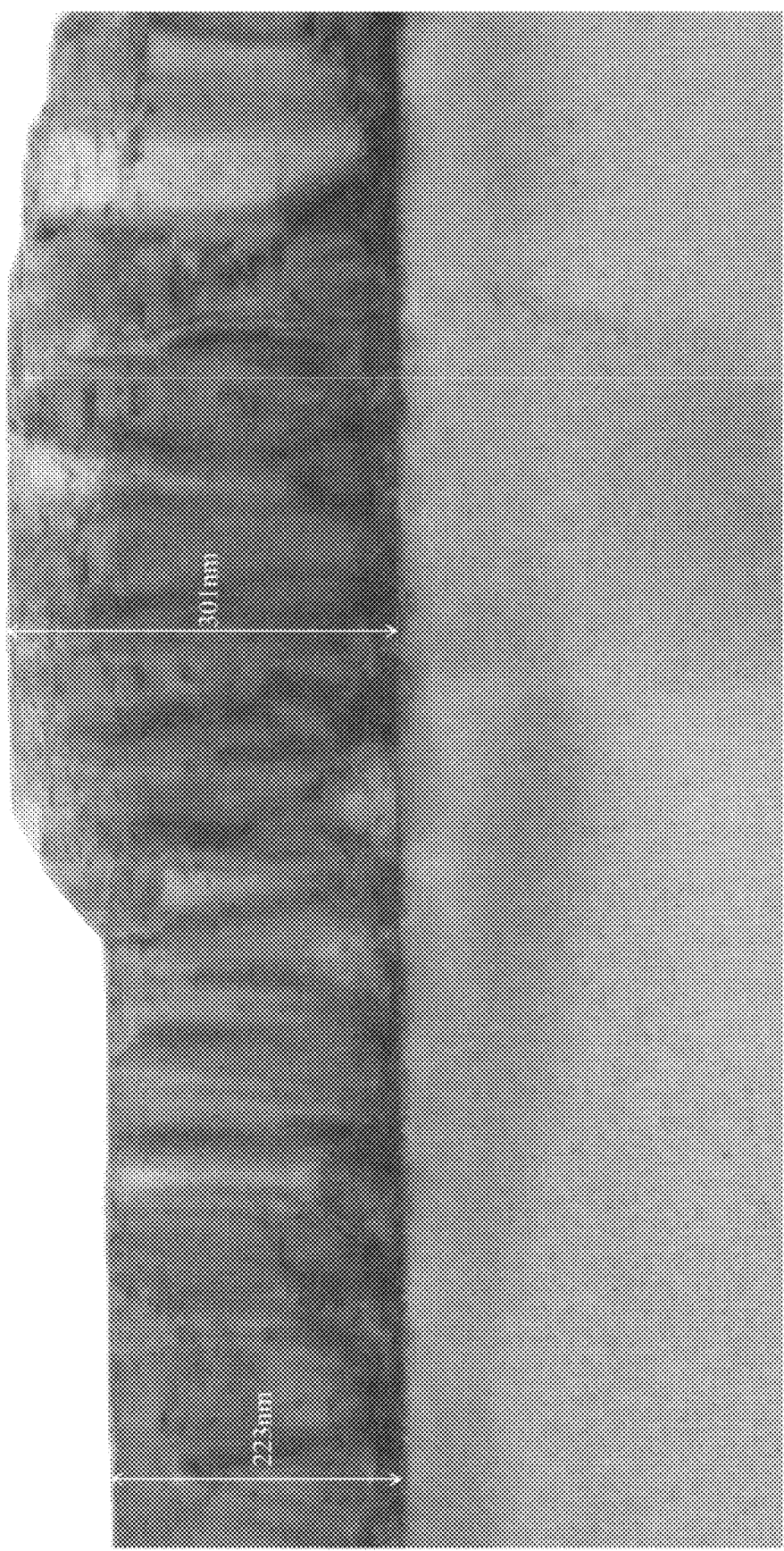
FIG. 26 is a cross-sectional TEM image observed at 200,000 times of Example 3.

FIG. 26 is a cross-sectional TEM image observed at 200,000 times. It is known that since the TFA-MOD method grows in a quasi-liquid phase, it is known that the film thickness is small in the location where the liquid phase is dead, and other locations will be thicker. The film thickness difference depends on the film formation conditions, but it is said to be 70 nm under the film thickness conditions of 800° C.-1000 ppm and humidification 4.2%.

The white area on the lower side of FIG. 26 is the $LaAlO_3$ single crystal substrate, and the region in which a slightly black striped pattern appears is the YBCO conductor. The film thickness of the YBCO superconductor is scaled, the thin portion is 223 nm and the thick portion is 301 nm. From the film thickness difference, it can be seen that the sample was formed almost according to the conditions. Although it is difficult to see from FIG. 26, all the striped patterns run in the direction parallel to the substrate. In other words, it shows that the c axis oriented particles are aligned.

Figure 27:
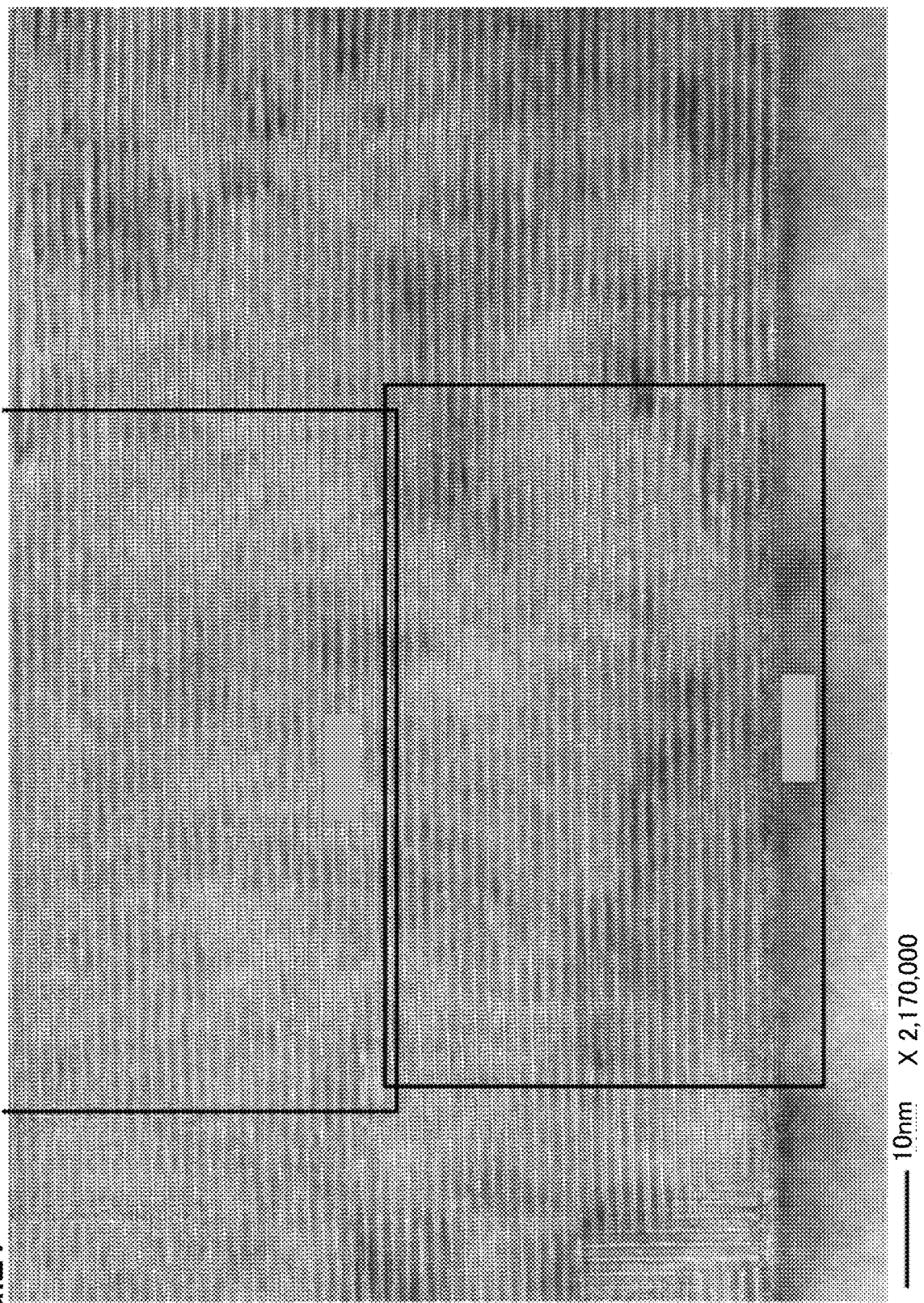
FIG. 27 is a cross-sectional TEM image observed at 2,170,000 times of Example 3.

FIG. 27 illustrates a TEM image in which the boundary between the $LaAlO_3$ single crystal substrate and the YBCO superconductor in FIG. 26 was observed at a high magnification of 2.17 million times. Each element of the $LaAlO_3$ single crystal substrate can be seen at the bottom of the figure, and the region visible in the lateral stripe pattern is the c axis oriented particle of the YBCO superconductor. As can be seen from FIG. 27, c-axis oriented particles are formed on almost the entire surface, and a portion where stripes are slightly connected in the vertical direction can be seen on the left end of the figure, which is the a/b-axis oriented particle.

Once the a/b-axis oriented particles are formed, a wall to block the lateral (superconducting current direction by the c-axis oriented particle) superconducting current to grow faster on the upper side is created, which greatly reduces the superconducting characteristics. However, in this field of view of the sample, the a/b-axis oriented particle exists only from the substrate to the height of 14 unit cells as illustrated in FIG. 27, and it can be seen that the c-axis oriented particle is formed again on the upper portion. Since the lattice length is 1:1:2.94, the a/b axis oriented particle and the c axis oriented particle can form a common lattice structure.

The c-axis oriented particle and the a/b-axis oriented particle that can be observed in FIG. 27 can be separated by a method called polar figure of the XRD measurement. When the polar figure is measured on the YBCO (102) plane, the a/b axis oriented particle is observed near $\psi=56°$, and the c axis oriented particle is observed near $\psi=34°$. An abundance ratio can be quantitatively evaluated from the ratio of the total value and the a/b-axis orientation strength, and the result in FIG. 27 was 1.2%. If the a/b axis orientation ratio is 3% or less, the superconducting characteristics can be obtained almost 100%. This is because the superconducting current can freely bypass the c-axis oriented portion. When the a/b axis orientation ratio is 10%, the characteristics are less than half, and when the a/b axis orientation ratio is 30%, the characteristics are $\frac{1}{100}$ or less which is close to zero.

Figure 28:
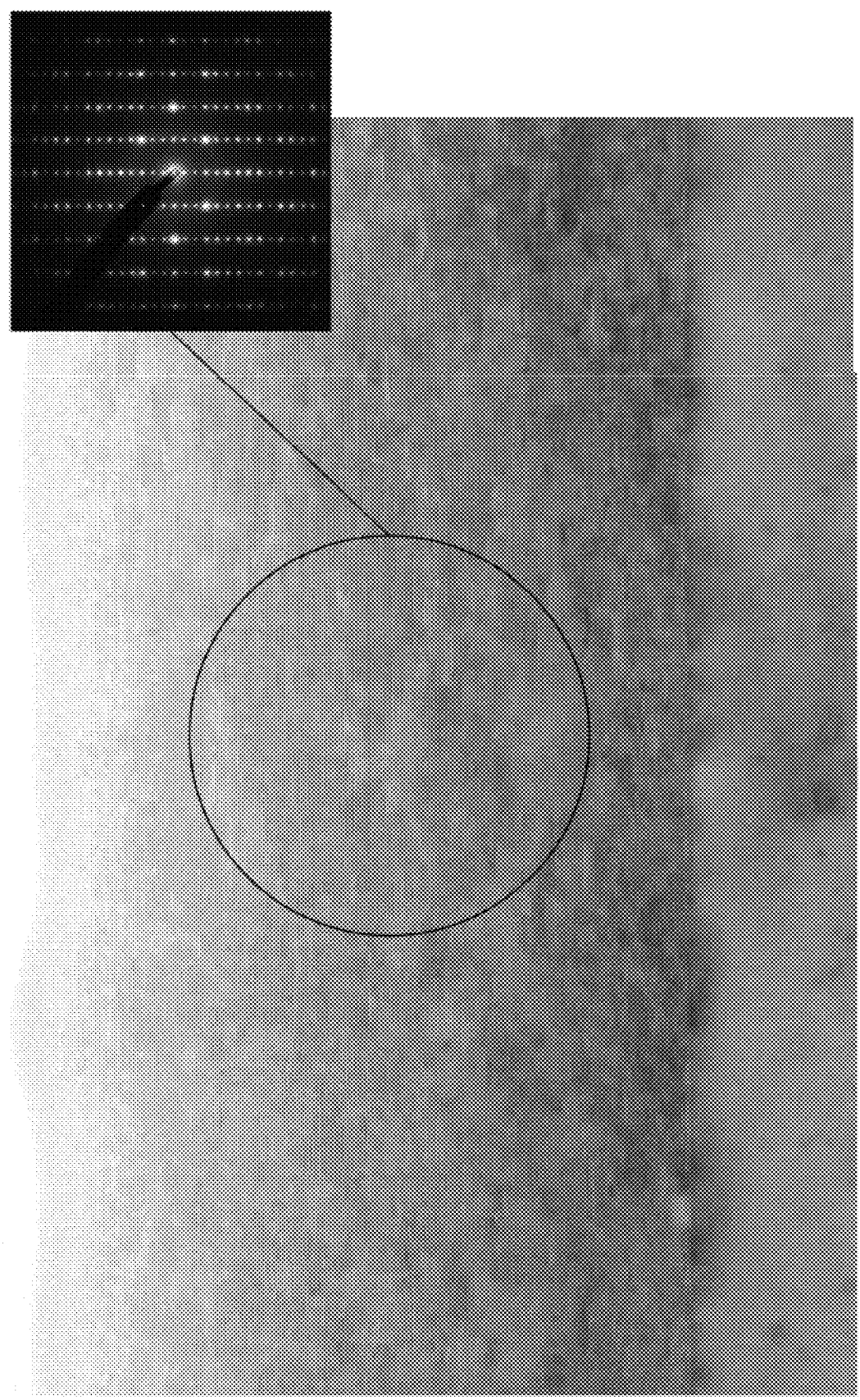
FIG. 28 is a cross-sectional TEM image observed at 520,000 times of Example 3.

FIG. 28 illustrates the results of observing another part of the sample at 520,000 times. The lower portion of FIG. 28 is the LAO single crystal substrate, and the black part of the upper portion is the YBCO superconductor. The lateral stripe indicates c axis oriented particles. The a/b axis oriented particles cannot be observed in this field of view.

In addition, the result in the upper right of the figure illustrating the X-ray opening image also shows that the c axis oriented particle is almost 100%. These observation results showed YBCO on the right side and 22% Pr-substituted YBCO on the left side, but the boundaries were unclear and therefore no formation of the a/b axis oriented particles was observed. In addition, the abundance ratio of the a/b axis oriented particles was only 1.2% from the results of the polar figure. From this, it was found that the method of substituting the Y site with Pr of 20% or more to form the non-superconductor forms the perovskite structure common to the YBCO, and the formation of the a/b axis oriented particles can be suppressed to less than 30%.

In the TFA-MOD method, the a/b axis oriented particles that reduce the superconducting characteristics are thought to be caused by excessive nucleation due to the release of excess unit cells, and in the AC loss reduction structure using voids, the characteristics of superconductors are decrease. In the method for reducing an AC loss by forming a void, the formation of a/b axis oriented particles in the superconductor portion is considered to be 100 μm from the void, and the ratio of a/b axis oriented particles in that portion reaches 30% or more. When the a/b axis oriented particle reaches 30%, the superconducting characteristics become almost zero, but when the a/b axis oriented particle is calculated as $\frac{1}{100}$, in the case of the superconducting wire having a width of 400 μm and a structure that reduces the AC loss by forming voids, the a/b axis oriented particles are formed with a width of 200 μm, and the characteristics are $\frac{1}{100}$, so the overall characteristics of the wire having a width of 400 μm are reduced to 50.5%. Moreover, when the width becomes shorter and becomes 200 μm, the entire surface becomes a/b axis oriented particles, so the characteristic becomes $\frac{1}{100}$.

In the example, the a/b axis oriented particle maintains the normal amount of 1.2% by not forming voids. In addition, it is expected that the a/b axis oriented particles will not be formed even if the non-superconducting region becomes narrower, and it is understood that the structure can realize a large AC loss reduction effect.

Example 4

According to the flowchart illustrated in FIG. 3, three types of coating solutions for superconductors are synthesized and purified. The first coating solution is synthesized and purified first. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

The coating solution was dissolved in ion-exchanged water at a metal ion molar ratio of 0.22:0.78:2:3 and were subjected to the mixing and stirring reactions with an equimolar amount of $CF_3COOH$, and the obtained mixed solution was disposed in an eggplant-shaped flask, and reacted and purified under reduced pressure in a rotary evaporator for 12 hours. A translucent blue substance 4Mi-$Pr_{0.22}Y_{0.78}BCO$ (substance described in Example 4, 22% Pr, 78% Y Material with impurity) was obtained.

According to the flowchart illustrated in FIG. 3, other two types of coating solutions for superconductors are synthesized and purified. Powders of each hydrate of 99% purity of $Ho(OCOCH_3)_3$, 99% purity of $Dy(OCOCH_3)_3$, 99% purity of $Ba(OCOCH_3)_2$, 99% purity of $Cu(OCOCH_3)_2$ in metal acetate were used.

Each hydrate of $Ho(OCOCH_3)_3$, $Ba(OCOCH_3)_2$, and $Cu(OCOCH_3)_2$ was dissolved in ion-exchanged water at a metal ion molar ratio of 1:2:3, each hydrate of $Dy(OCOCH_3)_3$, $Ba(OCOCH_3)_2$, and $Cu(OCOCH_3)_2$ was dissolved in ion-exchanged water at a metal ion molar ratio of 1:2:3, and was mixed and stirred with the reaction equimolar amount of $CF_3COOH$, and the obtained mixed solution was put in an eggplant-shaped flask, and the reaction and purification were carried out under reduced pressure in a rotary evaporator for 12 hours. Translucent blue substances 4Mi-HoBCO and 4Mi-DyBCO were each obtained.

About 7 wt. % of water or acetic acid which is reaction by-products during solution synthesis was contained in the obtained translucent blue substances 4Mi-$Pr_{0.22}Y_{0.78}BCO$, 4Mi-HoBCO, and 4Mi-DyBCO. 20 times by weight of anhydrous methanol was added to translucent blue substances 4Mi-$Pr_{0.22}Y_{0.78}BCO$, 4Mi-HoBCO, and 4Mi-DyBCO and dissolved, and the coating solutions 4CSi—$Pr_{0.22}Y_{0.78}BCO$ (coating solution described in Example 4, 22% Pr, 78% Y Material with impurity), 4CSi—HoBCO, and 4CSi—DyBCO were each obtained.

When the obtained coating solutions 4CSi—$Pr_{0.22}Y_{0.716}BCO$, 4CSi—HoBCO, and 4CSi—DyBCO were reacted and purified again under reduced pressure in a rotary evaporator for 12 hours, translucent blue substances 4M-$Pr_{0.22}Y_{0.78}BCO$ (substance described in Example 4, 22% Pr, 78% Y Material without impurity), 4M-HoBCO, and 4M-DyBCO were each obtained.

Translucent blue substances 4M-$Pr_{0.22}Y_{0.78}BCO$, 4M-HoBCO, and 4M-DyBCO were dissolved in methanol (j in FIG. 3) and diluted using a volumetric flask, and each of the coating solutions 4CS—$Pr_{0.22}Y_{0.78}BCO$ (Example 4, coating solution for 22% Pr, 78% Y perovskite structure), 4CS—HoBCO, and 4CS—DyBCO of 1.50 mol/l in terms of metal ions was obtained.

Coating solutions 4CS—$Pr_{0.22}Y_{0.78}BCO$ and 4CS—HoBCO were used, a coating solution 4CS—$Pr_{0.22}Y_{0.78}BCO$ was dropped to one side on a 10 mm×30 mm×0.50 mmt $LaAlO_3$ (100) oriented single crystal substrate during the film formation by the spin coating method, a coating solution 4CS—HoBCO was dropped to the other side, the spin coating was started at the moment the center is mixed, and a translucent blue gel film 4Gel-$Pr_{0.22}Y_{0.78}$ BCO+HoBCO-C (Example 4, gel film of resulting $Pr_{0.22}Y_{0.78}$ BCO film and HoBCO film, chimera) was obtained. The film formation conditions are an acceleration of 10000 rpm/s, a maximum rotation speed of 2000 rpm, and a holding time of 60 s.

Similarly, coating solutions 4CS—$Pr_{0.22}Y_{0.78}BCO$ and 4CS—DyBCO were used, a coating solution 4CS—$Pr_{0.22}Y_{0.78}BCO$ was dropped to one side on a 10 mm×30 mm×0.50 mmt $LaAlO_3$ (100) oriented single crystal substrate during the film formation by the spin coating method, a coating solution 4CS—DyBCO was dropped to the other side, the spin coating was started at the moment the center is mixed, and a translucent blue gel film 4Gel-$Pr_{0.22}Y_{0.78}BCO$+DyBCO-C was obtained. The film formation conditions are an acceleration of 10000 rpm/s, a maximum rotation speed of 2000 rpm, and a holding time of 60 s.

The boundary of the spin coat centers of the translucent blue gel films 4Gel-$Pr_{0.22}Y_{0.78}BCO$+HoBCO-C and 4Gel-$Pr_{0.22}Y_{0.78}BCO$+DyBCO-C obtained by the above method cannot be visually identified.

The obtained gel films 4Gel-$Pr_{0.22}Y_{0.76}BCO$+HoBCO-C and 4Gel-$Pr_{0.22}Y_{0.70}BCO$+DyBCO-C were immediately installed in a furnace filled with dry gas, the calcining was performed under a humidified pure oxygen atmosphere at 400° C. or lower with the profile illustrated in FIG. 6, and translucent brown calcining films 4Cal-$Pr_{0.22}Y_{0.78}BCO$+HoBCO-C (Example 4, calcined film) and 4Cal-$Pr_{0.22}Y_{0.78}BCO$+DyBCO-C were obtained In the profile illustrated in FIG. 7, the calcining films 4Cal-$Pr_{0.22}Y_{0.78}BCO$+HoBCO-C and 4Cal-$Pr_{0.22}Y_{0.78}BCO$+DyBCO-C were fired in 1000 ppm oxygen mixed argon gas at 800° C. and annealed in pure oxygen at 525° C. or lower, and the oxide thin film 4F-$Pr_{0.22}Y_{0.78}BCO$+HoBCO-C (Example 4, fired oxide films) and 4F-$Pr_{0.22}Y_{0.78}BCO$+DyBCO-C were obtained. From the appearance of the oxide thin films 4F-$Pr_{0.22}Y_{0.78}BCO$+HoBCO-C and 4F-$Pr_{0.22}Y_{0.78}BCO$+DyBCO-C, it is not possible to distinguish where the boundary between the two solutions is, but since the $Pr_{0.22}Y_{0.78}BCO$ part seems to be a slightly whitish place, the change in the (006) peak position was investigated by the XRD measurement.

Angle 2θ difference Δ2θ(006){$Pr_{0.22}Y_{0.78}BCO$ (006)-HoBCO (006)} between $Pr_{0.22}Y_{0.78}BCO$ and HoBCO (006) peaks including the influence of LAO substrate in an oxide thin film 4F-$Pr_{0.22}Y_{0.78}BCO$+HoBCO-C was investigated, which was 0.034°. Similarly, angle 2θ difference Δ2θ(006) {$Pr_{0.22}Y_{0.78}BCO$ (006)-DyBCO (006)} between $Pr_{0.22}Y_{0.78}BCO$ and DyBCO (006) peaks including the influence of LAO substrate in an oxide thin film 4F-$Pr_{0.22}Y_{0.78}$ BCO+DyBCO-C was investigated, which was 0.036°.

This result illustrates that even if HoBCO or DyBCO is used instead of YBCO, the common perovskite structure is formed in the same way, which is far more than 0.15°, which corresponds to the difference in the lattice length between YBCO and SmBCO. It can also be seen that if a rare earth element that also exhibits superconductivity forms a common perovskite structure in the same way.

In the oxide thin films 4F-$Pr_{0.22}Y_{0.78}BCO$+HoBCO-C and 4F-$Pr_{0.22}Y_{0.78}BCO$+DyBCO-C, the center, which is considered to be the boundary, was obtained by using the (102) plane by the XRD polar figure method, and the ratio of the a/b-axis oriented particles was investigated by using the intensity ratio. The results showed that the ratio of the a/b-axis oriented particles of the oxide thin film 4F-$Pr_{0.22}Y_{0.78}BCO$+HoBCO-C was 1.5%, and the ratio of the a/b-axis oriented particle of 4F-$Pr_{0.22}Y_{0.78}BCO$+DyBCO-C was 1.6%.

The level of the a/b-axis oriented particles is a level that is always formed on the LAO substrate and does not affect the superconducting characteristics. From the past analysis, if the ratio of the a/b-axis oriented particles is 3% or less, there is no effect on the characteristics. From this experimental result, even if HoBCO or DyBCO is used instead of YBCO, similarly, a quasi-liquid phase is formed to form a perovskite structure, and it is considered to be a result showing that an AC loss reduction structure can be obtained while suppressing the formation of the a/b-axis oriented particles.

Example 5

According to the flowchart illustrated in FIG. 3, three types of coating solutions for superconductors are synthesized and purified. The first coating solution is synthesized and purified first. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

The coating solution was dissolved in ion-exchanged water at a metal ion molar ratio of 0.22:0.78:2:3 and were subjected to the mixing and stirring reactions with an equimolar amount of $CF_3COOH$, and the obtained mixed solution was disposed in an eggplant-shaped flask, and reacted and purified under reduced pressure in a rotary evaporator for 12 hours. A translucent blue substance 5Mi-$Pr_{0.22}Y_{0.70}BCO$ (substance described in Example 5, 22% Pr, 78% Y Material with impurity) was obtained.

According to the flowchart illustrated in FIG. 3, coating solutions for a second superconductor are synthesized and purified. Powders of each hydrate of 99% purity of $Pr(OCOCH_3)_3$, 99% purity of $Sm(OCOCH_3)_3$, 99% purity of $Y(OCOCH_3)_3$, 99% purity of $Tm(OCOCH_3)_3$, 99% purity of $Ba(OCOCH_3)_2$, 99% purity of $Cu(OCOCH_3)_2$ in metal acetate were used.

Each hydrate of $Pr(OCOCH_3)_3$, $Sm(OCOCH_3)_3$, $Y(OCOCH_3)_3$, $Tm(OCOCH_3)_3$, $Ba(OCOCH_3)_2$, and $Cu(OCOCH_3)_2$ was dissolved in ion-exchanged water at a metal ion molar ratio of 0.02:0.02:0.92:0.04:2:3, each hydrate of $Pr(OCOCH_3)_3$, $Sm(OCOCH_3)_3$, $Y(OCOCH_3)_3$, $Er(OCOCH_3)_3$, $Ba(OCOCH_3)_2$, and $Cu(OCOCH_3)_2$ was dissolved in ion-exchanged water at a metal ion molar ratio of 1:2:3, and was mixed and stirred with the reaction equimolar amount of $CF_3COOH$, and the obtained mixed solution was put in an eggplant-shaped flask, and the reaction and purification were carried out under reduced pressure in a rotary evaporator for 12 hours. Translucent blue substances 5Mi-$Pr_{0.02}Sm_{0.02}Y_{0.92}Tm_{0.04}Ba_2Cu_3O_{7-x}$ and 5Mi-$Pr_{0.02}Sm_{0.02}Y_{0.92}Er_{0.04}Ba_2Cu_3O_{7-x}$ were each obtained.

About 7 wt. % of water or acetic acid which is reaction by-products during solution synthesis was contained in the obtained translucent blue substances 5Mi-$Pr_{0.22}Y_{0.78}$ BCO, 5Mi-$Pr_{0.02}Sm_{0.02}Y_{0.92}Tm_{0.04}Ba_2Cu_3O_{7-x}$, and 5Mi-$Pr_{0.02}Sm_{0.02}Y_{0.92}Er_{0.04}Ba_2Cu_3O_{7-x}$. 20 times by weight of anhydrous methanol was added to translucent blue substances 5Mi-$Pr_{0.22}Y_{0.78}$BCO, 5Mi-$Pr_{0.02}Sm_{0.02}Y_{0.92}Tm_{0.04}Ba_2Cu_3O_{7-x}$, and 5Mi-$Pr_{0.02}Sm_{0.02}Y_{0.92}Er_{0.04}Ba_2Cu_3O_{7-x}$ and dissolved, and the coating solutions 5CSi—$Pr_{0.22}Y_{0.78}$BCO (coating solution described in Example 5, 22% Pr, 78% Y Material with impurity), 5CSi—$Pr_{0.02}Sm_{0.02}Y_{0.92}Tm_{0.04}Ba_2Cu_3O_{7-x}$, and 5CSi—$Pr_{0.02}Sm_{0.02}Y_{0.92}Er_{0.04}Ba_2Cu_3O_{7-x}$ were each obtained.

When the obtained coating solutions 5CSi—$Pr_{0.22}Y_{0.78}$BCO, 5CSi—$Pr_{0.02}Sm_{0.02}Y_{0.92}Tm_{0.04}Ba_2Cu_3O_{7-x}$, and 5CSi-$Pr_{0.02}Sm_{0.02}Y_{0.92}Er_{0.04}Ba_2Cu_3O_{7-x}$ were reacted and purified again under reduced pressure in a rotary evaporator for 12 hours, translucent blue substances 5M-$Pr_{0.22}Y_{0.70}$BCO (substance described in Example 5, 22% Pr, 78% Y Material without impurity), 5Mi-$Pr_{0.02}Sm_{0.02}Y_{0.92}Tm_{0.4}Ba_2Cu_3O_{7-x}$, and 5Mi-$Pr_{0.02}Sm_{0.02}Y_{0.92}Er_{0.04}Ba_2Cu_3O_{7-x}$ were each obtained.

Translucent blue substances 5M-$Pr_{0.22}Y_{0.78}$BCO, 5Mi-$Pr_{0.02}Sm_{0.02}Y_{0.92}Tm_{0.04}Ba_2Cu_3O_{7-x}$, and 5Mi-$Pr_{0.02}Sm_{0.02}Y_{0.92}Er_{0.04}Ba_2Cu_3O_{7-x}$ were dissolved in methanol (j in FIG. 3) and diluted using a volumetric flask, and each of the coating solutions 5CS—$Pr_{0.22}Y_{0.78}$BCO (Example 5, coating Solution for 22% Pr, 78% Y perovskite structure), 5CS—$Pr_{0.02}Sm_{0.02}Y_{0.92}Tm_{0.04}Ba_2Cu_3O_{7-x}$, and 5CS—$Pr_{0.02}Sm_{0.02}Y_{0.92}Er_{0.04}Ba_2Cu_3O_{7-x}$ of 1.50 mol/l in terms of metal ions was obtained.

Coating solutions 5CS—$Pr_{0.22}Y_{0.78}$BCO, and 5CS—$Pr_{0.02}Sm_{0.02}Y_{0.92}Tm_{0.04}Ba_2Cu_3O_{7-x}$ were used, a coating solution 5CS—$Pr_{0.22}Y_{0.78}$BCO was dropped to one side on a 10 mm×30 mm×0.50 mmt $LaAlO_3$ (100) oriented single crystal substrate during the film formation by the spin coating method, a coating solution 5CS—$Pr_{0.02}Sm_{0.02}Y_{0.92}Tm_{0.04}Ba_2Cu_3O_{7-x}$ was dropped to the other side, the spin coating was started at the moment the center is mixed, and a translucent blue gel film 5Gel-$Pr_{0.22}Y_{0.78}$BCO+$Pr_{0.02}Sm_{0.02}Y_{0.92}Tm_{0.04}Ba_2Cu_3O_{7-x}$—C (Example 5, gel film of resulting $Pr_{0.22}Y_{0.78}$BCO film and $Pr_{0.02}Sm_{0.02}Y_{0.92}Tm_{0.04}Ba_2Cu_3O_{7-x}$ film, chimera) was obtained. The film formation conditions are an acceleration of 10000 rpm/s, a maximum rotation speed of 2000 rpm, and a holding time of 60 s.

Coating solutions 5CS—$Pr_{0.22}Y_{0.78}$BCO and 5CS—$Pr_{0.02}Sm_{0.02}Y_{0.92}Er_{0.04}Ba_2Cu_3O_{7-x}$ were used, a coating solution 5CS—$Pr_{0.22}Y_{0.76}$BCO was dropped to one side on a 10 mm×30 mm×0.50 mmt $LaAlO_3$ (100) oriented single crystal substrate during the film formation by the spin coating method, a coating solution 5CS—$Pr_{0.02}Sm_{0.02}Y_{0.92}Er_{0.04}Ba_2Cu_3O_{7-x}$ was dropped to the other side, the spin coating was started at the moment the center is mixed, and a translucent blue gel film 5Gel-$Pr_{0.22}Y_{0.78}$BCO+$Pr_{0.02}Sm_{0.02}Y_{0.92}Er_{0.04}Ba_2Cu_3O_{7-x}$—C was obtained. The film formation conditions are an acceleration of 10000 rpm/s, a maximum rotation speed of 2000 rpm, and a holding time of 60 s.

The boundary of the spin coat centers of the translucent blue gel films 5Gel-$Pr_{0.22}Y_{0.78}$BCO+$Pr_{0.02}Sm_{0.02}Y_{0.92}Tm_{0.04}Ba_2Cu_3O_{7-x}$—C, and 5Gel-$Pr_{0.22}Y_{0.78}$BCO+$Pr_{0.02}Sm_{0.02}Y_{0.92}Er_{0.04}Ba_2Cu_3O_{7-x}$—C obtained by the above method cannot be visually identified.

The obtained gel films 5Gel-$Pr_{0.22}Y_{0.78}$ BCO+$Pr_{0.02}Sm_{0.02}Y_{0.92}Tm_{0.04}Ba_2Cu_3O_{7-x}$—C, and 5Gel-$Pr_{0.22}Y_{0.78}$BCO+$Pr_{0.02}Sm_{0.02}Y_{0.92}Er_{0.04}Ba_2Cu_3O_{7-x}$—C were immediately installed in a furnace filled with dry gas, the calcining was performed under a humidified pure oxygen atmosphere at 400° C. or lower with the profile illustrated in FIG. 6, and translucent brown calcining films 5Cal-$Pr_{0.22}Y_{0.78}$BCO+$Pr_{0.02}Sm_{0.02}Y_{0.92}Tm_{0.04}Ba_2Cu_3O_{7-x}$—C (Example 5, calcined film), and 5Cal-$Pr_{0.22}Y_{0.78}$ BCO+$Pr_{0.02}Sm_{0.02}Y_{0.92}Er_{0.04}Ba_2Cu_3O_{7-x}$—C were obtained In the profile illustrated in FIG. 7, the calcining films 5Cal-$Pr_{0.22}Y_{0.78}$ BCO+$Pr_{0.02}Sm_{0.02}Y_{0.92}Tm_{0.04}Ba_2Cu_3O_{7-x}$—C, and 5Cal-$Pr_{0.22}Y_{0.78}$BCO+$Pr_{0.02}Sm_{0.2}Y_{0.92}Er_{0.4}Ba_2Cu_3O_{7-x}$—C were fired in 1000 ppm oxygen mixed argon gas at 800° C. and annealed in pure oxygen at 525° C. or lower, and oxide thin films 5F-$Pr_{0.22}Y_{0.78}$BCO+$Pr_{0.02}Sm_{0.02}Y_{0.92}Tm_{0.04}Ba_2Cu_3O_{7-x}$—C(Example 5, fired oxide films) and 5F-$Pr_{0.22}Y_{0.78}$BCO+$Pr_{0.02}Sm_{0.02}Y_{0.92}Er_{0.04}Ba_2Cu_3O_{7-x}$—C were obtained. From the appearance of the oxide thin films 5F-$Pr_{0.22}Y_{0.70}$BCO+$Pr_{0.2}Sm_{0.2}Y_{0.92}Tm_{0.04}Ba_2Cu_3O_{7-x}$—C and 5F-$Pr_{0.22}Y_{0.78}$BCO+$Pr_{0.02}Sm_{0.02}Y_{0.92}Er_{0.04}Ba_2Cu_3O_{7-x}$—C, it is not possible to distinguish where the boundary between the two solutions is, but since the $Pr_{0.22}Y_{0.78}$ BCO part seems to be a slightly whitish place, the change in the (006) peak position was investigated by the XRD measurement.

Angle 2θ difference Δ2θ(006){$Pr_{0.22}Y_{0.78}$BCO (006)-HoBCO (006)} between $Pr_{0.22}Y_{0.78}$BCO and $Pr_{0.02}Sm_{0.02}Y_{0.92}Tm_{0.04}Ba_2Cu_3O_{7-x}$ (006) peaks including the influence of LAO substrate in an oxide thin film 5F-$Pr_{0.22}Y_{0.78}$BCO+$Pr_{0.02}Sm_{0.02}Y_{0.92}Tm_{0.04}Ba_2Cu_3O_{7-x}$—C was investigated, which was 0.032°. Similarly, angle 2θ difference Δ2θ (006) {$Pr_{0.22}Y_{0.78}$BCO (006)—DyBCO (006)} between $Pr_{0.22}Y_{0.78}$BCO and $Pr_{0.02}Sm_{0.02}Y_{0.92}Er_{0.04}Ba_2Cu_3O_{7-x}$(006) peaks including the influence of LAO substrate in an oxide thin film 5F-$Pr_{0.22}Y_{0.78}$BCO+$Pr_{0.02}Sm_{0.02}Y_{0.92}Er_{0.04}Ba_2Cu_3O_{7-x}$—C was investigated, which was 0.032°.

This result showed that even if $Pr_{0.02}Sm_{0.02}Y_{0.92}Tm_{0.04}Ba_2Cu_3O_{7-x}$ or $Pr_{0.02}Sm_{0.02}Y_{0.92}Er_{0.04}Ba_2Cu_3O_{7-x}$ is used instead of YBCO, a common perovskite structure is formed in the same way. As a result, it can also be seen that if a rare earth element that also exhibits superconductivity forms a common perovskite structure in the same way.

In the oxide thin films 5F-$Pr_{0.22}Y_{0.78}$BCO+$Pr_{0.02}Sm_{0.02}Y_{0.92}Tm_{0.04}Ba_2Cu_3O_{7-x}$—C and 5F-$Pr_{0.22}Y_{0.78}$BCO+$Pr_{0.02}Sm_{0.02}Y_{0.92}Er_{0.04}Ba_2Cu_3O_{7-x}$—

C, the center, which is considered to be the boundary, was obtained by using the (102) plane by the XRD polar figure method, and the ratio of the a/b-axis oriented particles was investigated by using the intensity ratio. The results showed that the ratio of the a/b-axis oriented particles of the oxide thin film 5F-$Pr_{0.22}Y_{0.78}$BCO+$Pr_{0.02}Sm_{0.02}Y_{0.92}Tm_{0.04}Ba_2Cu_3O_{7-x}$—C was 1.7%, and the ratio of the a/b-axis oriented particle of 5F-$Pr_{0.22}Y_{0.78}$BCO+$Pr_{0.02}Sm_{0.02}Y_{0.92}Er_{0.04}Ba_2Cu_3O_{7-x}$—C was 1.8%.

The level of the a/b-axis oriented particles is a level that is always formed on the LAO substrate and does not affect the superconducting characteristics. From the past analysis, if the ratio of the a/b-axis oriented particles is 3% or less, there is no effect on the characteristics. From this experimental result, even if $Pr_{0.02}Sm_{0.02}Y_{0.92}Tm_{0.04}Ba_2Cu_3O_{7-x}$—C or $Pr_{0.02}Sm_{0.02}Y_{0.92}Er_{0.04}Ba_2Cu_3O_{7-x}$ is used instead of YBCO, similarly, a quasi-liquid phase is formed to form a perovskite structure, and it is considered to be a result showing that an AC loss reduction structure can be obtained while suppressing the formation of the a/b-axis oriented particles.

It seems that the AC loss reduction technology is mostly used in the environment where the superconducting current is changed. In that case, it is preferable that the artificial pin that reduces the influence of the magnetic field exists in the superconducting region. A method such as a clustered atomically substituted artificial pin (CARP) (Japanese Patent No. 6374365, T. Araki, et. Al. Supercond. Sci. Technol. 31 (2018) 065008 (8pp)), which is spontaneously created rather than a method for injecting foreign objects from the outside such as $BaZrO_3$ is considered to be more advantageous for the manufacturing of superconducting films.

The difference between the elements of YBCO and CARP is that CARP is the one that substitutes only 8% of the Y site which occupies only ⅙. Although there is contraction due to a change in a valence of Pr, the change in the lattice length is not much different from that of the original YBCO, the common perovskite structure is formed as shown by the experimental results, and the formation of the a/b-axis oriented particles seems to be suppressed due to the AC loss reduction structure that does not form voids.

Example 6

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 6Mi-$Pr_{0.00}Y_{1.00}$BCO (substance described in Example 6, 0% Pr, 100% Y Material with impurity) and 6Mi-$Pr_{0.22}Y_{0.78}$BCO were obtained.

About 7 wt. % of water or acetic acid which is reaction by-products during solution synthesis was contained in the obtained translucent blue substances 6Mi-$Pr_{0.00}Y_{1.00}$BCO and 6Mi-$Pr_{0.22}Y_{0.78}$BCO. 20 times by weight of anhydrous methanol was added to translucent blue substances 6Mi-$Pr_{0.00}Y_{1.00}$BCO and 6Mi-$Pr_{0.22}Y_{0.78}$BCO and dissolved, and the coating solutions 6CSi—$Pr_{0.00}Y_{1.00}$BCO (coating solution described in Example 6, 0% Pr, 100% Y Material with impurity), and 6CSi—$Pr_{0.22}Y_{0.78}$BCO were each obtained.

When the obtained coating solutions 6CSi—$Pr_{0.00}Y_{1.00}$BCO and 6CSi—$Pr_{0.22}Y_{0.78}$BCO were reacted and purified again under reduced pressure in a rotary evaporator for 12 hours, translucent blue substances 6M-$Pr_{0.00}Y_{1.00}$BCO (substance described in Example 6, 0% Pr, 100% Y Material without impurity) and 6M-$Pr_{0.22}Y_{0.78}$BCO were each obtained.

Translucent blue substance 6M-$Pr_{0.00}Y_{1.00}$BCO and 6M-$Pr_{0.22}Y_{0.78}$BCO were dissolved in methanol (j in FIG. 3) and diluted using a volumetric flask, and each of the coating solutions 6CS—$Pr_{0.00}Y_{1.00}$BCO (Example 6, coating solution for 0% Pr, 100% Y perovskite structure) and 6CS—$Pr_{0.22}Y_{0.78}$BCO of 1.50 mol/l in terms of metal ions was obtained.

The film formation is performed using the coating solutions 6CS—$Pr_{0.00}Y_{1.00}$BCO and 6CS—$Pr_{0.22}Y_{0.78}$BCO in the equipment illustrated in FIG. 5. In the container that does not react with the coating solution, liquid outlets having a width of 100 μm and a width of 400 μm are arranged to be 4 mm wide, and are installed at a position where the meniscus part is formed with respect to the substrate with the same height.

As a substrate on which a film is formed, a substrate in which a surface of a Ni—W substrate is aligned and three layers of a $Y_2O_3$ layer, a YSZ layer, and a $CeO_2$ layer are formed is prepared. When a coating solution with a metal ion concentration of 1.52 mol/L is used by keeping a distance between a film forming part and a substrate constant and being pulled at a speed of 180 mm/s in a wire moving direction, a gel film having a thickness of 12 μm illustrated in FIG. 8 is formed. The gel film is made by continuous film formation, and for example, a gel film having a length of 50 m is made.

Since liquids are mixed immediately after the start of the film formation, a portion of about 5 cm is a solute in which the non-superconducting region is mixed from superconductivity, and therefore it is considered that a concentration of Pr decreases and a layer showing a superconductor is formed after the firing. The portion is removed after the firing, and as a result, it seems that each superconducting region, which is divided by non-superconductivity, maintains insulation.

The gel film formed in the form of a tape with a length of 50 m is subsequently put in a continuous furnace, and Trifluoroacetic acid salt is decomposed to form a calcining film made of fluoride oxide. At that time, the calcining profile can be one illustrated in FIG. 6, but one optimized to shorten the calcining time is used. The calcining film has a film thickness of about 2.4 μm.

The calcining film formed on a wire having a length of 50 m is fired at a temperature of 750 to 800° C. in a continuous firing furnace, and becomes a superconductor since the number of oxygen changes from 6 to 6.93 by continuous oxygen annealing. The obtained thickness of the superconducting film is 1.2 μm. However, when the thickness of the superconducting film is 0.3 μm or more, the substance decomposes during calcining, stress is generated, and cracks are likely to occur. In that case, it is preferable to use a crack prevention technology by applying once and thickening the film.

In the superconducting region and the non-superconducting region obtained by this method, a maximum diffusion of substance as discussed above is 1 to 2 μm. Therefore, the non-superconducting region is a non-superconducting region having a width of at least 6 µm, and the AC loss reduction structure is realized.

At the same time, since no void portion is formed by this method, the ratio of the a/b-axis oriented particles in the superconducting layer can be suppressed to 30% or less. Most of the a/b-axis oriented particles in the superconducting layer are expected to be 3% or less. In addition, the $CeO_2$ intermediate layer is also known as an intermediate layer in which it is difficult to form the a/b-axis oriented particles on the $CeO_2$ intermediate layer. It is said that it is difficult to form the a/b-axis oriented particles that grow sideways by rotating 45° in the in-plane direction. However, if voids are formed and unit cells are supplied 100 times more than usual, it seems that not only the a/b-axis oriented particles but also various heterogeneous phases are formed and the characteristics deteriorate.

Example 7

According to the flowchart illustrated in FIG. 3, two types of coating solutions for superconductors are synthesized and purified. Powders of each hydrate of 99% purity of $Pr(OCOCH_3)_3$, 99% purity of $Y(OCOCH_3)_3$, 99% purity of $Ba(OCOCH_3)_2$, and 99% purity of $Cu(OCOCH_3)_2$ in metal acetate were used.

These coating solutions were dissolved in ion-exchanged water at a metal ion molar ratio of 0.00:1.00:2:3 and 0.22:0.78:2:3 and were mixed and stirred with a reaction equimolar amount of $CF_3COOH$, and the obtained mixed solution was put in an eggplant-shaped flask, and reacted and purified under reduced pressure in a rotary evaporator for 12 hours. Translucent blue substances 7Mi-$Pr_{0.00}Y_{1.00}BCO$ (substance described in Example 7, 0% Pr, 100% Y Material with impurity) and 7Mi-$Pr_{0.22}Y_{0.78}BCO$ were obtained.

About 7 wt. % of water or acetic acid which is reaction by-products during solution synthesis was contained in the obtained translucent blue substances 7Mi-$Pr_{0.00}Y_{1.00}BCO$ and 7Mi-$Pr_{0.22}Y_{0.78}BCO$. 20 times by weight of anhydrous methanol was added to translucent blue substances 7Mi-$Pr_{0.00}Y_{1.00}BCO$ and 7Mi-$Pr_{0.22}Y_{0.78}BCO$ and dissolved, and the coating solutions 7CSi—$Pr_{0.00}Y_{1.00}BCO$ (coating solution described in Example 7, 0% Pr, 100% Y Material with impurity) and 7CSi—$Pr_{0.22}Y_{0.78}BCO$ were each obtained.

When the obtained coating solutions 7CSi—$Pr_{0.00}Y_{1.00}BCO$ and 7CSi—$Pr_{0.22}Y_{0.78}BCO$ were reacted and purified again under reduced pressure in a rotary evaporator for 12 hours, translucent blue substances 7M-$Pr_{0.00}Y_{1.00}BCO$ (substance described in Example 7, 0% Pr, 100% Y Material without impurity) and 7M-$Pr_{0.22}Y_{0.78}BCO$ were each obtained.

Translucent blue substances 7M-$Pr_{0.00}Y_{1.00}BCO$ and 7M-$Pr_{0.22}Y_{0.78}BCO$ were dissolved in methanol (j in FIG. 3) and diluted using a volumetric flask, and each of the coating solutions 7CS—$Pr_{0.00}Y_{1.00}BCO$ (Example 7, coating solution for 0% Pr, 100% Y perovskite structure) and 7CS—$Pr_{0.22}Y_{0.78}BCO$ of 1.50 mol/l in terms of metal ions was obtained.

The coating solutions 7CS—$Pr_{0.00}Y_{1.00}BCO$ and 7CS—$Pr_{0.22}Y_{0.78}BCO$ are a corrosion-resistant substance, and are formed on a metal substrate. The metal substrate is, for example, Ni—W, and a $Y_2O_3$ layer, a YSZ layer, and a $CeO_2$ layer are formed on the metal substrate. The metal substrate used is one of which surface is aligned by repeating rolling and annealing.

For the film formation by the inkjet method, heads that can all inject droplets of 1 µm are used, four heads filled with a coating solution 7CS—$Pr_{0.00}Y_{1.00}BCO$ are arranged, and one of the heads is arranged with a coating solution 7CS—$Pr_{0.22}Y_{0.78}BCO$. This is repeatedly installed by a predetermined number to form, for example, a wire having a width of 4 mm.

With the above method, the AC loss reduction can be expected to be up to 1/100 of the conventional method, but if the AC loss reduction is 1/10, for example, the film formation is performed by methods such as five droplets of 10 µm or five droplets of 2 µm. However, here, the conversation proceeds on the premise that droplets of 1 µm are formed.

Droplets are formed by simultaneously injecting two types of coating solutions, but if the droplets are controlled, simultaneous film formation is not necessary. However, in the droplets of 1 µm, the region where the coating solutions 7CS—$Pr_{0.00}Y_{1.00}BCO$ and 7CS—$Pr_{0.22}Y_{0.78}BCO$ are mixed is controlled to 0.1 µm, which is 1/10. The important point of this technique is that voids are not created and then the a/b-axis oriented particles are not formed.

In this way, forming a gel film for $Pr_{0.22}Y_{0.78}BCO$ having a width of 1 µm and a gel film for $Pr_{0.00}Y_{1.00}BCO$ having a width of 4 µm 800 times is a wire having a width of 4 mm. For this gel film, the calcining film can be obtained by using the calcining profile illustrated in FIG. 6 or a profile optimized to complete the reaction in a short time. For example, the calcining film can be formed on a wire having a width of 50 m.

The 50 m long calcining film wire obtained as described above is fired as illustrated in FIG. 7 in a continuous furnace and subjected to pure oxygen annealing, so a stripe structure in which superconductor $Pr_{0.00}Y_{1.00}BCO$ is a width of 4 µm and superconductor $Pr_{0.22}Y_{0.78}$ BCO is a width of 1 µm is completed. Since a superconducting area is 80% of the original area, the superconductor obtains only 80% of the superconducting current, but since the superconductor has a structure in which 800 wires are thinned in a width of 4 mm, the wire is 640 times more effective than before by the reduction in the AC loss.

Almost no a/b-axis oriented particles occur in the superconducting region created by this technology. This is because the reaction of the normal TFA-MOD method occurs because the non-superconducting region does not have voids, and a large number of unit cells are not partially formed.

While certain embodiments have been described, these embodiments have been presented by way of example only, and are not intended to limit the scope of the inventions. Indeed, an oxide superconductor and a manufacturing method thereof described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. An oxide superconductor, comprising:
    an oxide superconducting layer including
        a first superconducting region containing barium (Ba), copper (Cu), and at least one first rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the first superconducting region having a continuous perovskite structure, and the first superconducting region extending in a first direction, a second superconducting region containing barium (Ba), copper (Cu), and at least one second rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), the second superconducting region having a continuous perovskite structure, and the second superconducting region extending in the first direction, and a non-superconducting region disposed between the first superconducting region and the second superconducting region, the non-superconducting region being in contact with the first superconducting region and the second superconducting region, the non-superconducting region containing praseodymium (Pr), barium (Ba), copper (Cu), and at least one third rare earth element selected from the group consisting of yttrium (Y), lanthanum (La), neodymium (Nd), samarium (Sm), europium (Eu), gadolinium (Gd), dysprosium (Dy), holmium (Ho), erbium (Er), thulium (Tm), ytterbium (Yb), and lutetium (Lu), a ratio of a number of atoms of the praseodymium (Pr) to a sum of a number of atoms of the at least one third rare earth element and the number of atoms of the praseodymium (Pr) in the non-superconducting region being equal to or more than 20%, the non-superconducting region having a continuous perovskite structure continuous with the continuous perovskite structure of the first superconducting region and the continuous perovskite structure of the second superconducting region, and the non-superconducting region extending in the first direction.

2. The oxide superconductor according to claim 1, wherein the non-superconducting region has a size of 100 nm×100 nm×100 nm or more.

3. The oxide superconductor according to claim 1, wherein a length of the non-superconducting region in the first direction is equal to or more than 1 µm.

4. The oxide superconductor according to claim 1, wherein a width of the non-superconducting region in a second direction perpendicular to the first direction and from the non-superconducting region toward the first superconducting region is smaller than a width of the first superconducting region in the second direction.

5. The oxide superconductor according to claim 4, wherein a length of the non-superconducting region in the first direction is equal to or more than 1 m, and the width of the non-superconducting region in the second direction is equal to or less than 80 µm.

6. The oxide superconductor according to claim 4, wherein a length of the non-superconducting region in the first direction is equal to or more than 1 m, and the width of the non-superconducting region in the second direction is equal to or less than 10 µm.

7. The oxide superconductor according to claim 1, wherein the a/b-axis orientation ratio in a portion of 100 µm or less from a boundary between the first superconducting region and the non-superconducting region to a side of the first superconducting region is less than 30%.

8. The oxide superconductor according to claim 1, wherein the oxide superconducting layer contains fluorine (F) of equal to or more than $2.0\times10^{15}$ atoms/cm$^3$ and equal to or less than $5.0\times10^{19}$ atoms/cm$^3$, and carbon (C) of equal to or more than $1.0\times10^{17}$ atoms/cm$^3$ and equal to or less than $5.0\times10^{20}$ atoms/cm$^3$.

9. The oxide superconductor according to claim 1, wherein the at least one first rare earth element, the at least one second rare earth element, and the at least one third rare earth element are the same.

10. The oxide superconductor according to claim 1, wherein the first superconducting region contains praseodymium (Pr), and a ratio of a number of atoms of the praseodymium (Pr) to a sum of a number of atoms of the at least one first rare earth element and the number of atoms of the praseodymium (Pr) the first superconducting region (31a) is equal to or less than 15%.

11. The oxide superconductor according to claim 1, further comprising:

a substrate; and a metal layer, wherein the oxide superconducting layer is disposed between the substrate and the metal layer.

* * * * *